US008490024B2

(12) United States Patent
Harrison et al.

(10) Patent No.: US 8,490,024 B2
(45) Date of Patent: Jul. 16, 2013

(54) LAND PLAN DEVELOPMENT

(75) Inventors: Richard M. Harrison, St. Louis Park, MN (US); Adam J. Harrison, Elk River, MN (US); Keith M. Willenson, St. Paul, MN (US)

(73) Assignee: Richard Harrison Site Design, Inc., Golden Valley, MN (US)

( * ) Notice: Subject to any disclaimer, the term of this patent is extended or adjusted under 35 U.S.C. 154(b) by 976 days.

(21) Appl. No.: 12/039,448

(22) Filed: Feb. 28, 2008

(65) Prior Publication Data

US 2008/0208543 A1 Aug. 28, 2008

Related U.S. Application Data

(60) Provisional application No. 60/891,976, filed on Feb. 28, 2007.

(51) Int. Cl.
*G06F 3/048* (2013.01)

(52) U.S. Cl.
USPC ........... 715/855; 715/771; 715/765; 715/810; 715/840

(58) Field of Classification Search
USPC .......................... 715/765, 771, 810, 840, 855
See application file for complete search history.

(56) References Cited

U.S. PATENT DOCUMENTS

| | | | |
|---|---|---|---|
| 7,312,802 B2 | 12/2007 | Komornicki et al. | |
| 7,356,406 B2 * | 4/2008 | Harrison et al. | 701/532 |
| 2004/0004611 A1 * | 1/2004 | Komornicki et al. | 345/418 |
| 2007/0226004 A1 * | 9/2007 | Harrison | 705/1 |
| 2008/0130955 A1 * | 6/2008 | Harrison et al. | 382/113 |

OTHER PUBLICATIONS

"AutoCAD LT 2006 Tutorial", Shih, Randy H. Oregon Institute of Technology.*
AutoCAD LT 2008, *Pointing Devices*, released on Mar. 27, 2007, 2 pages.
AutoCAD LT 2008, *Command Reference*, released on Mar. 27, 2007, 974 pages.
AutoCAD LT 2008, *Customization Guide*, released on Mar. 27, 2007, 111 pages.
AutoCAD LT 2008, *New Features Workshop*, screen shots from multimedia tutorial, released on Mar. 27, 2007, 50 pages.
AutoCAD LT 2008, *User's Guide*, released on Mar. 27, 2007, 508 pages.
Bell, Joseph H., The American Surveyor, SoftwareReview, *SiteComp Survey*, copyright 2004, 4 pages.
SiteComp, Inc., *SiteComp Manual*, Feb. 28, 2002, 681 pages.
SiteComp, Inc., *SiteComp Survey*, Mar. 2003, 13 pages.

* cited by examiner

*Primary Examiner* — Namitha Pillai
(74) *Attorney, Agent, or Firm* — Merchant & Gould P.C.

(57) ABSTRACT

Systems and methods for development of a land plan can include a user interface having a first display module for displaying tool buttons, the tool buttons operable to perform a function associated with a land plan, wherein a first tool button of the tool buttons is operable to define an element of the land plan, a second display module for displaying a set of tool box buttons, each tool box button operable to cause the first display module to display different sets of the tool buttons for performing functions associated with the land plan, and a third display module for displaying information relating to the element of the land plan. The user interface can also include a planning window for generating a graphical representation of the land plan, the graphical representation of the land plan including the element.

14 Claims, 54 Drawing Sheets

Fig 28.

Site Layer Details — 287

- site1
- Line Type — 289 — Solid
- Line Color — 291 — 4
- Line Style — 293 — Single
- Line Width — 295 — 0.031
- Annotation Style — 297 — None
- Annotation Font — 299 — Courier New 8
- Annotation Color — 301 — 1
- Text Font — 303 — Times New Roman 16
- Text Color — 305 — 1
- Text Tilt — 307
- Submit — 309
- Cancel — 311

LAND PLAN DEVELOPMENT

CROSS REFERENCE TO RELATED APPLICATION

This application claims priority to U.S. Provisional Patent Application Ser. No. 60/891,976, filed on Feb. 28, 2007, titled LAND PLAN DEVELOPMENT, which is hereby incorporated by reference in its entirety.

BACKGROUND

There are three main groups that are involved in the design of the towns that we live in. These include civil engineers, land surveyors, and land planners. Both civil engineers and land surveyors are typically registered according to the requirements of a particular municipality. Land planners, on the other hand, can come from any field and need not be registered. In addition, a land planner need not have any particular knowledge of the steps and procedures of developing land, such as training in surveying, civil engineering, or even land planning.

First drafts of the layouts for suburban developments, or conceptual plans, are sometimes created either just before or just after purchase of the land. In a matter of a few hours, or in some cases literally a few minutes, a land planner lays out lots and streets that will define the character of millions of dollars worth of housing intended to exist for more than 100 years. In some cases, the land planner bases the plans on nothing more than the outer perimeter of the tract and the city's minimum dimensional requirements for streets and lots. In such a scenario, a quick sketch (often done by hand using markers, pens, and paper—or roughly drawn in a CAD system) based on little real data will become the basis for a series of important economic decisions made by the developer, such as: Can we afford the land? Can we achieve a profitable yield? How many linear feet of street must be built?

Developers are sometimes forced to abandon projects at this point because, after relying on poorly thought-out land plans, they conclude that the unanticipated costs, such as moving dirt and constructing streets, will drain the potential profit from home sales. Even worse, sometimes developers decide to go ahead and buy the land relying on the poorly thought-out land plan. In such situations, the developer may later discover that expenses are going to cost far more than had been expected, or that the yield has been greatly overestimated.

One of the reasons such situations exist is that there has been little automation, in terms of hardware and software systems, created specifically for the needs of a land planner. There are software systems that utilize complex and difficult to learn systems and commands, such as the Coordinate Geometry system that is generally used as the basis of land surveying and civil engineering. While most civil engineers and land surveyors use these software packages for land planning, they are very limited in their design scope and often so complex to use that even these professionals may take short cuts in the designs to get the job done, leading to potential inaccuracies.

SUMMARY

In general terms, this disclosure is directed to systems configured for land plan development. In one configuration, a system includes a user interface that simplifies the process of land planning. In another configuration, a system guides the user in various steps of land plan development.

DESCRIPTION OF THE DRAWINGS

FIG. 28 is a screen shot of an example layer details window of the land plan development tool shown in FIG. 1.

DETAILED DESCRIPTION

Figure 1:
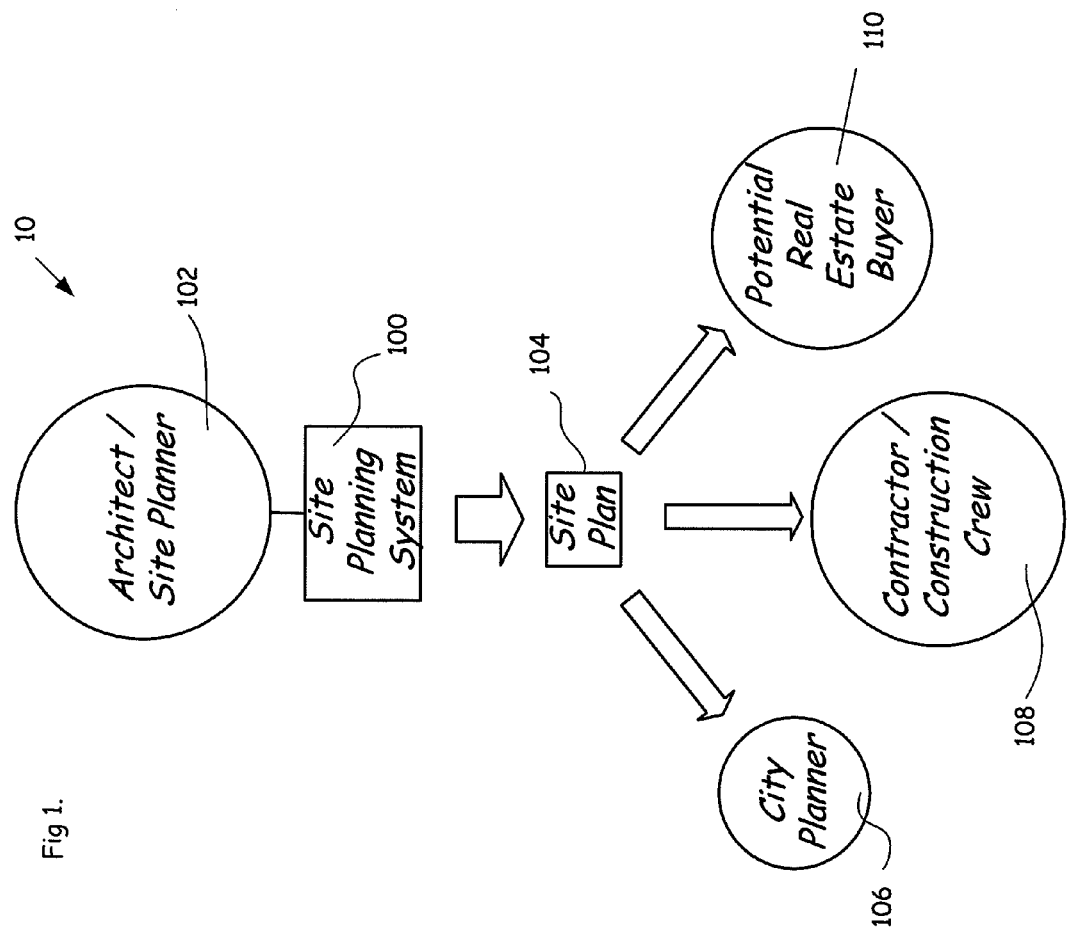
FIG. 1 is a block diagram illustrating a land plan development process including a land plan development tool.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

The logical operations of the various embodiments of the invention described herein are implemented as: (1) a sequence of computer implemented operations running on a computing system; and/or (2) interconnected machine modules within the computing system. Modules represent functions executed by program code such as commonly available programming languages. The implementation used is a matter of choice dependent on the performance requirements of the particular programmable device, and associated computing systems. Accordingly, the logical operations making up the embodiments of the invention described herein can be referred to alternatively as operations, modules, and the like.

FIG. 1 is a block diagram illustrating a land plan development process 10 including land plan development tool 100. Land plan development tool 100 is used by land planner 102 to develop a land plan 104. The land plan 104 is then used by city planner 106, contractor and construction crew 108, and potential real estate buyer 110.

In one embodiment, land plan development tool 100 is a software program that is capable of generating land plan 104. Land planner 102 is a land planner, land developer, architect, construction contractor, or any other person that desires to generate land plan 104. Land plan development tool 100 is used by land planner 102 to generate land plan 104.

Land plan 104 is, for example, a drawing illustrating a proposed plan for the development, modification, or use of land. Land plans are not only used to plan the development of raw land, but are also used to plan changes to existing developments. In example embodiments, land plan 104 is maintained in a printed form or an electronic form that can be viewed, for example, on a computer screen.

After land plan 104 has been generated, it is useful for a wide variety of purposes. For example, land plan 104 can be given to city planner 106 to illustrate the proposed development of a parcel of land. City planner 106 evaluates land plan 104 to determine whether to authorize the proposed development.

Land plan 104 can be given to contractor 108 or the construction crew. For example, land plan 104 can be used to define the proper locations of roads, buildings, and other features for development of the land.

Land plan 104 can also be given to potential real estate buyer 110. For example, developers can use the land plan 104 to show potential real estate buyer 110 what the final development will look like, to try to convince potential real estate buyer 110 to purchase a lot or portion of the development before it has been completed. Land plan 104 assists potential real estate buyer 110 in visualizing what the final development will be like, and may be useful in defining the contractual obligations between the potential real estate buyer 110 and the developer.

Figure 2:
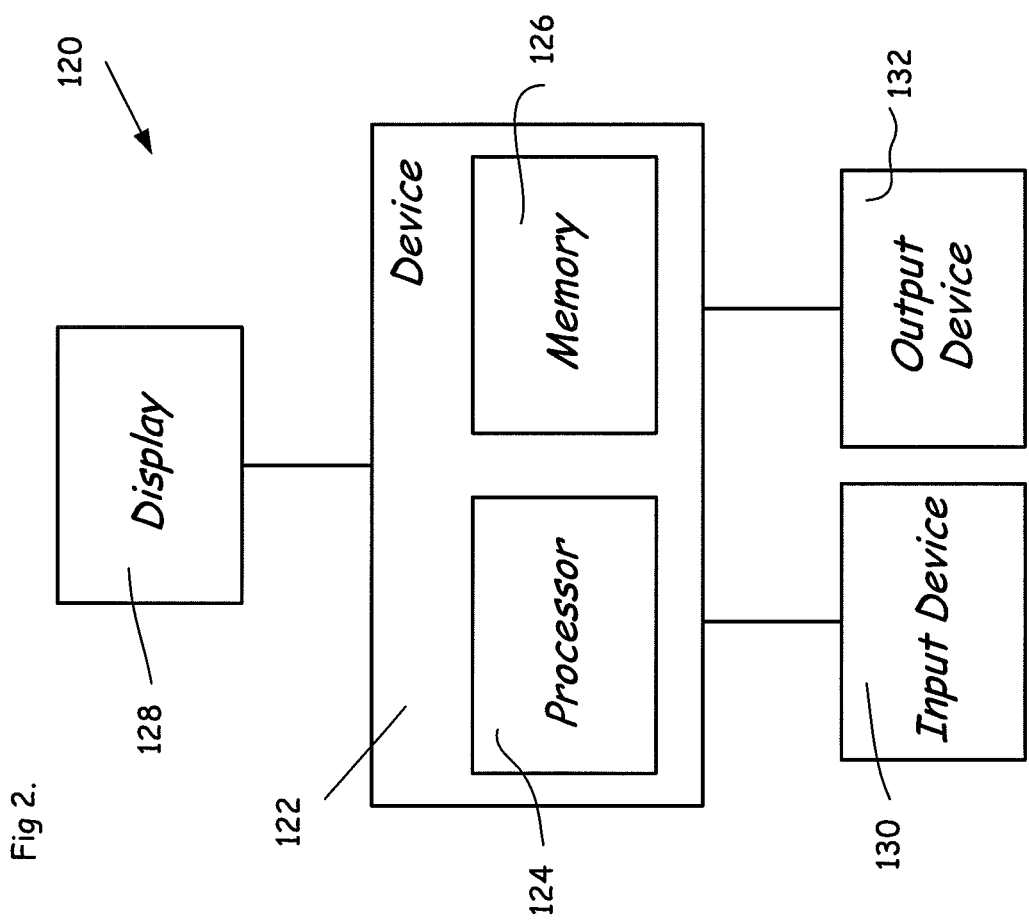
FIG. 2 is a block diagram illustrating an example device capable of operating the land plan development tool shown in FIG. 1.

FIG. 2 is a block diagram illustrating an example system 120 including a device 122 capable of operating land plan development tool 100. In the illustrated embodiment, device 122 includes processor 124 and memory 126. In one embodiment, device 122 is a personal computer. Other embodiments include hand held computers, laptop computers, or any other device having a processor and able to access instructions stored in memory.

In the illustrated embodiment, device 122 is connected to a display 128. Display 128 is, for example, a computer monitor. Other embodiments include a television screen or any other device capable of displaying a user interface. Device 122 is also illustrated as connected to input device 130 and output device 132. Examples of input device 130 include a keyboard, mouse, touch pad, touch screen, track ball, voice recognition system, or any other device capable of receiving an input from a user. Examples of output device 132 include display 128, a printer, plotter, copying machine, or any other device capable of generating a land plan output. In another embodiment, output device 132 is a storage medium or digital communications device. For example, output device 132 is a flash drive onto which a land plan can be stored. In another example, output device 132 is a network-connected modem that transmits a land plan across a network such as the Internet, a local-area network, a wireless network, or any other digital communication system.

Memory 126 is computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, BC-ROM, digital versatile disks (DVD) or other optical storage, magnetic cassettes, magnetic tape, magnetic disk storage or other magnetic storage devices, or any other medium which can be used to store the desired information and which can be accessed by processor 124. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. Combinations of any of the above should also be included within the scope of computer readable media.

Figure 3:
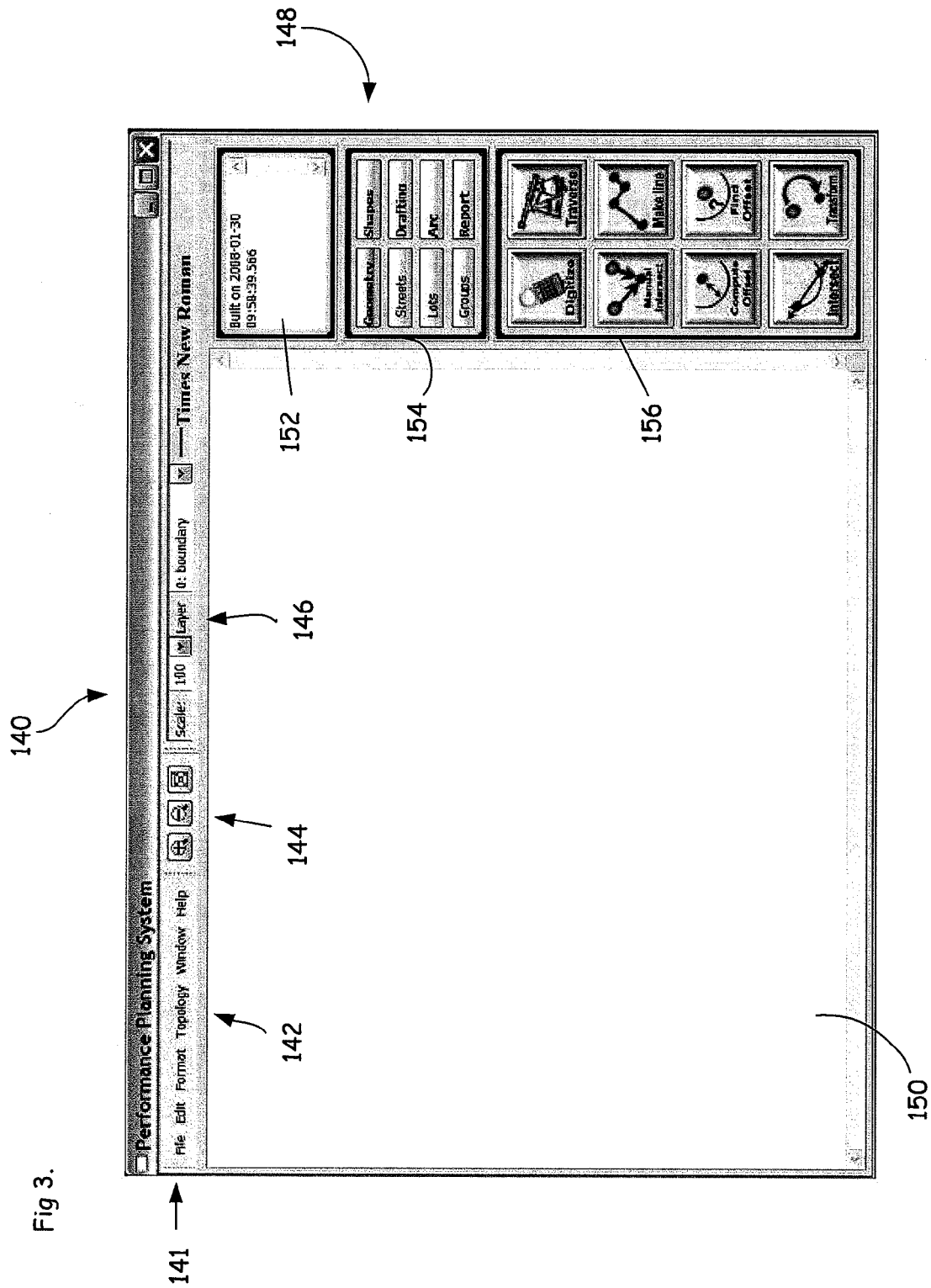
FIG. 3 is a screen shot of an example user interface of the land plan development tool shown in FIG. 1.

FIG. 3 is a screen shot of an example user interface 140 of land plan development tool 100. In the illustrated embodiment, user interface 140 includes top bar 141, side bar 148, and planning window 150.

Top bar 141 includes, for example, menu bar 142, view adjustment buttons 144, and format selection menus 146. Menu bar 142 is, for example, a bar containing a set of menu options. View adjustment buttons 144 are, for example, a set of buttons that adjust the display of planning window 150. Format selection menus 146 contain a set of menu options relating to the format of elements, as described in more detail herein.

In the illustrated embodiment, menu bar 142, view adjustment buttons 144, and format selection menus 146 are all located within top bar 141 which extends across the top of user interface 140. In this embodiment, menu bar 142 is located in the upper left corner of user interface 140, format selection menus 146 are located in the upper right corner of user interface 140, and view adjustment buttons 144 are located between menu bar 142 and format selection menus 146. In some embodiments, menu bar 142, view adjustment buttons 144, and format selection menus 146 are all unlocked, meaning that they may be selectively rearranged or located in alternate locations within user interface 140. In an alternate embodiment, menu and button locations are locked and cannot be adjusted.

In the illustrated embodiment, side bar 148 includes info box 152, tool box 154, and guide window 156. Info box 152 is, for example, a display window that displays information pertaining to the development of a land plan displayed in planning window 150. Tool box 154 is, for example, a display window including a set of menu options pertaining to available tools. Guide window 156 is, for example, a display window that guides the user in the development of a land plan displayed in planning window 150.

In one embodiment, side bar 148 is located along one side of user interface 140, such as on the right side as shown in the illustrated embodiment. In another embodiment, side bar 148 is a floating window that can be separately located apart from planning window 150. In another embodiment, each window of side bar 148 is a separate window that can be separately located anywhere on a display such as display 128.

Planning window 150 is, for example, a display window in which a land plan can be developed and displayed. In one example, a land plan relates to the proposed use or modification of one or more parcels of land. In another example, a land plan relates to the construction of buildings. In another example, a land plan relates to the development of a neighborhood including roadways, parking areas, gardens, trees, forests, buildings, homes, parks, lakes, rivers, waterways, and wetlands. Other embodiments include land plans relating to other development of land and/or water.

Figure 4:
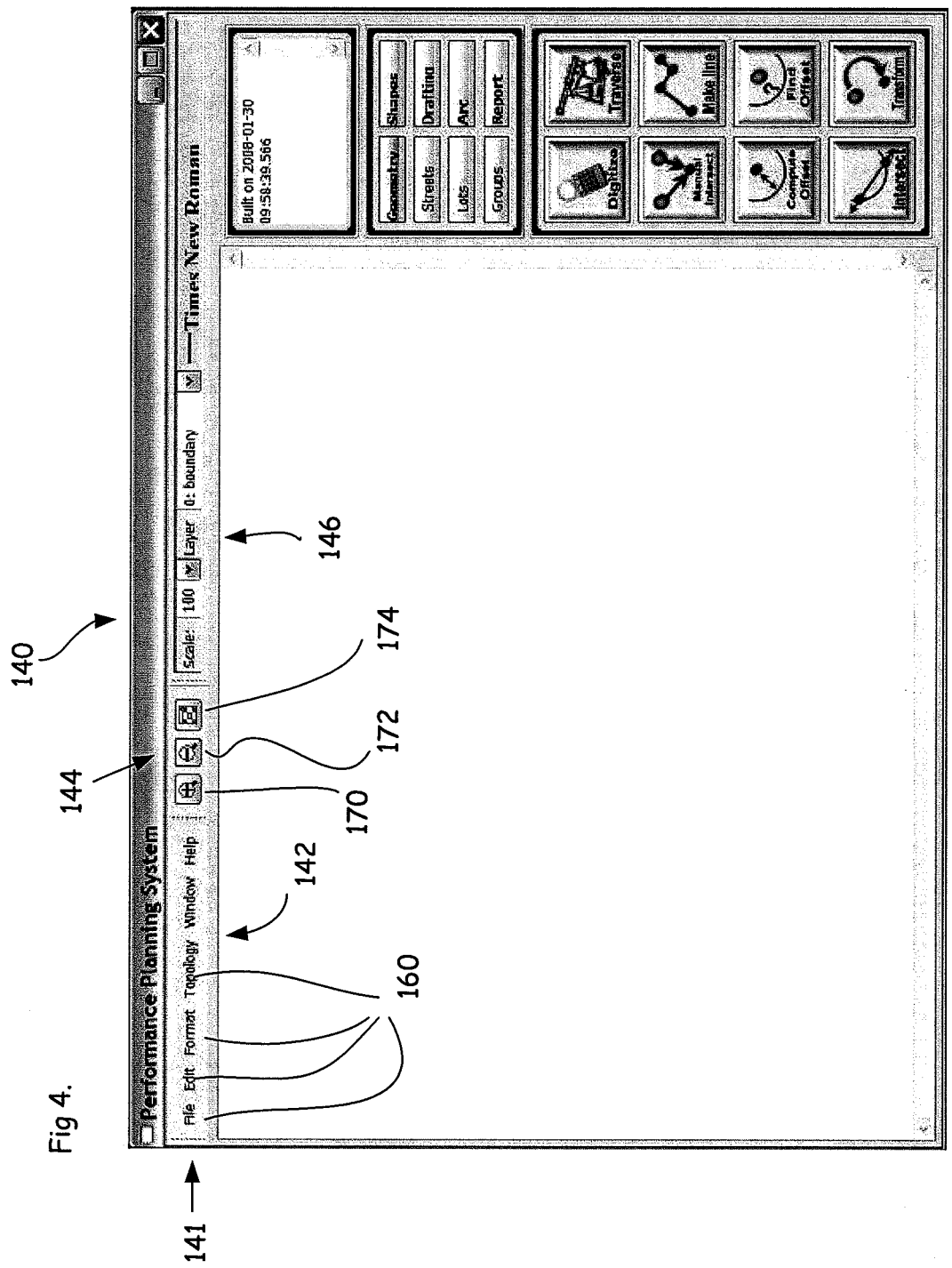
FIG. 4 is another screen shot of the example user interface shown in FIG. 3, including a top bar.

FIG. 4 is another screen shot of example user interface 140, illustrating top bar 141. In the illustrated embodiment, top bar 141 includes menu bar 142, view adjustment buttons 144, and format selection menus 146.

Menu bar 142 includes a set of topical menu buttons 160. Selecting one of menu buttons 160 displays a pull-down type menu relating to the selected topic. Within each menu are a set of options also relating to the topic selected. The illustrated embodiment includes menu buttons 160 relating to the topics of file, edit, format, topology, window, and help.

A file button, for example, displays a set of options relating to file management. Examples of file options include new, open, restore backup, remove backup, close, save, print, and exit.

An edit button, for example, includes a set of options relating to land plan editing. Examples of edit options include screen capture, move text, edit text, explode, remove unused points, transform site, fill setup, special text, default preferences, and site preferences. The special text option, when selected, includes additional options, such as Add Scale Text, Add Curve Table, Add Wisconsin Curve Table, and Add Bearing Table. These additional options add the respective special text or tables to planning window 150. The Add Scale Text option is described in more detail with reference to FIGS. 52-55.

A format button, for example, includes a set of options relating to site format. Examples of format options include scale and rotate.

A topology button, for example, includes a set of options relating to site topology. Examples of topology options includes show contour lines, slope shading, show flow arrows, intersect surface, raise or lower polylines, raise or lower entire surface, import DTM from disk, and create surface. Show contour lines option toggles between displaying the topology and hiding the topology. The slope shading option enables the display of directional arrows indicating a downhill slope. Intersect surface option is a tool for defining the intersection between two topologies. The raise or lower polylines option enables the elevation of a polyline to be shifted up or down. The raise or lower surface option enables the elevation of a surface to be shifted up or down. The import DTM option enables an existing Digital Terrain Model (topology) to be imported. The create surface option enables a new topology to be created from points with elevations.

A window button, for example, displays a set of options relating to the display in planning window 150. Examples of window options include new window, cascade windows, split windows, and other window display options. Window options may also include a listing of all sites opened with this instance of the software, enabling the user to quickly switch between sites.

A help button, for example, displays a set of options to help the user locate instructions or information. Examples of help options include help topics, help index, contact information, and other company and software information.

View adjustment buttons 144 include, for example, zoom in button 170, zoom out button 172, and fit window button 174. In the illustrated embodiment, all of view adjustment buttons 144 control the view of a land plan within planning window 150. Zoom in button 170 enables a user to zoom in to the center of the screen. Zoom out button 172 enables a user to zoom out from the center of the screen. Fit window button 174 automatically adjusts the zoom of a land plan to fit entirely within planning window 150.

Format selection menus 146 enable, for example, a user to quickly adjust the printing scale, add/remove layers, set the default layer of the next element(s) created, and edit the current default layer.

Figure 5:
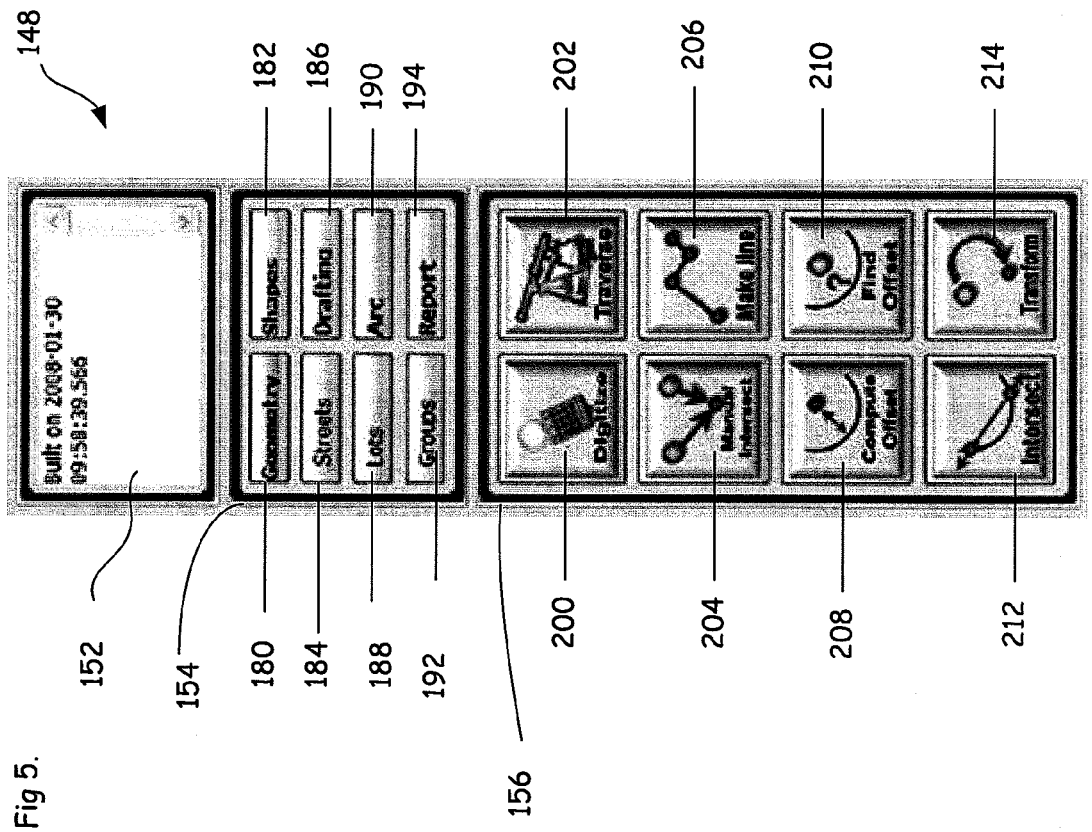
FIG. 5 is a screen shot of a side bar of the user interface shown in FIG. 3 including geometry tools.

FIG. 5 is a screen shot of side bar 148. In the illustrated embodiment, side bar 148 includes info box 152, tool box 154, and guide window 156.

Info box 152 displays information relating to a feature of a land plan, such as a point, line, polyline (a sequence of connected points), arc, fill, or graphic. Info box 152 prominently displays important information to the user in a location that is easily visible. In one embodiment, information displayed in info box 152 is displayed on multiple lines to enable a user to quickly distinguish between various information types displayed. Information displayed by info box 152 includes, for example, location of a point, starting and ending coordinates of a line, length of a line, starting and ending coordinates of an arc, radius of curvature of an arc, the layer that the element is in, the altitude of a point, dynamically changing distance from the cursor to an element or point, and any other desired information.

Tool box 154 is a set of buttons relating to tools that are available for the development of a land plan. In one embodiment, tool box 154 includes a structured organization of tools to enable a user to quickly locate a desired tool for the development of a land plan. To do so, tools are arranged by a set of categories, each being identified by a button. In the illustrated embodiment, buttons include geometry button 180, shapes button 182, streets button 184, drafting button 186, lots button 188, arcs button 190, groups button 192, and report button 194. Geometry button 180 provides access to a set of geometry tools for use in developing a land plan. Shapes button 182 provides access to a set of tools to create and edit shapes available for use in the development of a land plan. Streets button 184 provides access to a set of tools for designing streets in a land plan. Drafting button 186 provides access to a set of drafting tools for developing a land plan. Lots button 188 provides access to a set of tools for designing lots during the development of a land plan. Arcs button 190 provides access to a set of tools for creating arcs during the development of a land plan. Groups button 192 provides access to a set of tools for modifying elements as a single group. Report button 194 provides access to a set of tools for generating various reports relating to the land plan.

In the illustrated embodiment, the selection of one of the buttons from tool box 154 causes user interface 140 to highlight the selected tool box button and display a set of tools associated with the selected button in guide window 156. In some embodiments, the highlight is a different color. In other embodiments, the highlight is a different border or shading style. The highlight causes the active button to be visually distinguishable from non-active buttons, to show the user which tool box button has been selected. FIG. 5 illustrates an example display of guide window 156 after the selection of geometry button 180 from tool box 154. In this example, the selection of geometry button 180 causes a set of tools to be displayed in guide window 156. The set of tools include, for example, digitize tool 200, traverse tool 202, manual intersect tool 204, make line tool 206, compute offset tool 208, find offset tool 210, intersect tool 212, and transform tool 214. Each of these tools performs a task relating to the geometry category.

Digitize tool 200 enables a user to create points, lines, polylines, or smoothed polylines by snapping on the screen. Traverse tool 202 enables the measurement of a distance and direction from a certain point, such as to create a line or an arc. Manual intersect tool 204 determines a bearing-bearing, distance-distance, or bearing-distance intersection given two existing points. Make line tool 206 enables the generation of lines by snapping on the screen. In one example, the distance and angle can be specified. In another embodiment, the angle can be defined as multiples of the angle. Compute offset tool 208 enables the creation of a line perpendicular to an element, the line starting at the element and ending at the mouse location. Find offset tool 210 determines the distance from the point where the mouse is clicked to the nearest existing point of an element, such as a line or arc. Intersect tool 212 enables an intersection of two elements to be located. In one embodiment, intersect tool 204 treats all lines as infinite and all arcs as circles. Transform tool 214 moves one point to the same location as another point. This affects all lines, arcs, and other elements which use the transformed point. In some embodiments, the two points are merged into one, such that only a single point remains from the previous two points. In one embodiment the smaller of the two point numbers is assigned to the remaining point, although the larger could be used in an alternate embodiment.

Each of the remaining categories of tools in tool box 154 (identified by buttons 180-194) also include a set of tools relating to the selected category, as described with reference to FIGS. 6-12.

In some embodiments, guide window 156 also provides step-by-step instructions that guide the user on how to use a tool once it has been selected. This feature of guide window 156 is described in more detail herein.

Figure 6:
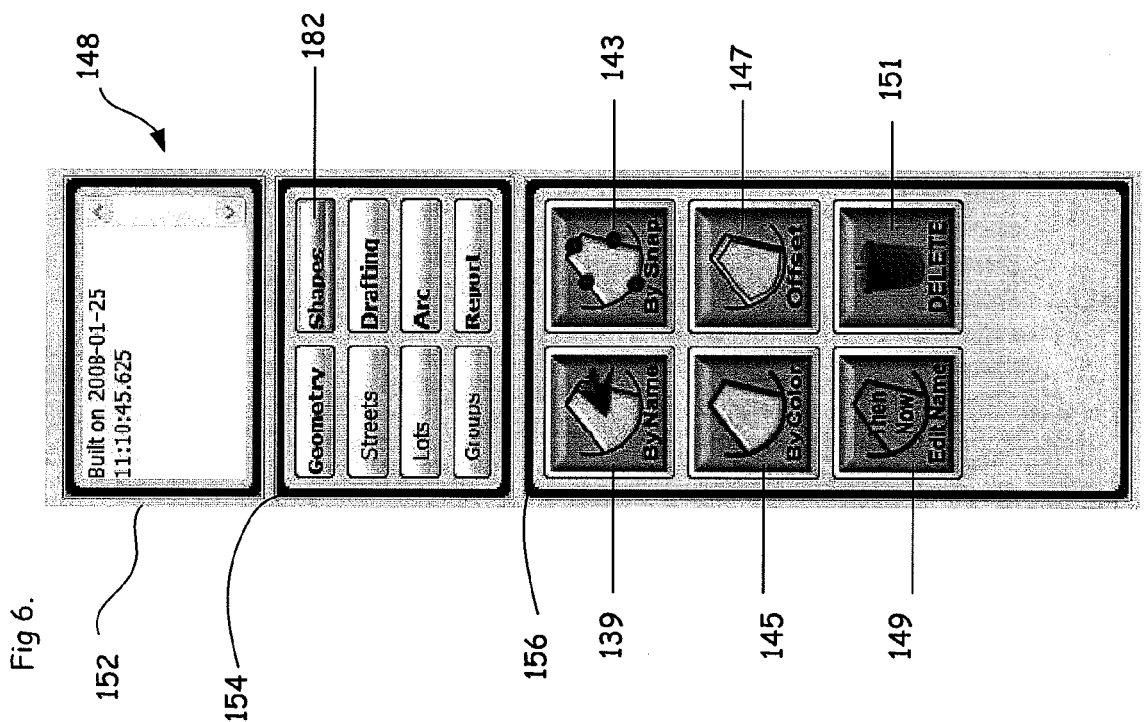
FIG. 6 is another screen shot of the side bar shown in FIG. 5 including shapes tools.

FIG. 6 is another screen shot of side bar 148, after the selection of shapes button 182. In the illustrated embodiment, side bar 148 includes info box 152, tool box 154, and guide window 156. Shapes button 182 provides access to a set of tools for generating, manipulating, and editing shapes in a land plan.

In the illustrated example, selection of shapes button 182 causes the available shapes tools to be displayed. In this example, shapes tools include shape by name tool 139, shape by snap tool 143, shape by color 145, shape by offset tool 147, edit name tool 149, delete shape tool 151.

Shape by name tool 139 enables a shape to be generated and named by snapping with an enclosed area. It also allows multiple shapes to be created by entering a starting value (e.g., "1") and a desired increment (e.g., "1"), and then successively snapping within closed areas. For example, entering the shape name "patio" with starting value "1" and increment "1", the user then clicks within a closed area. Shape by name tool 139 identifies the smallest boundaries of the closed area moving clockwise, and assigns the name "patio 1" to that closed area. The user then selects another closed area, if desired. The shape by name tool 139 identifies the boundaries of the next closed area, and assigns it the name "patio 2." The process continues to assign names (e.g., patio 3, patio 4, etc.) until all desired areas have been identified. Shape by snap tool 143 enables the user to define a shape by selecting each of the individual constituent elements of the shape, such as lines and arcs. For example, if a plan already includes many connected lines that form the boundary of an area, which would not be the smallest shape if connecting lines clockwise, the shape by snap tool 143 can be used to select each individual line and to assign a name to the boundary shape. The shape by snap tool 143 is also used to identify other shapes by selecting the elements (e.g., lines or arcs) that define the outer periphery of the shape.

Shape by color tool 143 enables a shape to be generated by locating interconnected elements having the same color. Elements include, for example lines and arcs. After selecting the shape by color tool 143, the user selects a point of the plan. Shape by color tool 143 determines the color of the selected point, and locates all elements that are interconnected with the selected point that have the same color. The resulting shape is then displayed to the user and selected. Offset tool 147 generates lines and arcs which are offset from an existing shape. After selection of offset tool 147, the user is prompted to select a shape or set of existing elements. Once the shape or elements are selected, the user is prompted to enter the desired offset amount (either positive or negative). In some embodiments, the offset distance from each element can be different.

Edit name tool 149 is a tool that allows that name of a shape to be modified. After selection of the edit name tool 149, the user selects a shape having a previously defined name. The edit name tool 149 then requests a new name from the user. The user enters the new name, and edit name tool 149 assigns the new name to the selected shape, erasing the previously entered name.

Delete shape tool 151 is a tool that allows a user to delete an unwanted shape. After selecting delete shape tool 151, the user is prompted to identify the shape to be deleted. The user then enters the name of the shape or part of the name. Delete shape tool 151 displays a list of all shapes that match the name entered, and asks the user to identify the shape. Once the desired shape has been selected by the user, the shape is deleted.

Figure 7:
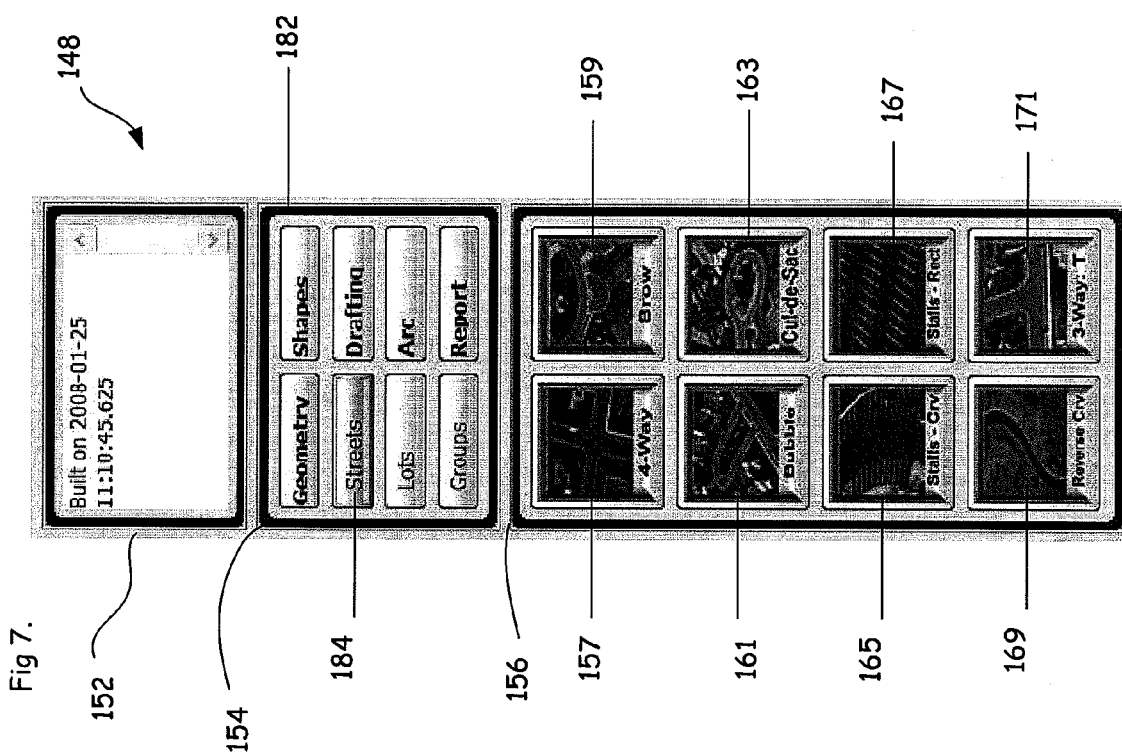
FIG. 7 is another screen shot of the side bar shown in FIG. 5 including streets tools.

FIG. 7 is another screen shot of side bar 148, after the selection of streets button 184. In the illustrated embodiment, side bar 148 includes info box 152, tool box 154, and guide window 156. Streets button 184 provides access to a set of tools for generating, manipulating, and editing streets in a land plan.

In the illustrated example, selection of streets button 184 causes the streets tools to be displayed. In this example, streets tools include four-way intersection tool 157, a brow tool 159, the bubble tool 161, cul-de-sac tool 163, parking stalls on arc tool 165, parking stalls on line tool 167, reverse curve tool 169, and tee intersection tool 171. Each of the street tools also includes a graphical display illustrating an example of the street feature that can be generated using the tool.

Figure 8:
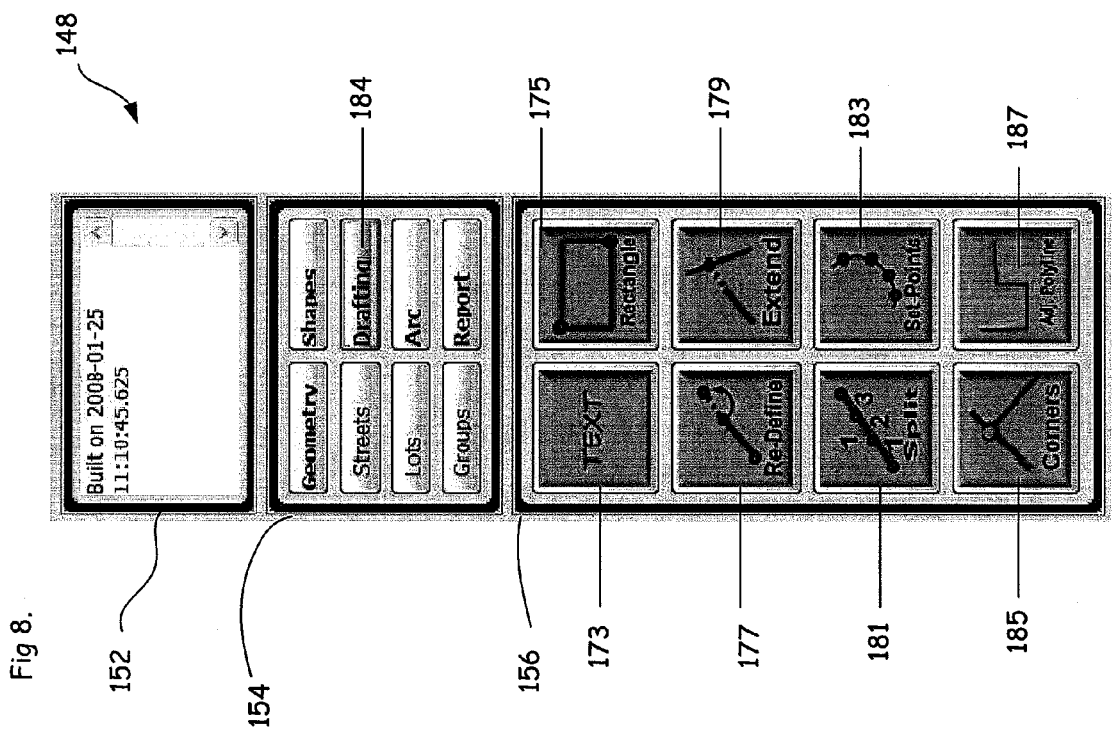
FIG. 8 is another screen shot of the side bar shown in FIG. 5 including drafting tools.

FIG. 8 is another screen shot of side bar 148, after the selection of drafting button 186. In the illustrated embodiment, side bar 148 includes info box 152, tool box 154, and guide window 156. Drafting button 186 provides access to a set of drafting tools. In the illustrated example, drafting tools include text tool 173, rectangle tool 175, redefine tool 177, extend tool 179, split tool 181, set points tool 183, corners tool 185, and adjust polyline tool 187.

Text tool 173 enables the generation and placement of text which is independent of lines or arcs. Rectangle tool 175 enables the generation of a rectangle given a height and width. Redefine tool 177 can be used to move one or both end points of an arc or line to the locations of other existing points. The extend tool 179 allows a line or arc to be extended or shortened to intersect another existing line or arc. Split tool 181 enables a line or arc to be split into multiple smaller lines or arcs, such as by splitting an arc into two arcs joined at a single point. Set points tool 183 allows a user to set points on an arc or line by specifying distance(s) from one of the end points of the line or arc. Corner tool 185 generates a circle at the intersection point of two elements. Adjust polyline tool 187 enables the adjustment of a polyline such that all angles are right angles within the polyline (including 0 degrees, 90 degrees, 180 degrees, and 270 degrees).

Figure 9:
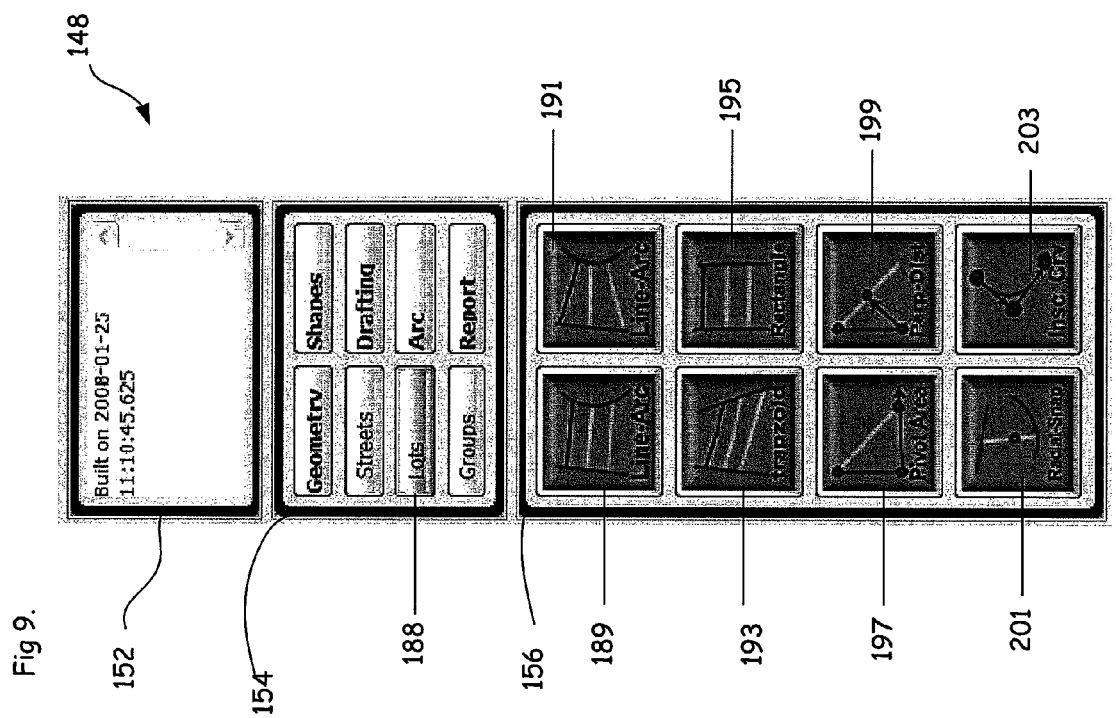
FIG. 9 is another screen shot of the side bar shown in FIG. 5 including lots tools.

FIG. 9 is another screen shot of side bar 148, after the selection of lots button 188. In the illustrated embodiment, side bar 148 includes info box 152, tool box 154, and guide window 156. Lots button 188 provides access to a set of tools for generating, manipulating, and editing lots in a land plan.

In the illustrated example, selection of lots button 188 causes the lots tools to be displayed. In this example, lots tools include parallel line arc tool 189, radial line arc tool 191, trapezoid tool 193, rectangle tool 195, pivot tool 197, perpendicular distance tool 199, radial snap tool 201 and inscribe curve tool 203. Parallel line arc tool 189 generates lines parallel to the points along an arc by area or distance given an arc, line, and two points. Radial line arc tool 191 generates radial lines along an arc by area or distance given an arc, a line, and two points (starting points). Trapezoid tool 193 generates parallel lines between two lines by area or distance given the two lines, and two points (starting points). Rectangle tool 195 generates lines parallel to two points by area or distance given the two points (starting points). Pivot tool 197 computes a triangular area given three existing points. Perpendicular distance tool 199 generates a point which forms a right triangle, given two points and a distance from the second point. The right triangle includes a hypotenuse, defined by two given points. Radial snap tool 201 generates lines which are radial to an arc, between that arc and a line, and go through existing points. Inscribe curve tool 203 generates an arc given three points and a radius, treating the points as if they defined two imaginary lines connected at the middle point. The arc is generated as if it were inscribed inside the imaginary lines with the given radius.

Figure 10:
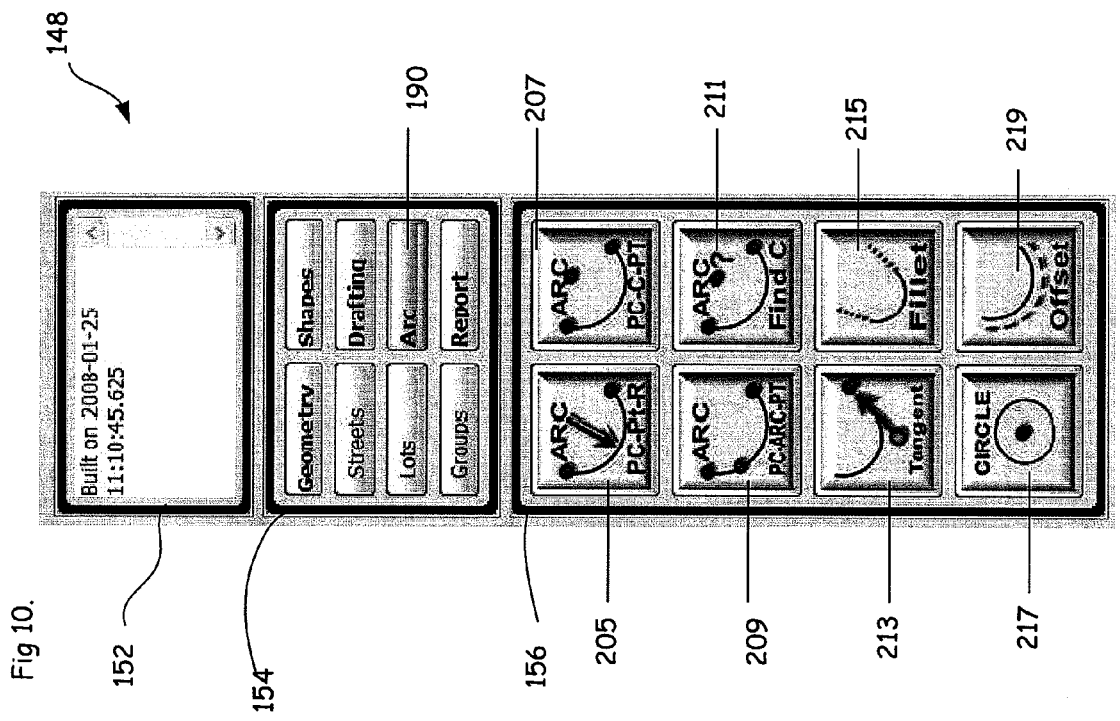
FIG. 10 is another screen shot of the side bar shown in FIG. 5 including arcs tools.

FIG. 10 is another screen shot of side bar 148, after the selection of arcs button 190. In the illustrated embodiment, side bar 148 includes info box 152, tool box 154, and guide window 156. Arcs button 190 provides access to a set of tools for generating arcs in a land plan.

In the illustrated example, selection of arcs button 190 provides access to a set of tools for creating arcs in a land plan. In the illustrated example, selection of arcs button 190 causes the arcs tools to be displayed in guide window 156. In this example, arcs tools include pc-pt-r tool 205, pc-c-pt tool 207, pc-arc-pt tool 209, find-c tool 211, tangent tool 213, fillet tool 215, circle tool 217, and offset tool 219. Pc-pt-r tool 205 generates a counter-clockwise arc given a starting point (Point of Curve), an ending point (Point of Tangency), and a radius. Pc-c-pt tool 207 generates a counter-clockwise arc given a starting point (Point of Curve), a center point, and an ending point (Point of Tangency). Pc-arc-pt tool 209 generates a counter-clockwise arc given a starting point (Point of Curve), any point on the arc, and an ending point (Point of Tangency). Find-c tool 211 finds and identifies any existing points which could be the center of an arc given a starting point (Point of Curve) and an ending point (Point of Tangency). Tangent tool 213 generates lines tangent from the circle defined by the arc's center and radius to either selected locations or existing points. Fillet tool 215 generates an arc counter-clockwise between two elements, given two non-parallel lines, two arcs, or a line and an arc, and a radius. Fillet tool 215 also trims the existing lines or arcs at the points where they connect to the newly generated arc. Circle tool 217 generates a circle of a given radius. Offset tool 219 generates a line or arc (or multiple lines and/or arcs) given a specified distance away from an existing line or arc (or set of lines and/or arcs).

Figure 11:
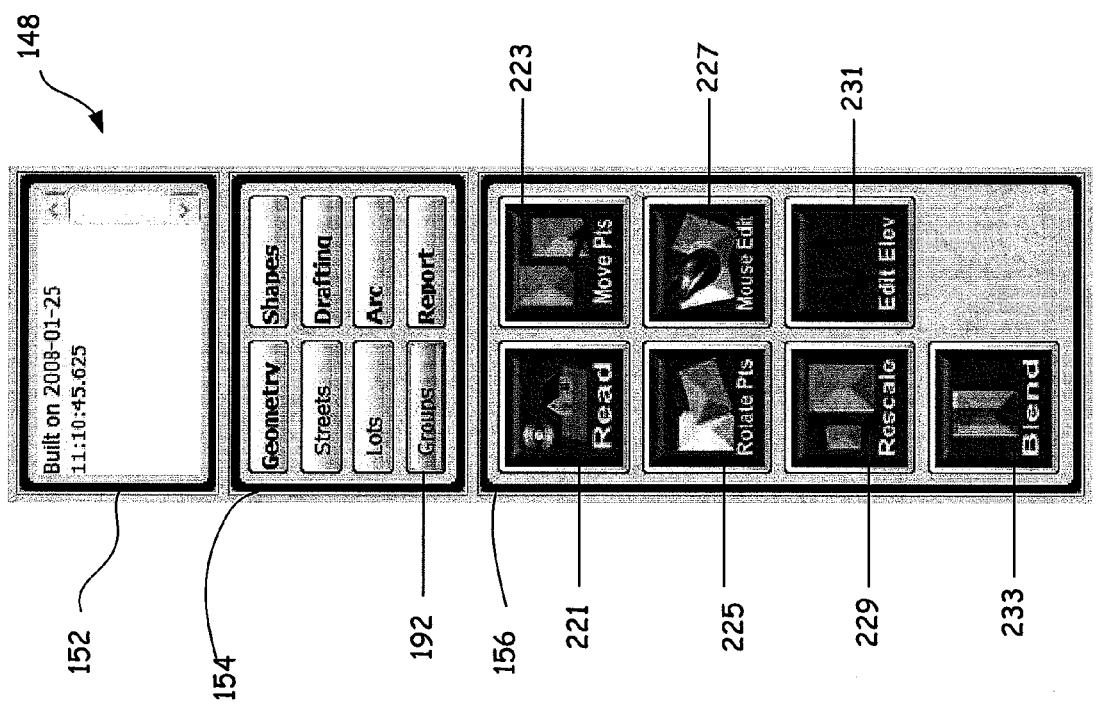
FIG. 11 is another screen shot of the side bar shown in FIG. 5 including groups tools.

FIG. 11 is another screen shot of side bar 148, after the selection of groups button 192. In the illustrated embodiment, side bar 148 includes info box 152, tool box 154, and guide window 156. Groups button 192 provides access to a set of tools for generating, manipulating, and editing shapes in a land plan.

In the illustrated example, selection of groups button 192 causes the groups tools to be displayed. In this example, groups tools include read tool 221, move points tool 223, rotate points tool 225, mouse edit tool 227, rescale tool 229, edit elevation tool 231, and blend tool 235. Read tool 221 enables a PPS data file to be read and set as a group. Move points tool 223 enables a group to be moved to an existing point. Rotate tool 225 enables a group to be rotated around a by the angle between two other points with the first point as the center. Mouse edit 227 enables a group to be moved relative in distance and location to the distance and location of two existing points. Rescale tool 229 enables the resealing of a group. Edit elevation tool 231 enables the elevation of a group to be adjusted. Blend tool 233 makes a group part of the site and not a group.

Figure 12:
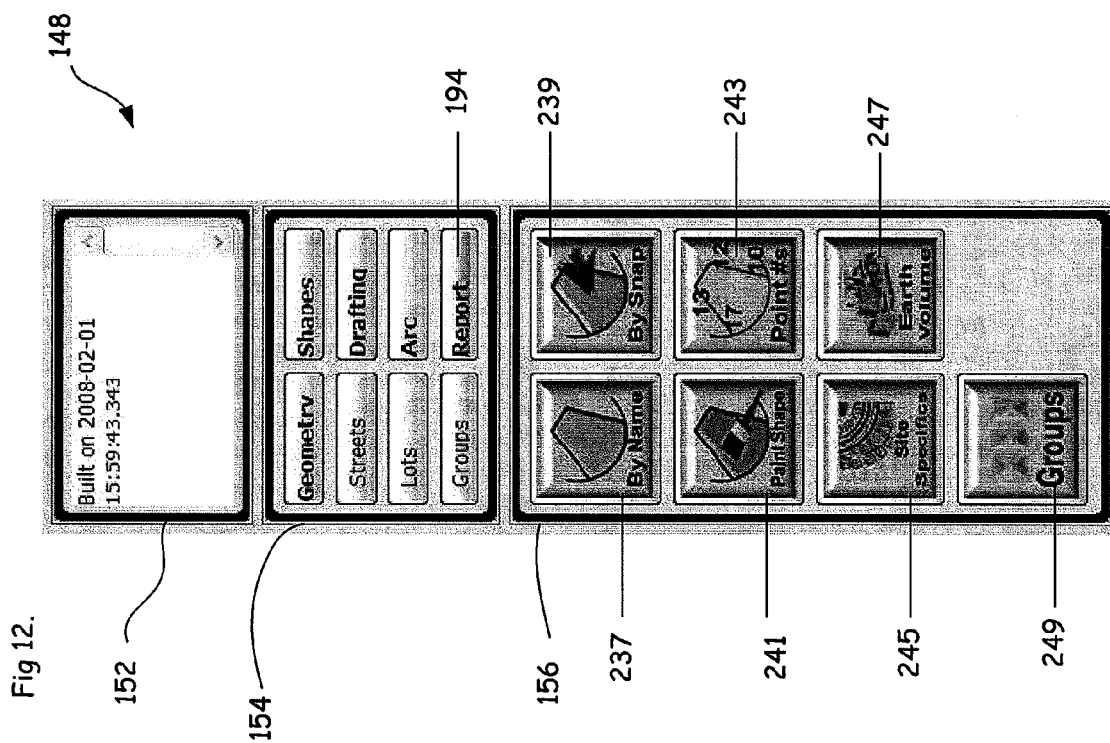
FIG. 12 is another screen shot of the side bar shown in FIG. 5 including reports tools.

FIG. 12 is another screen shot of side bar 148, after the selection of report button 194. In the illustrated embodiment, side bar 148 includes info box 152, tool box 154, and guide window 156. Report button 194 provides access to a set of tools for generating and defining reports for a land plan.

In the illustrated example, selection of report button 194 causes the reports tools to be displayed. In this example, reports tools include report by name tool 237, report by snap tool 239, paint shape tool 241, point numbers tool 243, site specifics tool 245, earth volume tool 247, and groups tool 249. Report by name tool 237 enables the reporting of shapes and/or alignments by name or partial name. If no name is given, all shapes and alignments are included in the report. Selected shapes can be restricted by giving an area range, if desired. The report can contain information such as area information, boundary data, legal descriptions, and perimeter stations (cumulative distance at each intersection point). In some embodiments, the report also includes the total number of shapes or alignments that match the criteria, along with maximum, minimum, and average shape area. Report by snap tool 239 enables the reporting of shape name and area by successive snapping in shapes. Paint shape tool fills shapes that match a name or partial name with the default color (which can be set by the user in the Site Preferences), a selected color, a selected fill, or random colors. If no name is given, all shapes are included. Selected shapes can be restricted by giving an area range. Optionally, arrows can point at the selected shape (useful for finding small shapes). Point numbers tool 243 toggles on and off the display of point numbers. Site specifics tool 245 allows the user to define, save, and run predefined reports like the Report by Name report, except that multiple names or partial names can be included. Earth volume tool 247 enables the reporting of the volume of earth to be added or removed between two topologies. Groups tool 249 reports on groups that match a file name or partial file name. If no name is given, all groups are included in the report.

Figure 13:
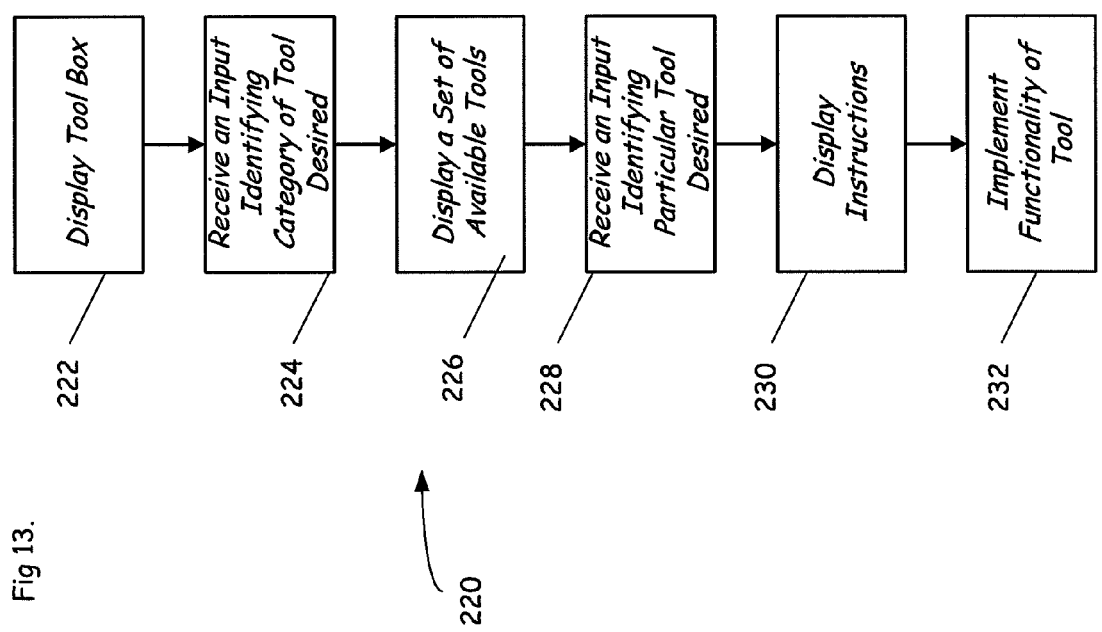
FIG. 13 is a flowchart illustrating an example method of operating the land plan development tool shown in FIG. 1 during the development of a land plan.

FIG. 13 is a flow chart illustrating an example method 220 of operating land plan development tool 100 during the development of a land plan.

Method 220 begins with operation 222 during which a tool box (e.g., tool box 154) is displayed. In one embodiment, the tool box includes a set of buttons, wherein each button relates to group of tools having a common general category. In another embodiment, one or more buttons themselves identify a tool, as opposed to a group of tools.

Operation 224 is then performed, during which an input is received that identifies a category of tool desired. For example, a user selects one of the buttons, such as a geometry button (e.g., geometry button 180 shown in FIG. 5). In doing so, the user indicates that the desired tool relates to the geometry category.

Operation 226 is then performed, during which a set of available tools are displayed relating to the identified category. For example, a set of geometry tools are displayed.

Operation 228 is then performed, during which an input is received that identifies a particular tool that is desired. For example, the user may select the make line tool (e.g., 206 shown in FIG. 5).

Operation 230 is then performed, during which instructions are displayed to guide the user in the use of the identified tool. For example, the user may be instructed to select two points to draw a line, or a set of points to draw a set of lines. Other tools will have other instructions relating to the use of the particular tool.

Operation 232 is then performed, during which the functionality of the tool is implemented. For example, the system receives input from the user to identify the desired location of the line(s), and then displays the lines on the land plan. Other tools will perform other functions.

Figure 14:
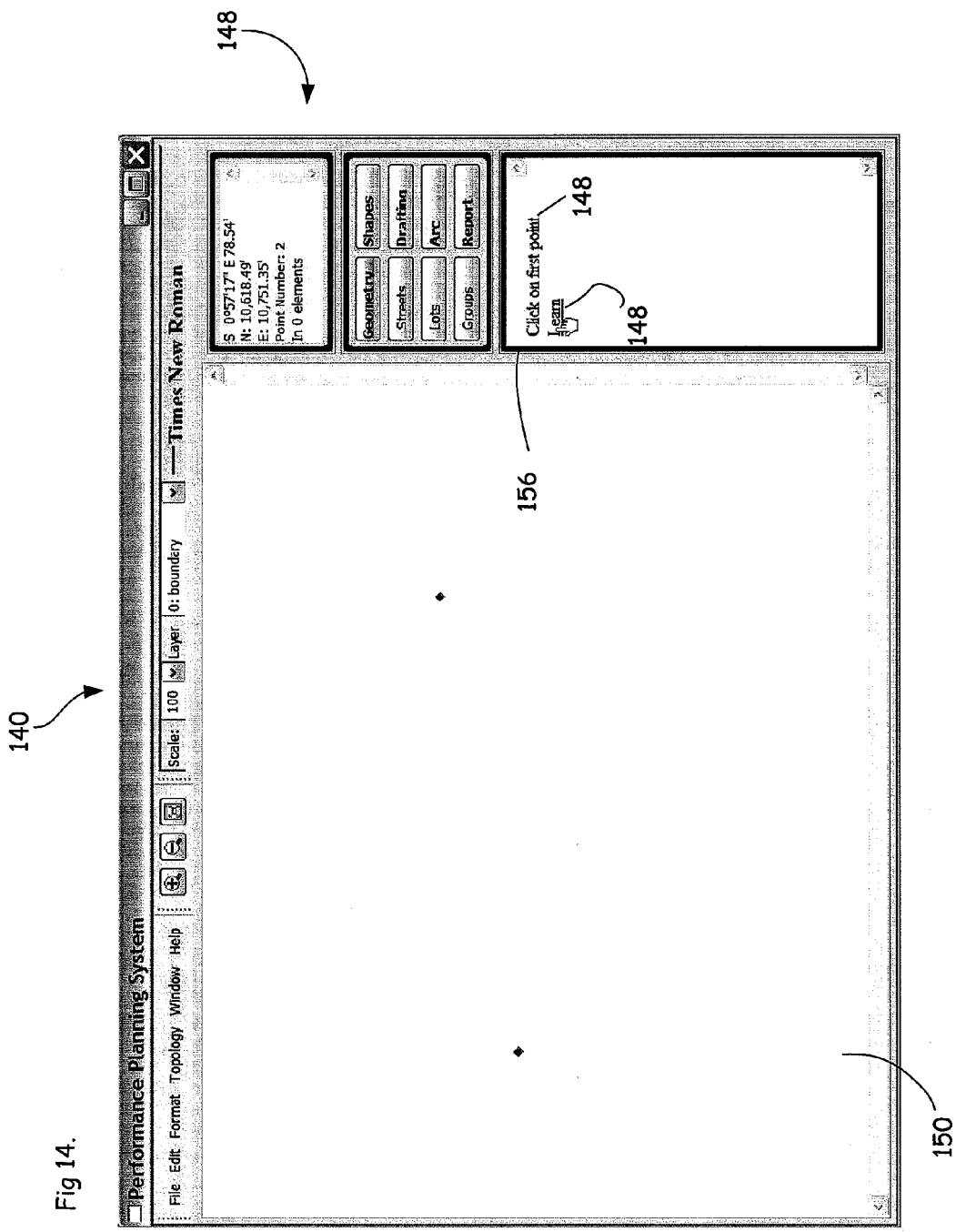
FIG. 14 is another screen shot of the example user interface shown in FIG. 3 after the selection of a tool from a guide window.

FIG. 14 is another screen shot of example user interface 140 after the selection of a tool from guide window 156. FIG. 14 illustrates the scenario in which a user has selected the manual intersect tool (e.g., 204 shown in FIG. 5) from the geometry category of tools (e.g., geometry button 180). At this point, guide window 156 changes from tool display mode to instruction display mode. In instruction display mode, instructions are provided to instruct the user on how to use the selected tool.

In the illustrated example, guide window 156 instructs the user with instruction 240 to "Click on first point." Instruction 240 provides the first instruction on how to use the selected tool.

In addition, guide window 156 also displays learn button 242. Learn button 242 enables the user to receive further instructions and training on how to use the selected tool to perform the desired task. To do so, the user clicks learn button 242. An example of the result of clicking on learn button 242 is described with reference to FIGS. 15-17, in which a tutorial window 1000 displays even more detailed instructions to train the user on how to perform the desired task. Once the user understands what needs to be done, the user follows the instruction to complete the first task. For example, the first point is selected, as shown in FIG. 18.

Figure 15:
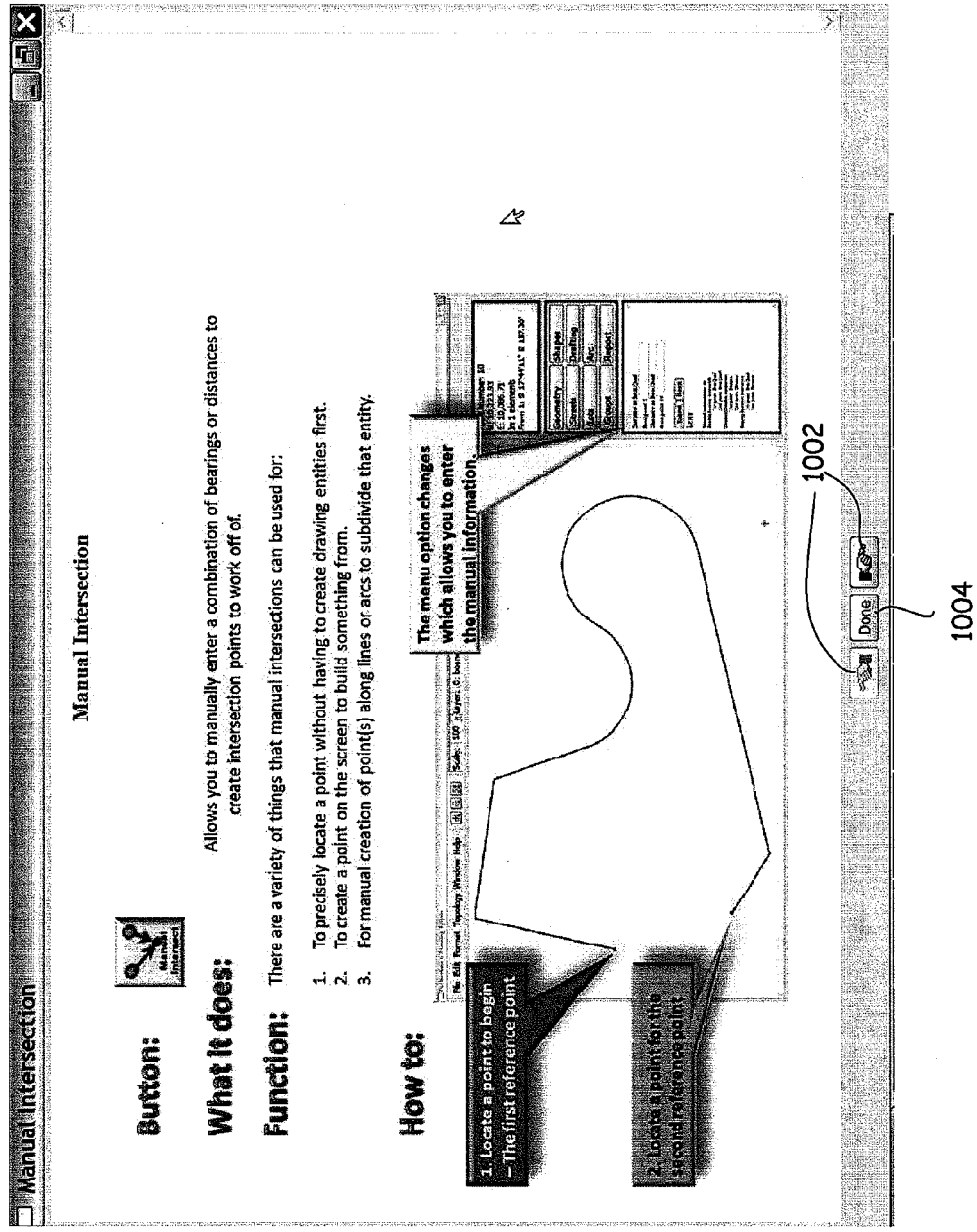
FIG. 15 is a screen shot of an example first page of a tutorial window.

FIG. 15 is a screen shot of an example tutorial window 1000, such as displayed to a user after selecting a learn button, as shown in FIG. 14. The tutorial window 1000 displays a brief tutorial to the user that instructs the user on how to use the features of the associated tool or function, such as the manual intersect tool. In this embodiment, tutorial window 1000 includes multiple tutorial pages. A first page is shown in FIG. 15. Navigation buttons 1002 are provided on tutorial window 1000 for advancing to the second page. When the user is done with the tutorial, done button 1004 is selected to close tutorial window 1000.

In the first tutorial page, tutorial window 1000 provides instructions for using the manual intersection tool. The tutorial window includes a thumbnail image of the tool, and instructions for using the tool. In some embodiments the instructions include a graphical image further illustrating an example of how to use the tool, such as to identify the location of relevant features in user interface 140.

The first tutorial page of tutorial window 1000 includes a brief description of what the tool does: "Allows you to manually enter a combination of bearings or distances to create intersection points to work off of." The first tutorial page includes a description of the function: "There are a variety of things that manual intersections can be used for: 1. To precisely locate a point without having to create drawing entities first. 2. To create a point on the screen to build something from. 3. For manual creation of point(s) along lines or arcs to subdivide that entity." The first tutorial page also includes a "how to" section that includes step-by-step instructions including a graphical illustration that shows the user an example of how the tool can be used.

Figure 16:
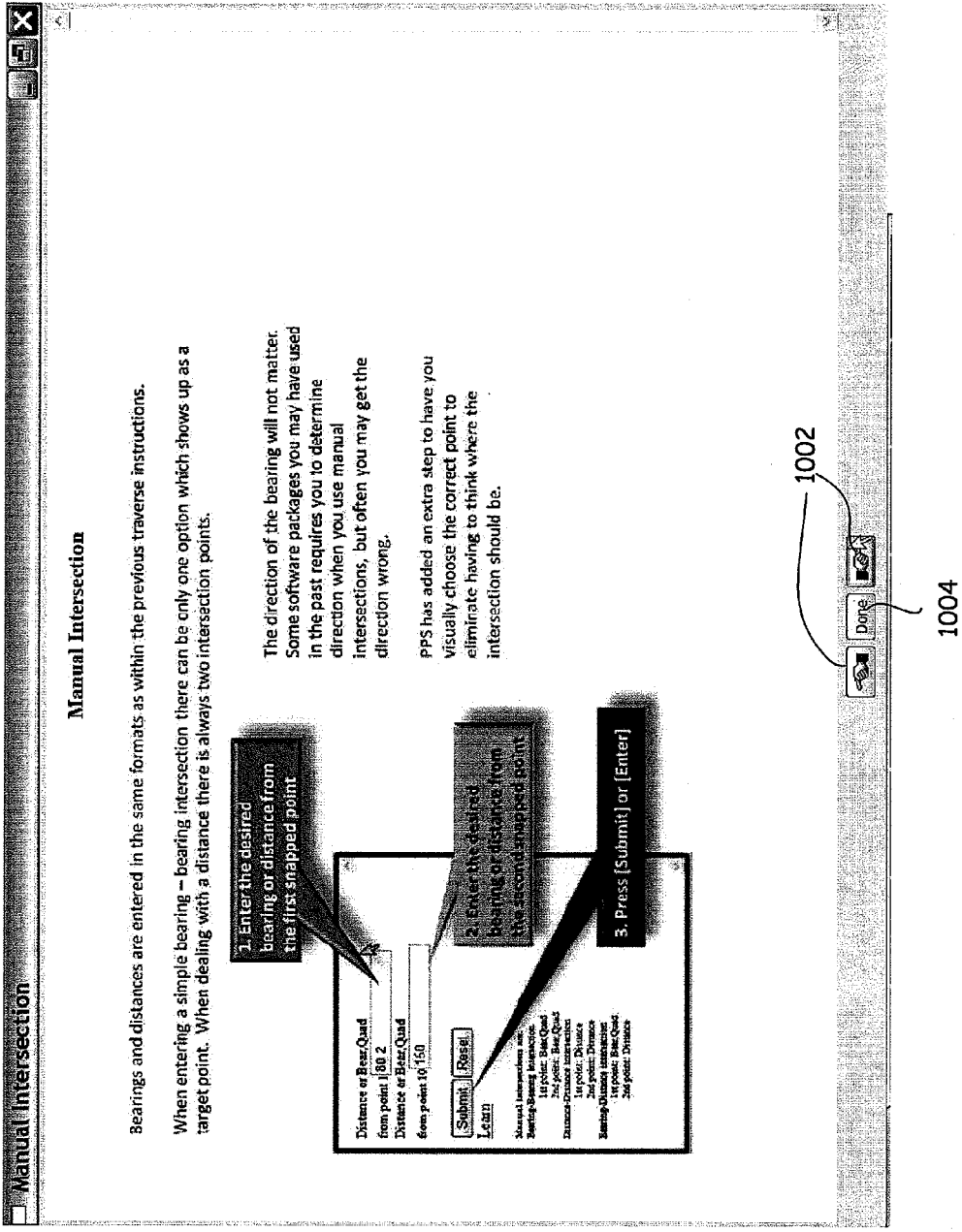
FIG. 16 is a screen shot of an example second page of the tutorial window shown in FIG. 15.
Figure 17:
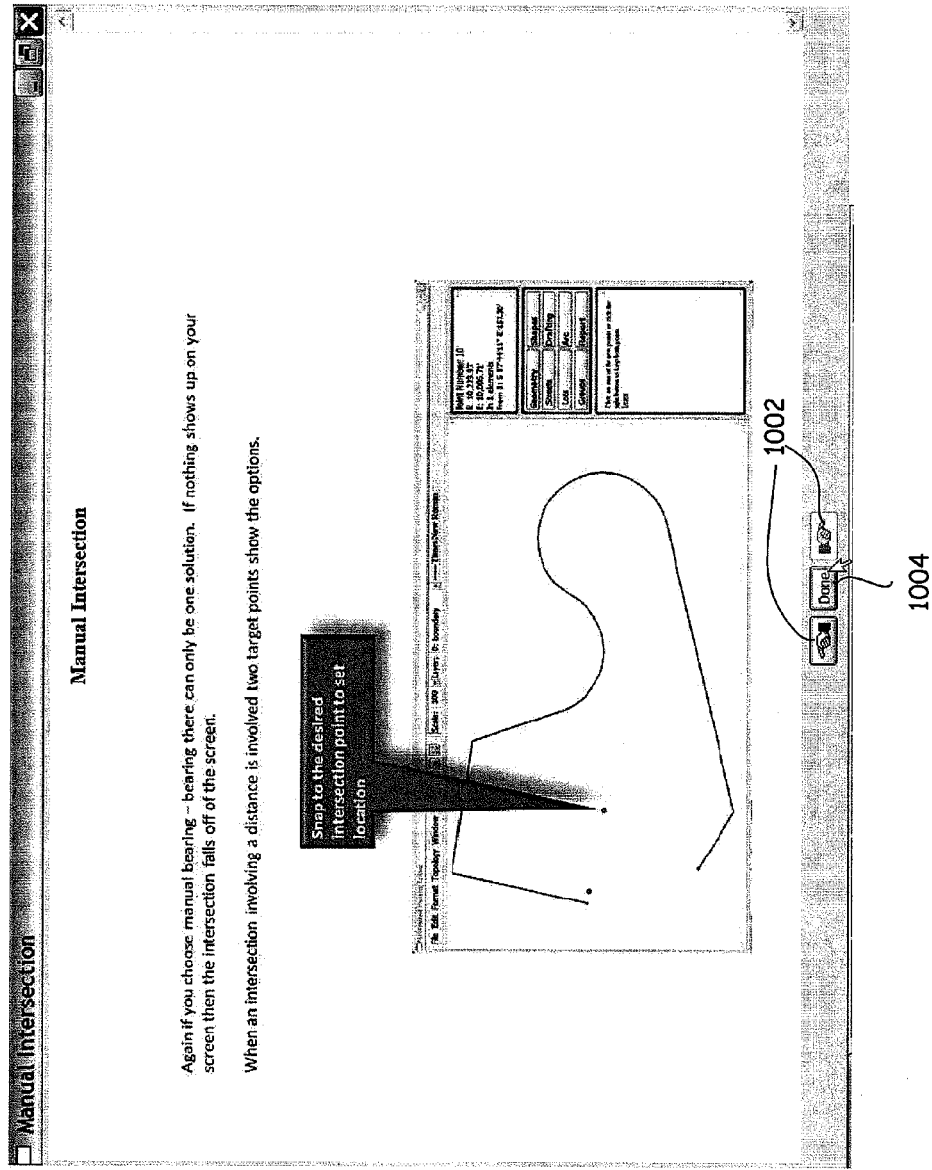
FIG. 17 is a screen shot of an example third page of the tutorial window shown in FIG. 15.
Figure 18:
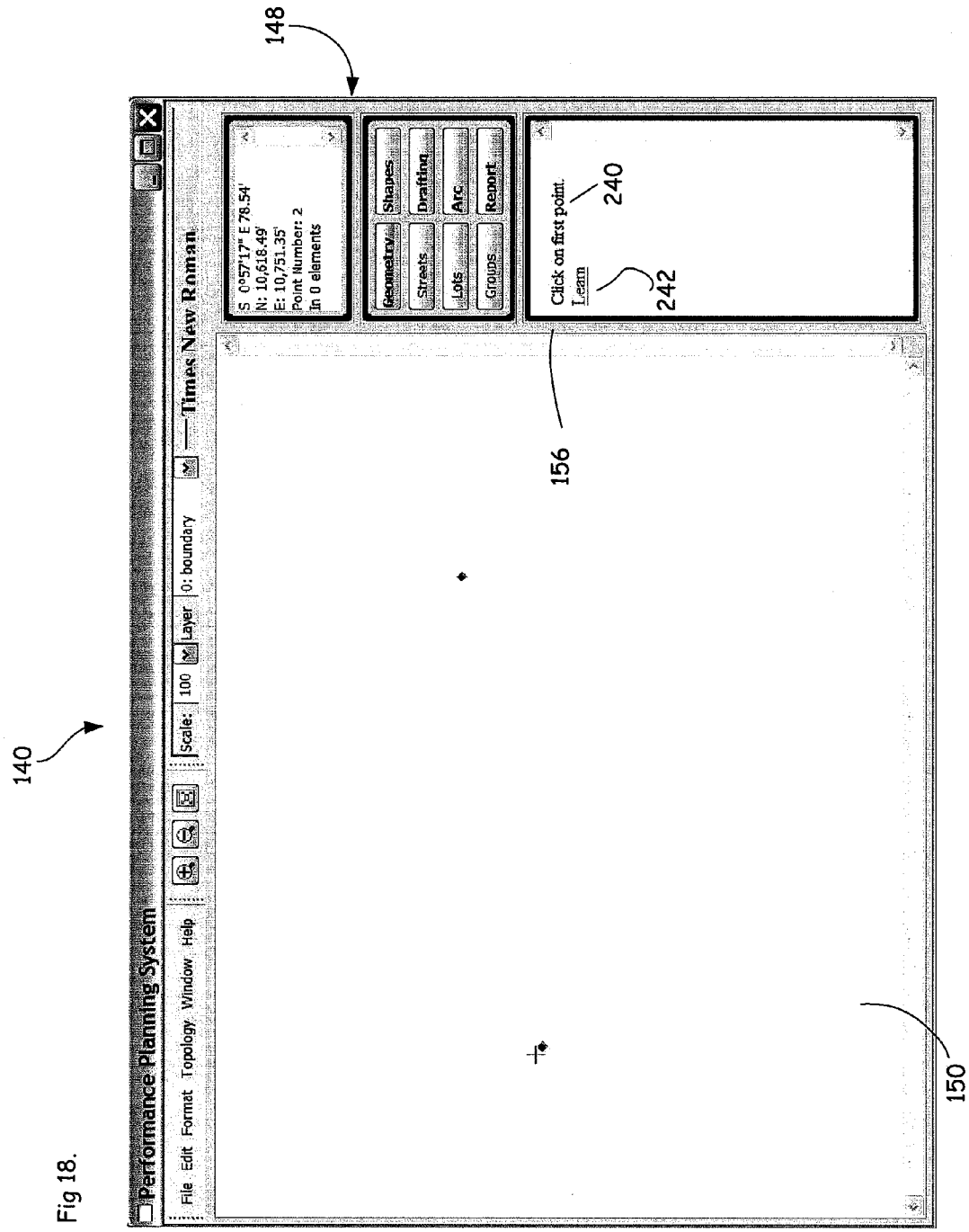
FIG. 18 is a screen shot of an example fourth page of the tutorial window shown in FIG. 15.

FIGS. 16-17 are screen shot of second and third tutorial pages, respectively of the example tutorial window 1000, such as displayed after the first tutorial page shown in FIG. 15. Tutorial window 1000 includes navigation buttons 1002 and done button 1004. The second page is displayed after a user has used navigation buttons 1002 to advance to the respective page.

The second tutorial page provides additional information to the user regarding the operation of the tool, such as the manual intersect tool. The second tutorial page includes further information of the "how to" section of the first page. In this example, the second tutorial page says that "Bearings and distances are entered in the same formats as within the previous traverse instructions. When entering a simple bearing—bearing intersection there can be only one option which shows up as a target point. When dealing with a distance there are always two intersection points. The direction of the bearing will not matter. Some software packages you may have used in the past require you to determine direction when you use manual intersection, but often you may get the direction wrong. PPS has added an extra step to have you visually choose the correct point to eliminate having to think where the intersection should be." The second tutorial page also includes a graphical illustration that shows the user what to do: 1. Enter the desired bearing or distance from the first snapped point, 2. Enter the desired bearing or distance from the second snapped point, and 3. Press [Submit] or [Enter].

FIG. 17 shows an example of a third tutorial page of the example tutorial window 1000. In this example, the third tutorial page provides yet further instructions to the user from a "how to" section. The third tutorial page states: "Again if you choose manual bearing—bearing there can only be one solution. If nothing shows up on your screen then the intersection falls off of the screen. When an intersection involving a distance is involved two target points show the options." The third tutorial page includes a graphical illustration that states: "Snap to the desired intersection point to set location."

After viewing the pages of the tutorial window 1000, the user can either navigate back to a previous page to review the instructions, or selects done button 1004 to close tutorial window 1000.

Once the tutorial has been completed, user interface 140 once again displays user interface 140, such as shown in FIG. 18.

FIG. 18 is another screen shot of example user interface 140 after the selection of a manual intersection tool from guide window 156. In the illustrated example, guide window 156 instructs the user with instruction 240 to "Click on first point." Instruction 240 provides the first instruction on how to use the selected tool.

The user then follows the instruction, to move the mouse to the first point desired, and clicking the mouse button on that point. Upon completion of the first step, guide window 156 then displays the second step, as shown in FIG. 19.

Figure 19:
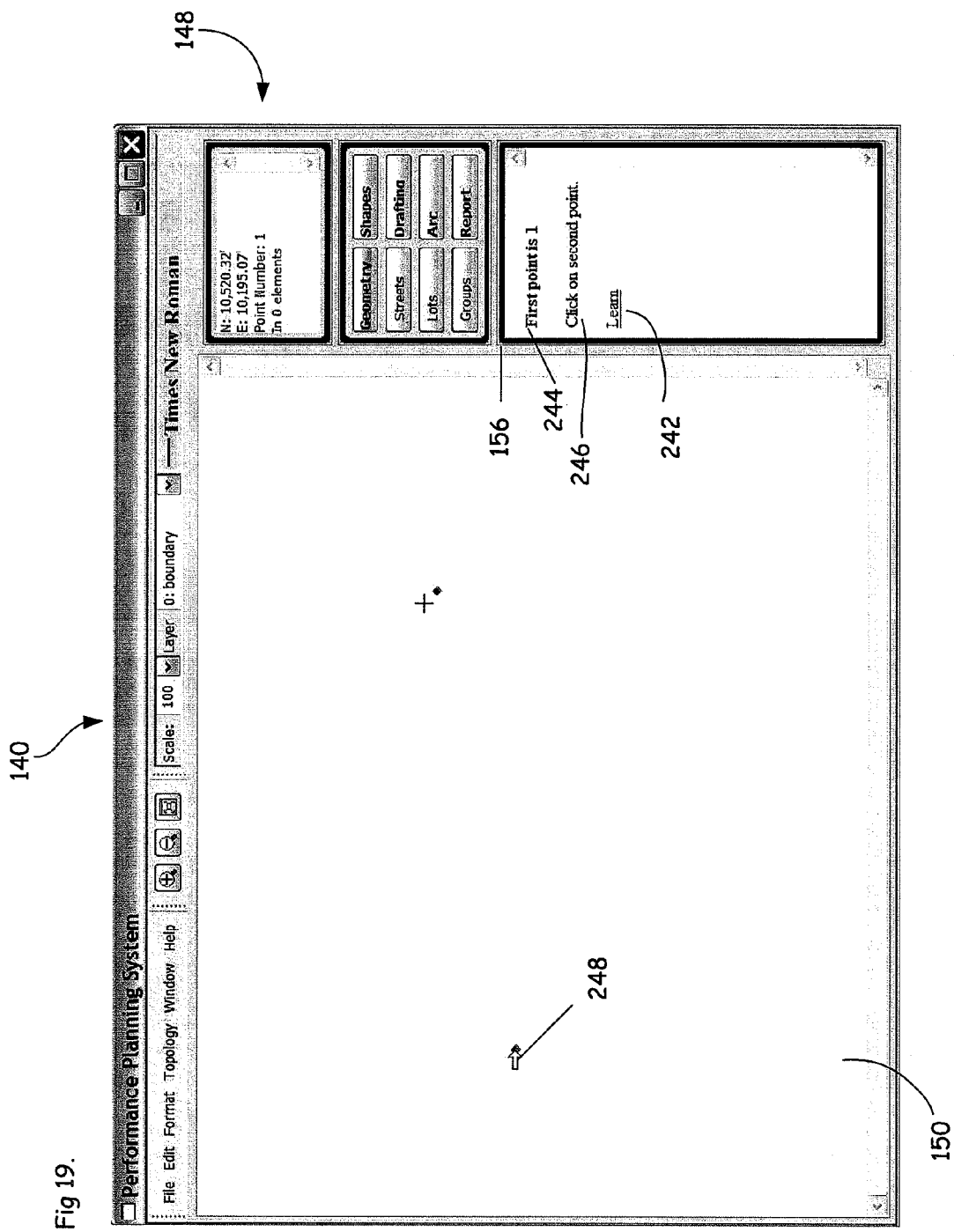
FIG. 19 is another screen shot of the example user interface shown in FIG. 3 after a first instruction has been followed.

FIG. 19 is another screen shot of example user interface 140 after a first instruction of guide window 156 has been followed. In the illustrated example, guide window 156 now displays confirmation prompt 244, second instruction 246, and learn button 242.

In the illustrated example, arrow 248 is now displayed in planning window 150 corresponding to the location of the first point, as input by the user. The input is provided, for example, by clicking the mouse on a particular point of a land plan. In another embodiment, a coordinate is input to select the first point.

After the input has been received, guide window 156 provides confirmation prompt 244. Confirmation prompt 244 displays a message confirming that the first instruction has been properly followed. In the illustrated example, confirmation prompt 244 displays a message that says "First point is 1." In this example, 1 is the identification number of the point. The identification number is used to assist the user in being able to identify a particular point, but is not required in all embodiments. In some embodiments, each point is identified by the coordinate of the point, such as a northing, easting, and elevation. In some embodiments, each point has a unique coordinate, such that no two points can share the same coordinate. One of the benefits of all points having a unique coordinate is that when a point is moved from one coordinate to another coordinate, all elements and shapes that share the same coordinate will also be adjusted.

In some embodiments, points can be automatically assigned a default description if a description is not manually assigned by the user. In one embodiment, the point is automatically assigned the name of the lowest numbered layer of all elements that use the point. For example, if two lines share the same point, and one of the lines is on layer 9 driveway and the other line is on layer 11 street, then the point would automatically have a description of "driveway" because it is the lowest layer that uses that point. This is useful when snapping to a point because it displays to the user how the point is being used. In addition, when the site data is exported to field data collectors for stakeout, the people in the field know what the points represent based on the point description.

If additional tasks are needed to complete the task intended by the particular tool, guide window 156 displays second instruction 246. Second instruction 246 displays an instruction that informs the user of the next step required to continue using the selected tool. In the illustrated example, second instruction 246 displays "click on second point."

In the illustrated embodiment, guide window 156 also displays learn button 242. When selected, learn button 242 causes guide window 156 to display more detailed instructions to train the user to perform the tasks necessary to use the selected tool (such as shown in FIGS. 15-17. In alternate embodiments, learn button 242 is not included. For example, if instructions in guide window 156 are sufficiently detailed, there may not be additional information needed through learn button 242.

Figure 20:
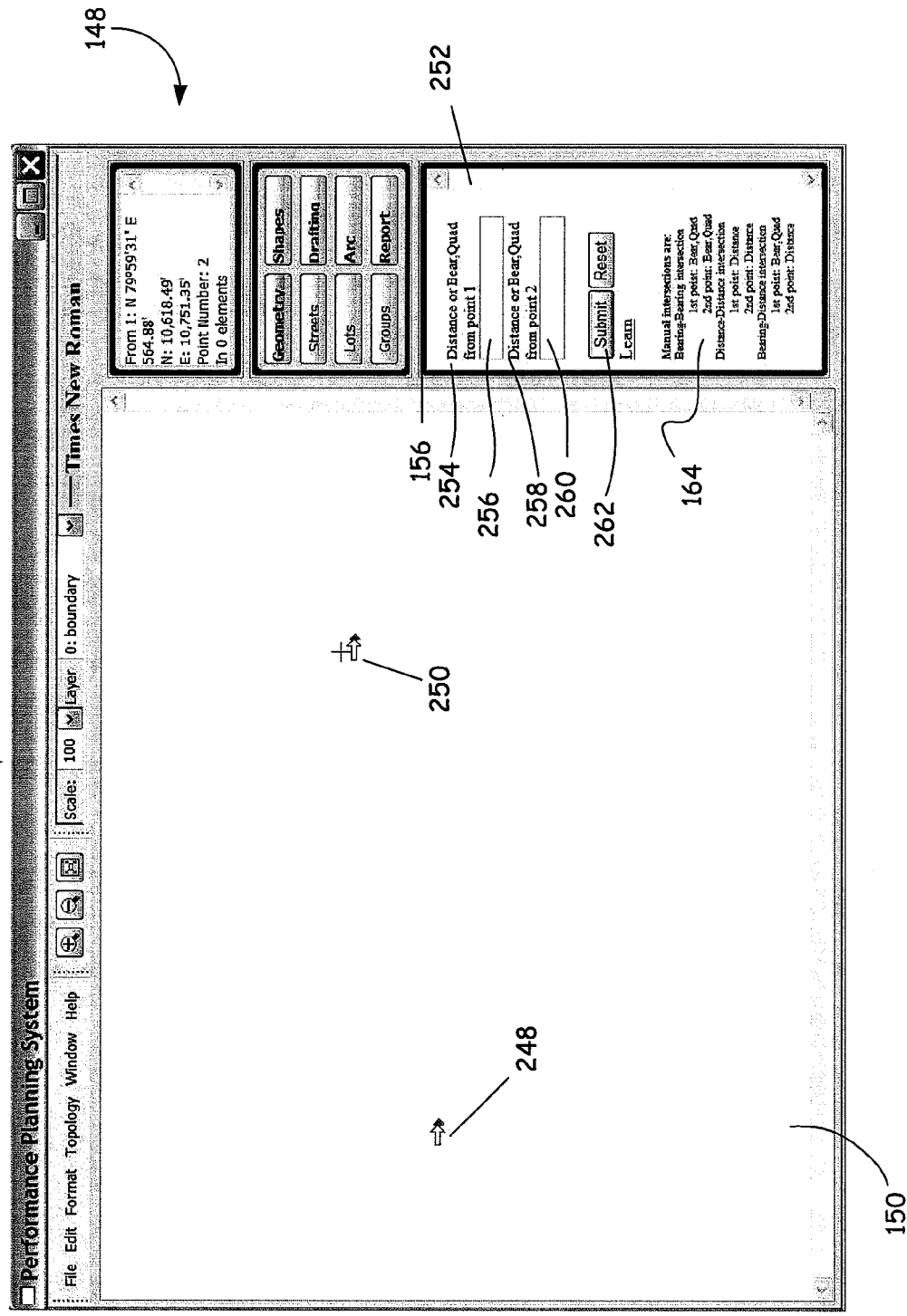
FIG. 20 is another screen shot of the example user interface shown in FIG. 3 after a second instruction has been followed.

FIG. 20 is another screen shot of example user interface 140, after a second instruction from guide window 156 has been followed. For example, the user has now provided an input to select the second point. In the illustrated embodiment, user interface 140 now displays first arrow 248 and second arrow 250 in planning window 150, and third instruction 252 in guide window 156.

In this example, the user has completed the second task as instructed by the second instruction (e.g., 246 shown in FIG. 19). For example, the user has selected a second point. Planning window 150 then updates in response to the input received, such as to display second arrow 250 representing the second point.

If additional tasks are still required to complete the function of the selected tool, guide window 156 displays third instruction 252. In this example, third instruction 252 includes first prompt 254, first input field 256, second prompt 258, second input field 260, submit button 262, Reset button 263, and detailed instruction 264.

In the illustrated example, the manual intersect tool (e.g., 204 shown in FIG. 5) is being used to locate a point of intersection. Two reference points have been selected by the user, as illustrated by arrows 248 and 250. Next, first and second prompts 254 and 258 instruct the user to enter a distance or bearing from the points selected. A distance is, for example, a radius of a circle extending out from one of the points. A bearing is, for example, a compass direction of a line extending out from one of the points.

The desired distance or bearing from the first point (represented by first arrow 248) is entered into first input field 256. The distance or bearing can be input in a wide variety of formats. Example formats are illustrated by detailed instructions 264 displayed to the user in guide window 156. Detailed instructions 264 are one example of additional information that is provided after a user selects the learn button.

In the illustrated embodiment, the desired distance or bearing from the second point (represented by second arrow 250) is entered into second input field 260. The desired distance or bearing may be entered in any one of a variety of formats. This is beneficial because it enables the user to use whatever format that the user is most comfortable with, rather than having to conform to a specific format used by the system. After input has been provided by the user to first and second input fields 256 and 260, submit button 262 is selected to input the information. The function of the tool is then completed, such as to identify a point of intersection. If desired, input fields 256 and 260 can be reset by selecting Reset button 263.

In some embodiments, land plan development tool 100 includes a variable prompting feature. Variable prompting means that the system is capable of receiving inputs in a wide variety of formats. Examples of possible inputs include bearings, coordinate geometry, curve information, arc information, deflection from previous bearing, and tangent from previous arc. Some examples are provided below.

Boundary entry and coordinate geometry can be entered in a variety of formats. One method of entering boundary information is through bearings. Bearings are generally described with reference to north and east directions, and more specifically by degrees, minutes, and seconds. Some examples of bearing formats that are supported include N dd.mmssSSS E, N dd mm ss.SSS E, dd.mmssSSS NE, dd mm ss.SSS NE.

In these examples, "N" stands for North, and E stands for "East." In one embodiment, the letter "d" stands for degrees, "m" stands for minutes, "s" stands for seconds, and "S" stands for decimals of seconds. In this example, each of "d", "m", and "s" represent a single integer value. For example, "dd" can be entered as the integer 3 and the integer 0, to represent 30 degrees. In one embodiment, degrees may be entered as a single digit, and double digits are not required.

In another embodiment, N or E can respectively be replaced by "S" for south and "W" for west. In some embodiments, the letters N, S, W, and E are not case sensitive. In other embodiments, the minutes, seconds, and decimals of seconds are optional.

Boundaries may also be entered by typing out the complete name of the direction, such as north, south, east, or west. In some embodiments, directions can be entered in any of the following manners. "North" indicates a bearing of 0° NE or 0° NW or due north. "South" indicates a bearing of 0° SE or 0° SW or due south. "East" indicates a bearing of 90° NE or 90° SE or due east. "West" indicates a bearing of 90° NW or 90° SW or due west. "NorthEast" indicates a bearing of 45° NE. "NorthWest" indicates a bearing of 45° NW. "SouthEast" indicates a bearing of 45° SE. "SouthWest" indicates a bearing of 45° SW. "N" indicates a bearing of 0° NE or 0° NW or due north. "S" indicates a bearing of 0° SE or 0° SW or due south. "E" indicates a bearing of 90° NE or 90° SE or due east. "W" indicates a bearing of 90° NW or 90° SW or due west. "NE" indicates a bearing of 45° NE. "NW" indicates a bearing of 45° NW. "SE" indicates a bearing of 45° SE. "SW" indicates a bearing of 45° SW.

In some embodiments, the directions are not case sensitive. For example, "North" will be equally recognized if entered, for example, as "north" or "nOrTh." Similarly, "NE" will be equally recognized if entered as "ne", "Ne", or "nE".

In some embodiments of land plan development tool 100, variable prompting also enables land plan development tool 100 to receive curve or arc information in a variety of formats. In some embodiments, curve or arc information can be entered in formats such as: A angle R radius, A angle, R radius, AangleRradius, R radius A angle, R radius, A angle, RradiusAangle, L arclength R radius, L arclength, R radius, LarclengthRradius, R radius L arclength, R radius, L arclength, and RradiusLarclength. The letters A, R, and L, are input as letters representing "angle", "radius", and "length." In some embodiments, A, R, and L are not case sensitive. In this list, the words "radius", "angle", and "arclength" are numbers or decimals representing the identified quantity. In some embodiments, "angle" may be entered in any format, such as dd.mmssSSS, -dd.mmssSSS, dd mm ss SSS, or -dd mm ss.SSS, or any other bearing format listed herein. In some embodiments, "radius" and "arclength" are numbers or decimal numbers, such as 99.999.

In some embodiments of land plan development tool 100, variable prompting also enables land plan development tool 100 to receive a direction as a deflection from a previous bearing or a tangent of a previous arc. One example format is D angle, distance. The word "angle" represents an angle that can be entered in any format described herein, such as dd.mmssSSS, -dd.mmssSSS, and the like. The word "distance" represents a distance that can be entered, for example, as a number or decimal, such as 99.999.

As one example, the user enters bearings from each point. In field 256 the user enters the bearing "n 45 e" and in field 260 the user enters the bearing "n 45 w". The "Submit button" 262 is then selected to enter the bearings. The manual intersect tool then determines the intersection of the bearings from the first and second points, as shown in FIG. 21.

Figure 21:
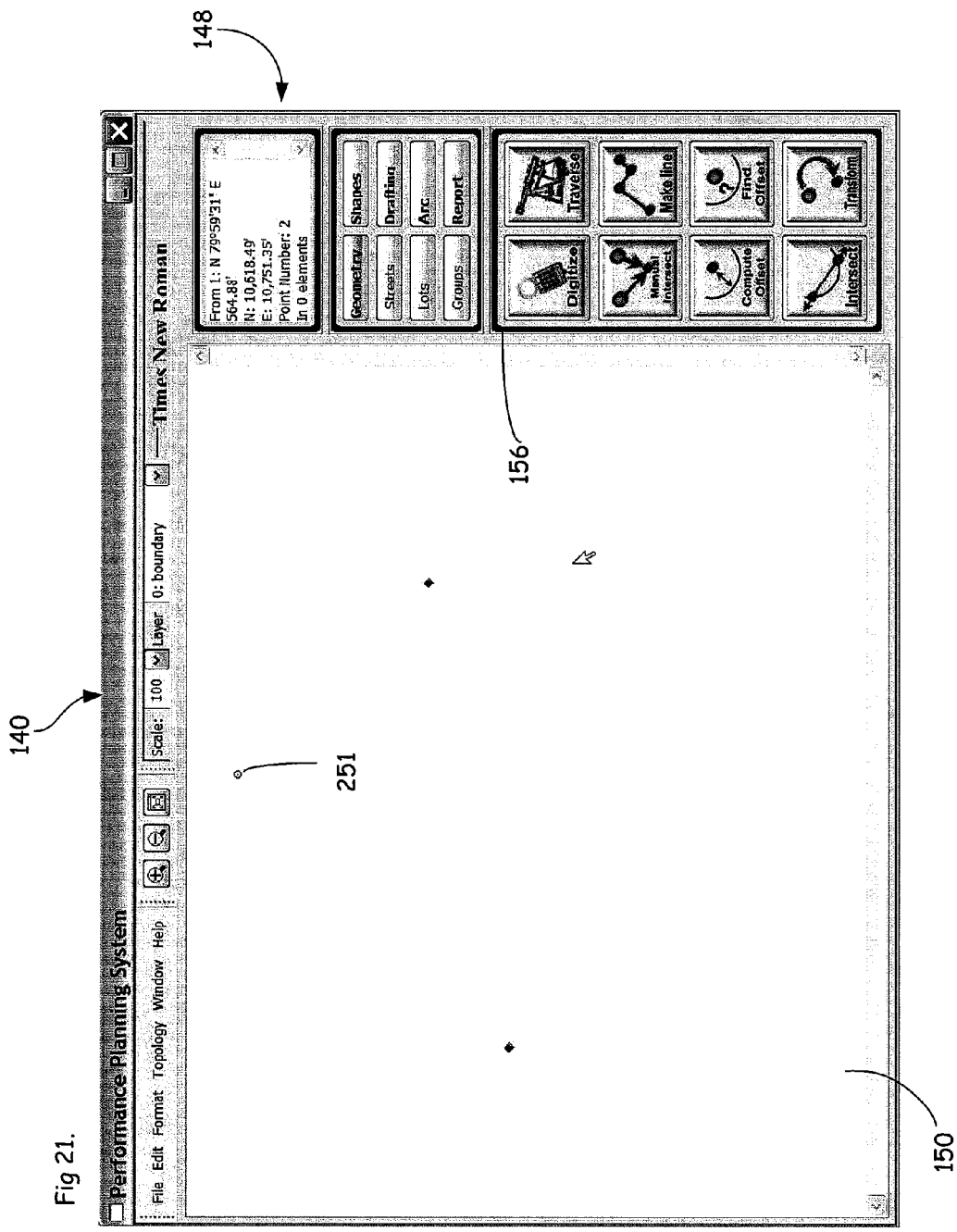
FIG. 21 is an example screen shot of the user interface shown in FIG. 3 after selection of a manual intersect tool

FIG. 21 is another example screen shot of user interface 140 after the manual intersect tool has completed, as described above.

In this example, after entering bearings from the first point (arrow 248) and the second point (arrow 250), manual intersect tool then identifies the intersection between an imaginary line extending "n 45 e" from the first point, and another imaginary line extending "n 45 w" from the second point (these example bearings were described with reference to FIG. 20 above). The intersection of these imaginary lines is identified by the manual intersect tool, and the point 251 is displayed in user interface 140. Point 251 is made available to the user for subsequent use, such as to define another element.

This concludes the operation of the manual intersect tool, and as a result guide window 156 returns to the display of geometry tools.

Figure 22:
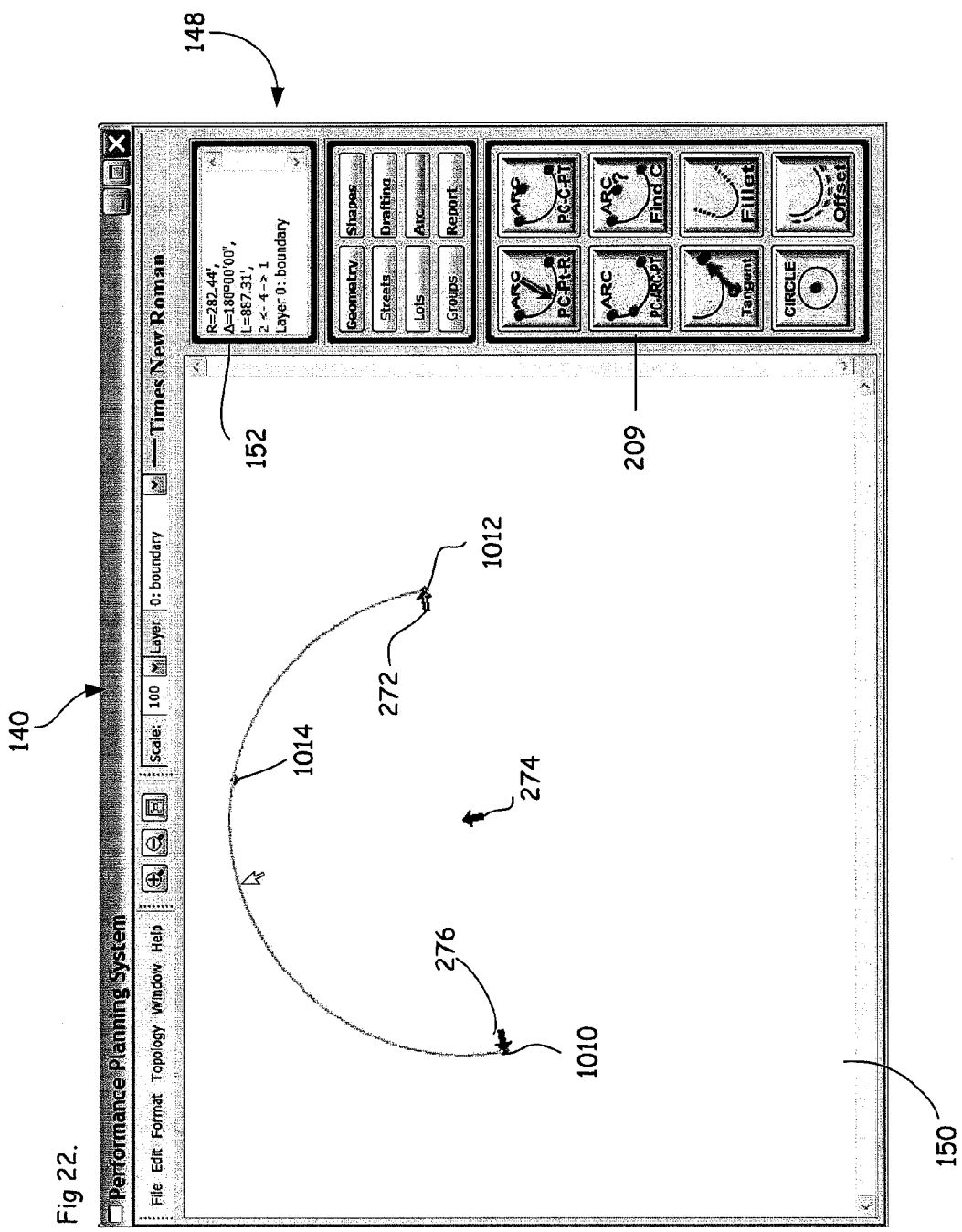
FIG. 22 is another screen shot of the example user interface shown in FIG. 3 illustrating the formation of an arc.

FIG. 22 is another example screen shot of user interface 140, illustrating the formation of an arc 270, based on previously defined points (such as the points described with reference to FIGS. 15-21). In this example, user interface 140 includes a first point 1010, a second point 1012, and a third point 1014. In one embodiment of land plan development tool 100, a land plan is developed from building blocks referred to as elements. Elements include, for example, straight lines ("lines"), curves ("arcs"), and connected groups of lines ("polylines"). Each element is defined by a set of points. A point is defined by a coordinate on the land plan, such as a northing, an easting, and an elevation. Typically, each point is unique, such that no two points are at the same location. Alternatively, another embodiment could allow two or more points to share a single coordinate. However, multiple elements will often share a point. When that point is modified, such as to move it to a different location, all associated elements are automatically modified as well.

This example illustrates the formation of an arc 270 based on three previously defined points 1010, 1012, and 1014. In this example, the pc-arc-pt tool 209 is used to generate the arc. Once pc-arc-pt tool 209 is selected, the guide window 156 prompts the user (not shown in FIG. 22) to select a starting point (e.g., point 1012), any point on the arc (e.g., point 1014), and an ending point (e.g., point 1010). Once all three points have been identified, pc-arc-pt tool 209 generates arc 270 and displays arc 270 in planning window 150.

As shown, when an element (such as arc 270) has been selected, planning window 150 displays arrows to identify the element that has been selected, and to display information about the element. In the illustrated example, arc 270 is now selected. Planning window 150, therefore, displays a set of arrows including, beginning arrow 272, center arrow 274, and ending arrow 276. Center arrow 274 points to a center point from which arc 270 is drawn, and in a direction toward a midpoint of arc 270. Beginning arrow 272 points to the starting point (point 1012) of arc 270 and in a direction away from the center point (e.g., arrow 274). Ending arrow 276 points to an ending point (point 1010) of arc 270 and in a direction away from the center point (e.g., arrow 274).

In some embodiments, arrows are color coded to assist the user in identifying the particular point desired. For example, beginning arrow 272 is green, center arrow 274 is blue, and ending arrow 276 is red. Within info box 152, references to the respective points (e.g., points 1010, 1012, and 1014) are displayed in a color matching the arrow colors. This enables the user to quickly visually match the arrow with the point number identifier having the same color. For example, info box 151 includes a fourth line that displays "2<–4–>1" where the number 2 is displayed in green text, the number 4 is displayed in blue text, and the number 1 is displayed in red text. This display shows the user that the arc begins at a point having an identifier 2 (e.g., point 1012) which is displayed in the user interface with a green arrow (arrow 272). The display also shows that the center point is a point having an identifier 4, which is represented by the blue arrow (arrow 274). Finally, the display shows that the ending point is a point having an identifier 1 (e.g., point 1010), which is represented by the red arrow (arrow 276). In some embodiments color coding can be adjusted in the apply colors tab 466. Other embodiments include other color coding.

In some embodiments, color coding is also applied to other elements. For example, when a line is selected in planning window 150, the line is illustrated having a beginning arrow, representing the starting point, and an ending arrow, representing an ending point. The arrows point in a direction parallel with and toward the line. Info box displays point identifiers that are color coded to match the arrow to which the point relates. As another example, polylines are also represented with color coded arrows, including a beginning arrow, an ending arrow, and arrows at each point where line segments meet. Each of the arrows is displayed in a color that matches the font color of the associated point identifier in info box 152.

Figure 23:
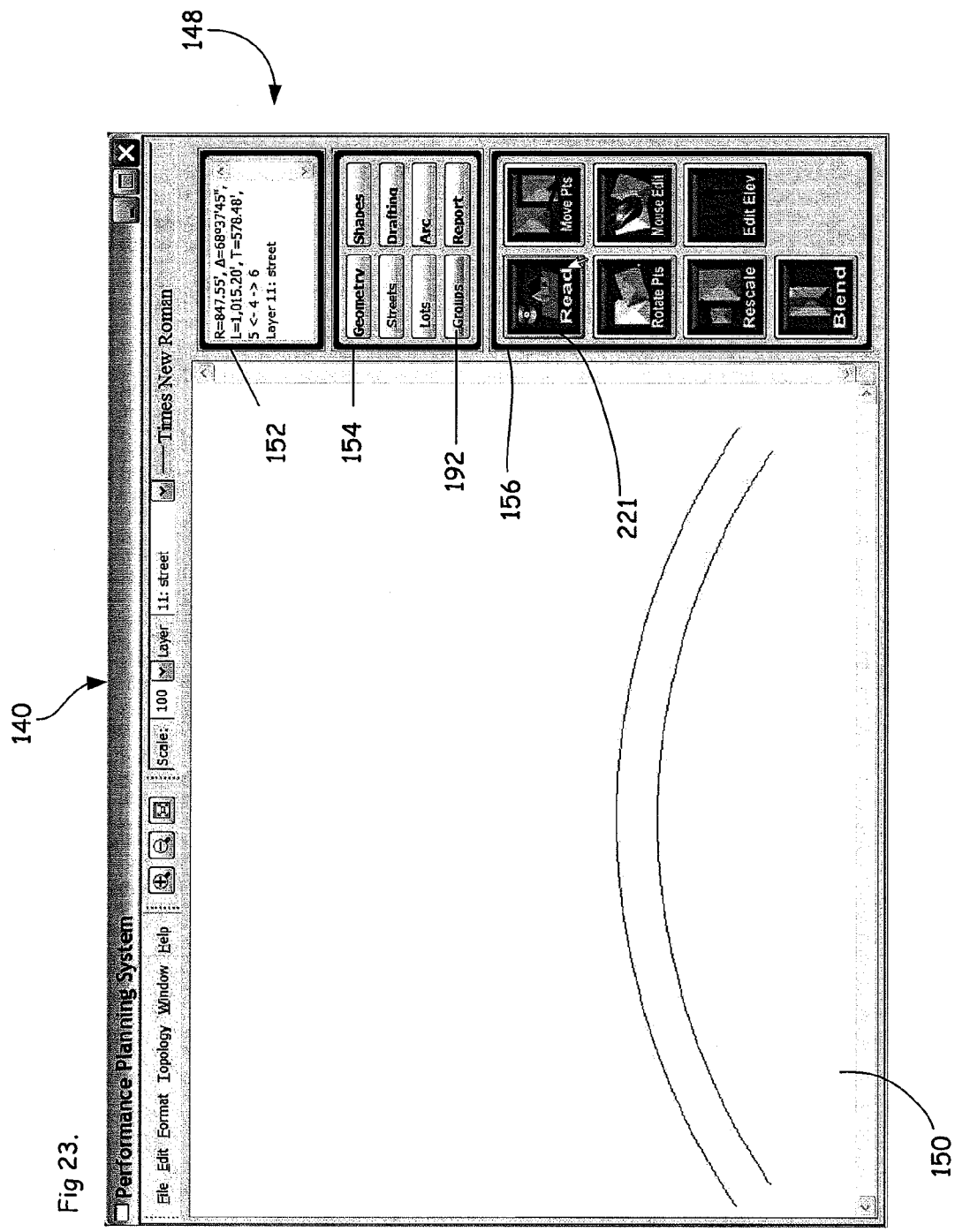
FIG. 23 is another screen shot of the example user interface shown in FIG. 3 prior to the insertion of a group into a land plan.
Figure 24:
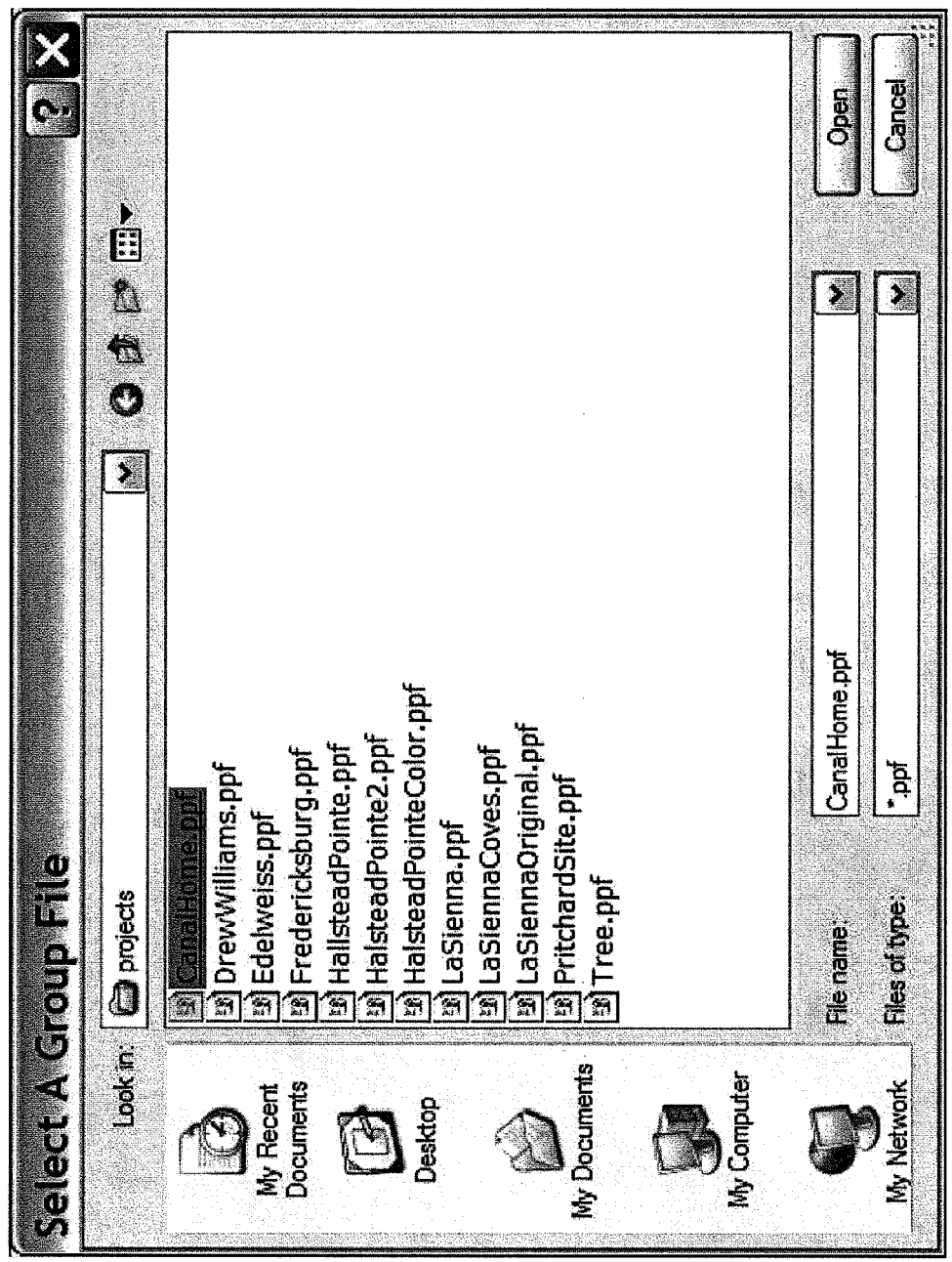
FIG. 24 is a screen shot of an example Select A Group File window.

FIGS. 23-26 illustrate how a group, such an image, can be inserted into a land plan from a file. In this example, the group is an image representing an aerial view of a set of town homes to be used in the development represented by the land plan. FIG. 23 is another example screen shot of user interface 140 prior to insertion of the group. In this example, land plan development tool 100 is used to insert a group into a land plan from a file. Planning system groups button 192 has been selected by the user, such that the groups tools are displayed in guide window 156. In this example, the user selects Read tool 221 to indicate that the user wants land plan development tool 100 to read obtain the group from an existing file. A Select A Group File window is then displayed, as shown in FIG. 24.

FIG. 24 is a screen shot of an example Select A Group File window, such as displayed after selecting a read tool 221, as shown in FIG. 23. Select A Group File window prompts the user to select a file to be imported as a group into the land plan. After the user has identified the file, the user selects the Open button. In some embodiments, read tool 221 subsequently prompts the user as to whether the user wants the file to be fixed or linked. Linked files are dynamically read from the file whenever the site is opened. In this way, changes to the group file will be reflected in the site. If a group file is deleted, land plan development tool 100 stores the previously read copy of the linked group file and converts the file to a fixed file. In contrast to linked files, fixed files are imported into the site at the time they are identified, and will not reflect subsequent changes made to the group file. After the group file has been identified, it is displayed on the land plan, as shown in FIG. 25.

Figure 25:
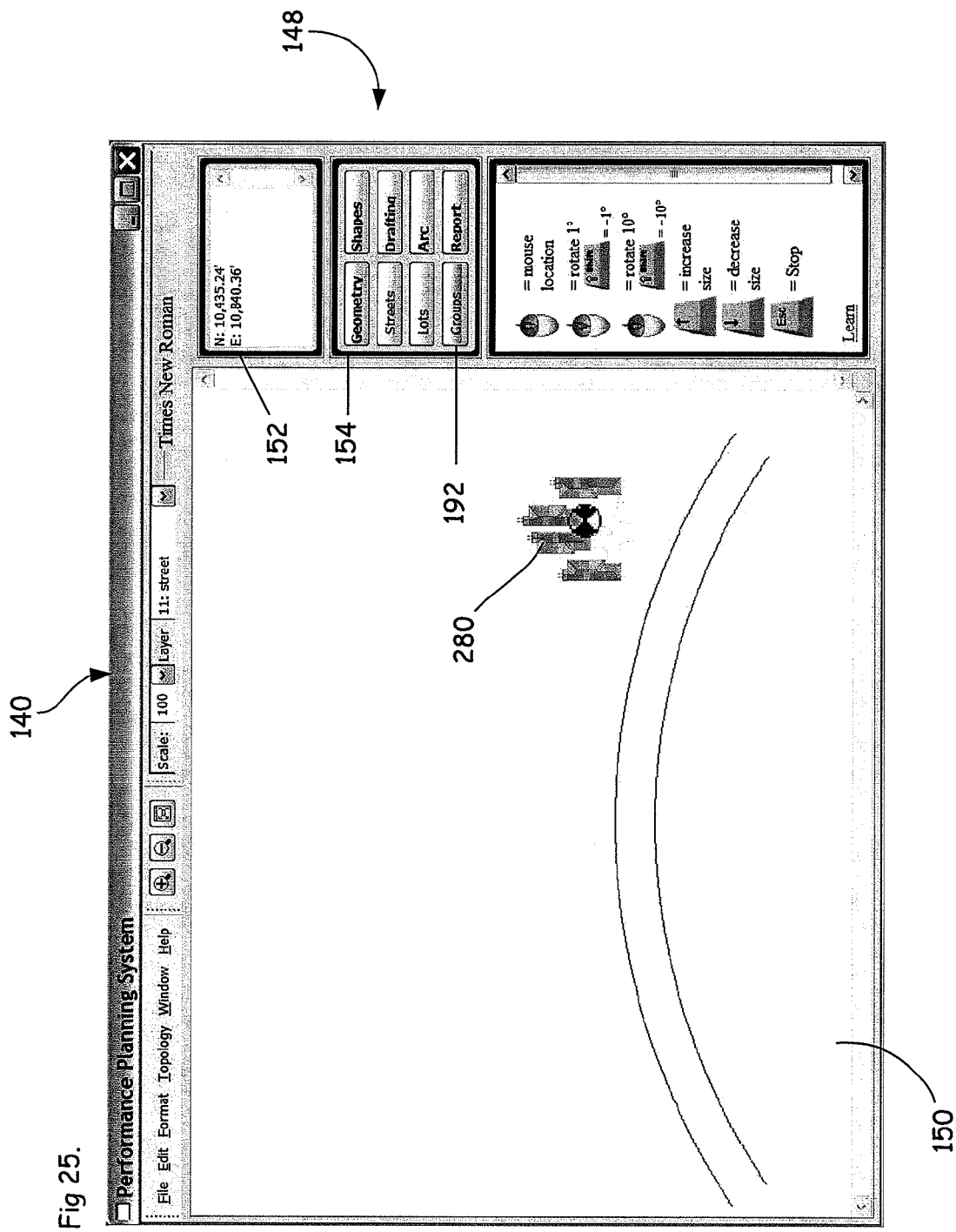
FIG. 25 is another screen shot of the example user interface shown in FIG. 3 during insertion of a group into a land plan.

FIG. 25 is another screen shot of user interface 140 during insertion of a group into a land plan (such as using the read tool 221, shown in FIG. 23). After the group file has been identified (as described with reference to FIG. 24), the group 280 is displayed in planning window 150. Guide window 156 displays instructions to the user as to how to place the group in the land plan. In some embodiments, placement of the group includes horizontal and vertical movement within the land plan, as well as rotation in a counter-clockwise or clockwise direction. The size of the group can also be increased or decreased in some embodiments. Once the group 280 has been sized and placed in the desired position, the group 280 is inserted into the land plan, such as by clicking the left mouse button. At this point, the read tool places the group 280 into the land plan, and provides a second copy of the group 280 for placement into the land plan, if desired. This copy is then placed in the same manner. The process continues until all desired copies of the group 280 have been placed in the land plan.

Figure 26:
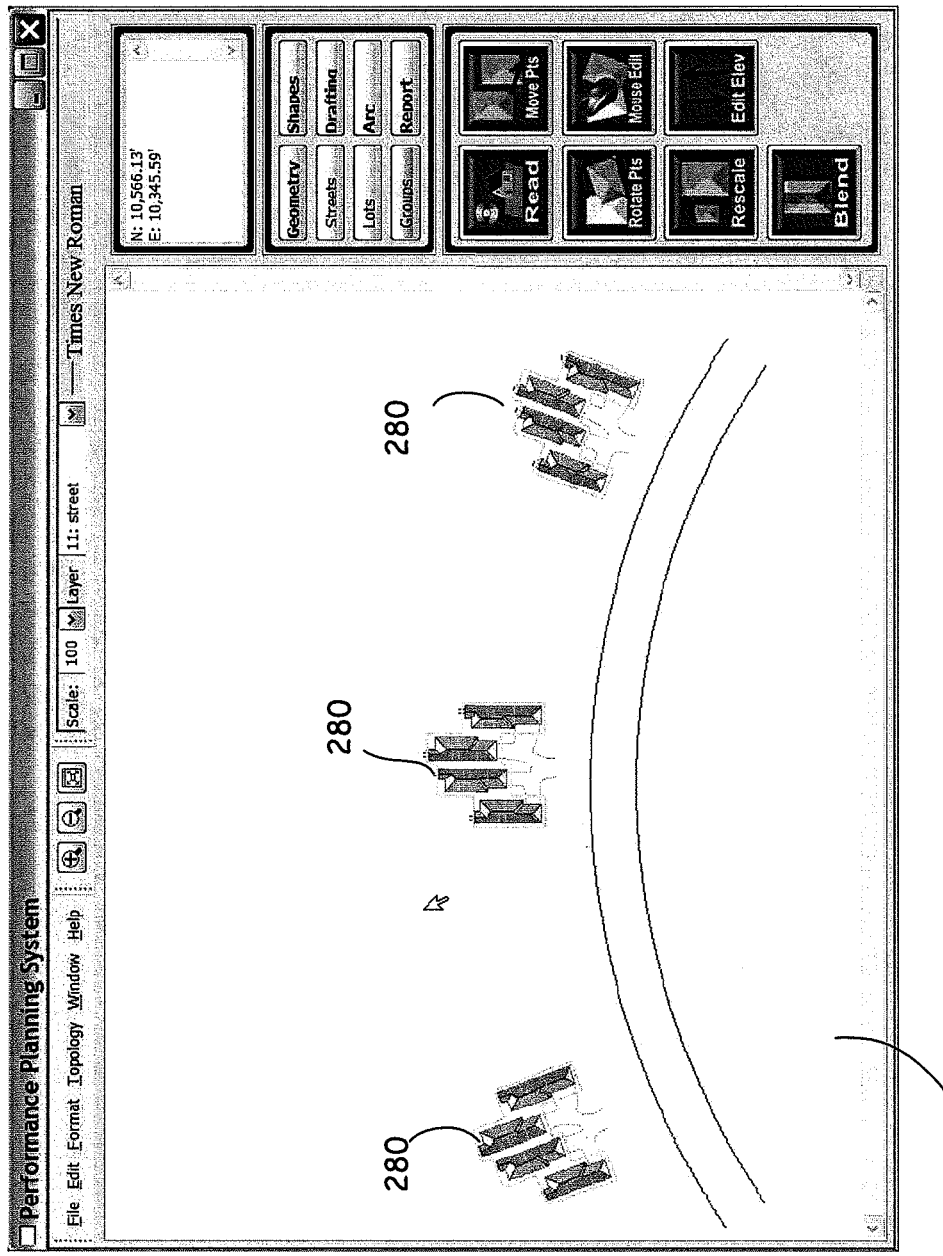
FIG. 26 is another screen shot of the example user interface shown in FIG. 3 including groups that have been added to a land plan.

FIG. 26 illustrates an example in which three copies of the group 280 have been placed into a land plan.

After placement of the three desired groups 280, a report can be generated, if desired, by land plan development tool 100. To do so, the user first selects the report button 194 from tool box 154 (such as shown in FIG. 12) and then selects the groups tool 249 to request a report of existing groups within the land plan. Groups tool 249 causes guide window 156 to prompt the user to enter a name or partial name of the group. To request all groups, the user need not enter anything, but simply presses a submit button to submit the report request. An example of the groups report generated for the example shown in FIG. 26 is shown in Table 1:

TABLE 1

| Group Identifier | Fixed/ Linked | Filename | Center location |
|---|---|---|---|
| 1 | Fixed | C:\projects\rick\CanalHome.ppf | N: 10,312.20' E: 10,850.83' |
| 2 | Fixed | C:\projects\rick\CanalHome.ppf | N: 10,393.36' E: 10,475,17' |
| 3 | Fixed | C:\projects\rick\CanalHome.ppf | N: 10,326.60' E: 10,144.02' |

The report of Table 1 shows that there are currently three groups within the land plan, and displays the associated group identifiers, whether the group is fixed or linked, the filename of the group, and the center location of each group in the land plan by coordinate.

Figure 27:
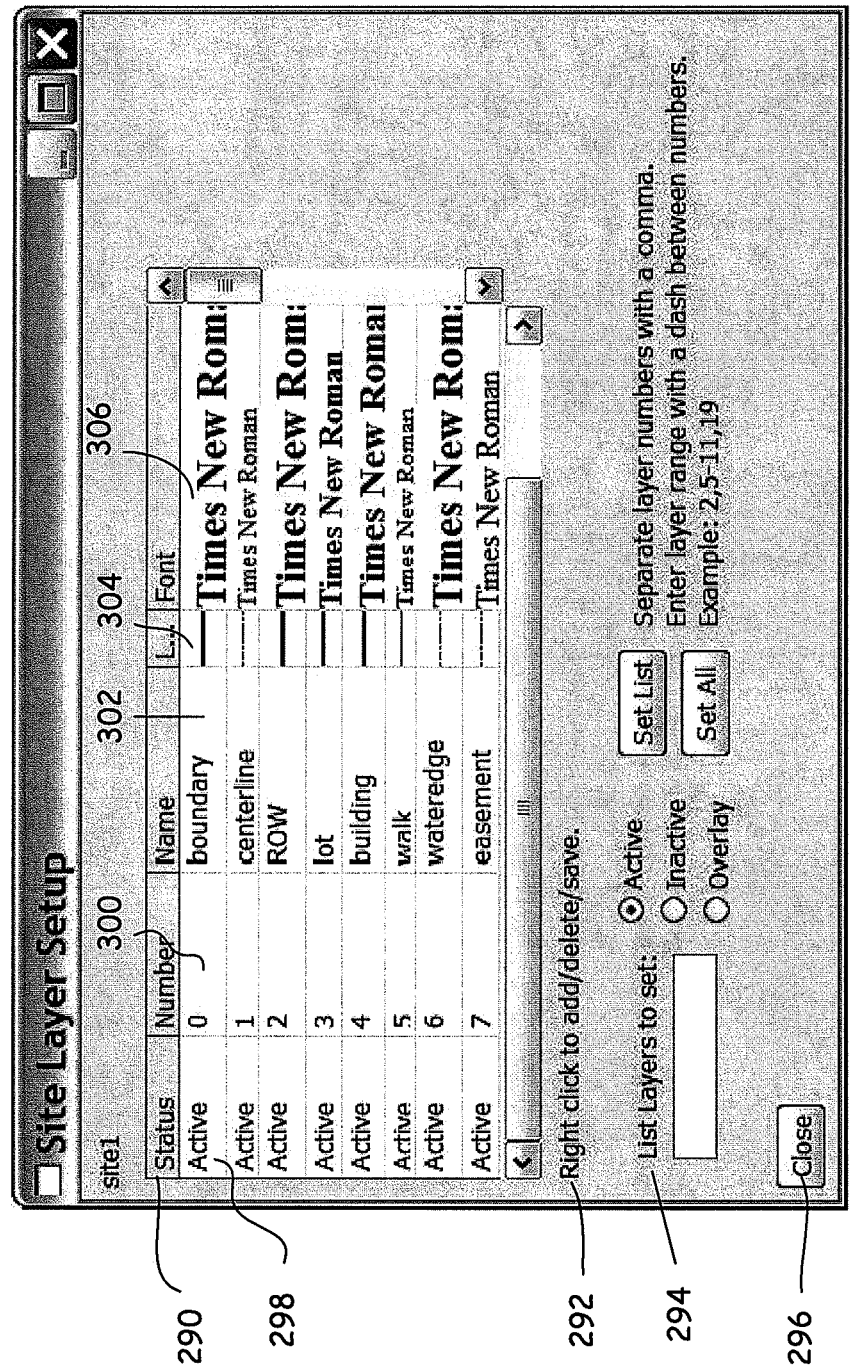
FIG. 27 is a screen shot of an example layer setup window of the land plan development tool shown in FIG. 1.

FIG. 27 is a screen shot of example layer setup window 286. Layer setup window 286 includes layer type list 290, instruction prompt 292, layer status adjustment prompt 294, and close button 296. In one embodiment, layer setup window 286 is displayed by land plan development tool 100 whenever a user desires to select a layer or modify a layer property. In one embodiment, layers are used to group features within the land plan according to general visual or functional characteristics. For example, a road layer may be defined in which all roads are defined and displayed. As another example, a lot layer may be defined in which all lots are displayed. Layer setup window 286 is displayed, for example, when a user selects "Layer Setup" from the default preferences menu or site preferences menu (e.g., from menu bar 142 shown in FIG. 3), or when adding or editing a layer format.

In the illustrated embodiment, layer setup window 286 includes layer type list 290, which displays a list of available layers, displayed in rows. Instruction prompt 292 displays instructions to the user, such as "Right click to add/delete/save." Layer status adjustment prompt 294 enables the user to set layer mode characteristics, including whether the layer is active, inactive, or an overlay. The user can adjust the mode characteristics of a single layer, group of layers, or all layers. Close button 296 enables the user to close layer setup window 286 when completed.

In the illustrated embodiment, each row of layer type list 290 includes status indicator 298, identification number 300, layer name 302, layer line type 304, and font type 306. Status indicator 298 displays the current mode of each layer, including active, inactive, or an overlay. The status can be adjusted by the user using layer status adjustment prompt 294, or by individually clicking on status indicator 298. Upon clicking on status indicator 298, a drop down menu is displayed that presents the status options (such as Active, Inactive, and Overlay) for selection by the user. Identification number 300 enables the layer to be identified by a number.

Layer name 302 is a text-based name used to identify a layer. In one embodiment, layer name 302 may be any combination of letters, numbers, or symbols. Layer line type 304 is the default line type for the associated layer. For example, a layer may be defined to illustrate trees. In this case, a tree line type may be defined, such that all features of the tree layer have the visual appearance of trees. As another example, solid lines may be defined in other layers, such as to display roads, boundaries, or homes. Font type 306 is the font type of the associated layer. If desired, different fonts may be used for different layers.

FIG. 28 is a screen shot of an example layer details window 287. When a layer is created, or after a layer has been setup in layer setup window 286 (shown in FIG. 27), the layer can be configured or edited through layer details window 287. Layer details window 287 includes a variety of buttons and fields for customizing the appearance of the associated layer.

Layer details include line configuration fields including line type selection 289, line color selection 291, line style selection 293, and line width selection 295. Line type selection 289 enables the user to define the desired default line type within the layer. In one embodiment, selecting line type selection 289 causes a line type setup window (shown in FIG. 20) to be displayed. Line color selection 291 enables the user to define the default line color within the layer. In one embodiment, selecting line color selection 291 causes a color setup window (shown in FIG. 21) to be displayed. Line style selector 293 enables the selection of a default line style within the layer. In one embodiment, selection of line style selector 293 causes a pull-down menu to be displayed including the options of "single," "double," or "triple." Line width selection 295 enables the selection of the line width within the layer, such as by entering a width in inches, or other units of width.

Layer details window 287 also includes annotation configuration fields including annotation style selection 297, annotation font selection 299, and annotation color selection 301. Annotation style selection 297 enables the selection of a default annotation style. In one embodiment, selection of annotation style selection 297 causes the display of an annotation setup window (shown in FIG. 33). In another embodiment, annotation style is a drop-down menu that includes a list of available annotation styles. In one example, the available annotation styles include: distance on top, distance on bottom, bearing distance on top, bearing distance on bottom, bearing on top, bearing on bottom, angle on top, angle on bottom, curve number on top, curve number on bottom, radius on top, radius on bottom, bearing on top and distance on bottom, distance on top and bearing on bottom, on top and bearing over distance, and on bottom and distance over bearing. Annotation font selection 299 enables the selection of a default font for annotations within the layer. In one embodiment, selection of annotation font selection 299 causes the display of a font selection window, such as shown in FIG. 24. Annotation color selection 301 enables the selection of a default annotation color. Selection of annotation color selection 301 causes the display of a color setup window (shown in FIG. 21).

Layer details window 287 also includes text configuration fields including text font selection 303, text color selection 305, and text tilt field 307. Text font selection 303 enables the selection of a default font for the display of text within a layer of a land plan. In one embodiment, selection of text font selection 303 causes the display of a font window (shown in FIG. 24). Text color selection 305 enables the selection of the default text color for annotations within a layer of a land plan. In one embodiment, selection of text color selection 305 causes the display of a color setup window (shown in FIG. 30). Text tilt field 307 enables all text on the associated layer to be tilted to a particular bearing defined in this field.

After all layer details have been appropriately configured, Submit button 309 is selected to complete the configuration of layer details. Alternatively, cancel button 311 is selected to abort configuration of layer details.

Figure 29:
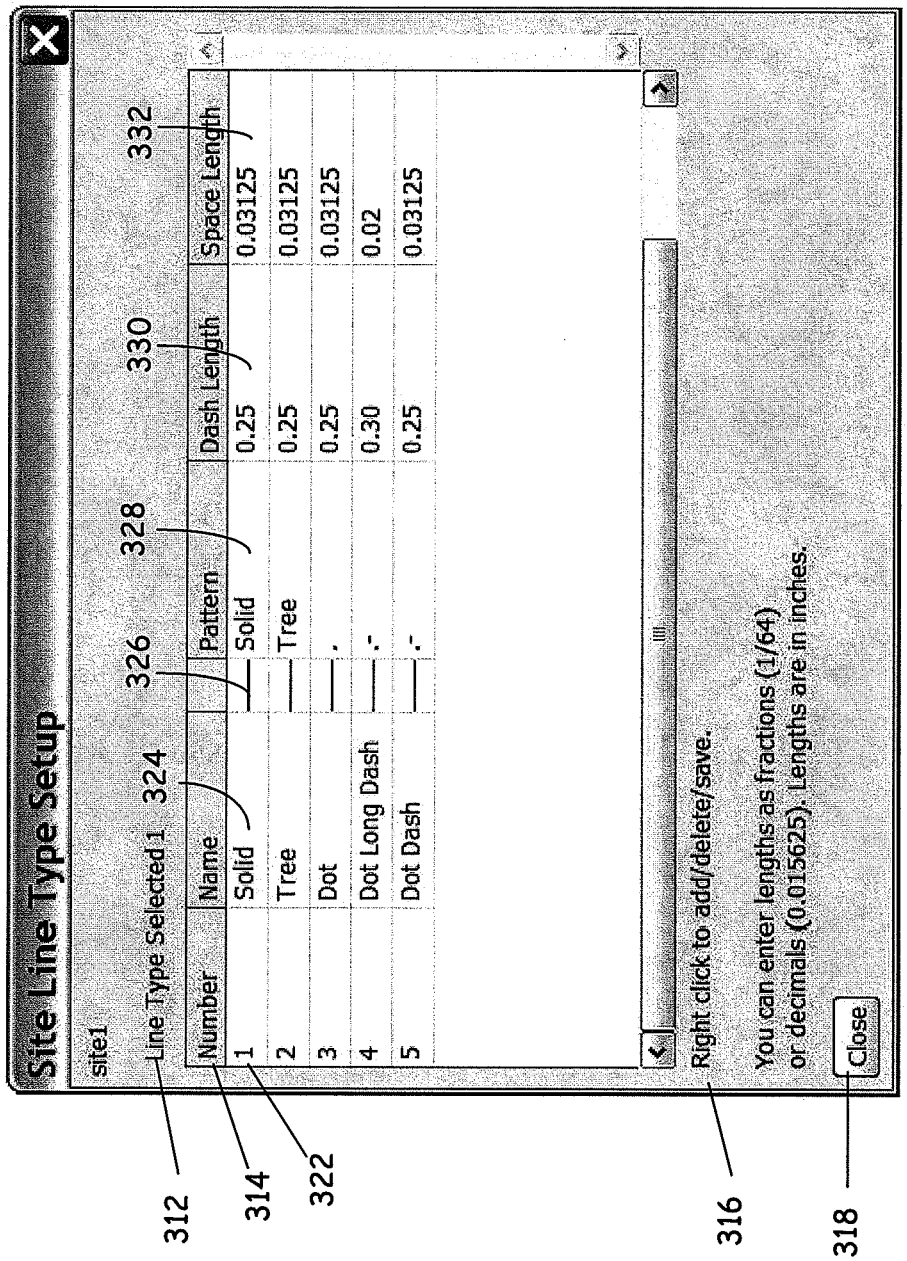
FIG. 29 is a screen shot of an example line type selection window of the land plan development tool shown in FIG. 1.

FIG. 29 is a screen shot of an example line type selection window 310. Line type selection window 310 includes line type selection descriptor 312, line type list 314, instruction prompt 316, and close button 318. In some embodiments, line type selection window 310 is displayed by land plan development tool 100 whenever a user desires to change a line type. The user indicates a desire to change line type, for example, by editing a layer or an element, then clicking on the Line Type button, after which line type selection window 310 is displayed.

In the illustrated embodiment, line type selection descriptor 312 displays the current line type that is selected. Line type list 314 includes a list of available line types, displayed in rows. Instruction prompt 316 provides the user with additional instructions regarding line type selection. In the illustrated embodiment, instructions state, "Right click to add/delete/save." Also in the illustrated embodiment, instructions further explain, "You can enter lengths as fractions (1/64) or decimals (0.015625). Lengths are in inches." Close button 318 is provided to close line type selection window 310 when completed.

In the illustrated embodiment, each row of line type list 314 includes an identification number 322, name 324, line style 326, pattern 328, dash length 330, and space length 332. Identification number 322 associates each line type with a number. This enables a line type to be quickly identified by the associated line number. Name 324 is a text-based identifier of the line type, which may be used to provide a brief description of the line type. In one embodiment, name 324 may be any combination of letters, numbers, or symbols. Line style 326 is a selection box that enables the user to define the visual appearance of the line. Examples of line styles include solid lines, and tree lines (e.g., a line composed of a series of arcuate line segments, used to simulate the irregular boundary that trees would create). Other embodiments will include other line styles. Pattern 328 describes the line pattern, such as solid or tree. Any other desired line pattern can be created with combinations of dots, dashes, and spaces, which repeat indefinitely. Dash length 330 defines the length of one line segment in fractions or decimals. Space length 332 defines the length of space between line segments in fractions or decimals.

Figure 30:
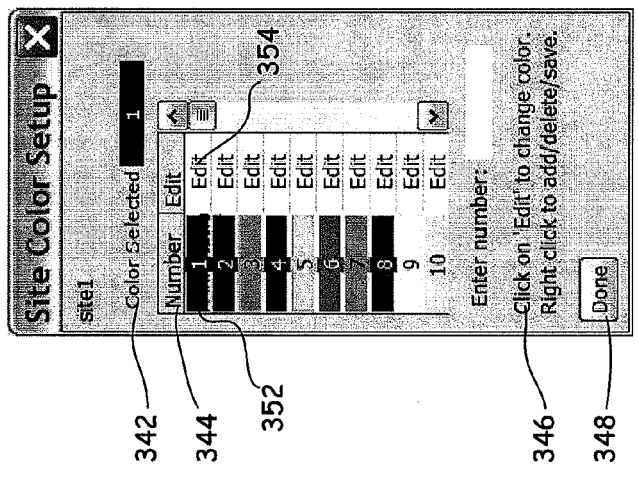
FIG. 30 is a screen shot of an example color setup window of the land plan development tool shown in FIG. 1.

FIG. 30 is a screen shot of an example color setup window 340. Color setup window 340 includes color selection descriptor 342, color list 344, instruction prompt 346, and Done button 348. In some embodiments, color setup window 340 is displayed by land plan development tool 100 when a color is to be changed. The user indicates a desire to change colors, for example, by selecting a change color button.

In the illustrated example, color selection descriptor 342 displays the current color selection. If the user selects a color from color list 344, the color selection prompt 342 changes to the color selected. Color list 344 includes a plurality of rows, each row including color sample and identification box 352 and edit button 354. Color sample and identification box 352 displays both a unique identification number for the associated color and a sample of the associated color. Edit button 354 can be selected by the user if the user wants to change the color or a color number.

In one embodiment, the identification number, such as displayed in color sample and identification box 352, provides the benefit of enabling a user to identify colors by the associated identification number. This enables the user to quickly locate a desired color, rather than requiring that the color be selected from a full color pallet each time the color is desired. In addition, it enables similar colors to be more easily identified and distinguished from each other.

In the illustrated embodiment, color setup window 340 also includes instruction prompt 346. Instruction prompt 346 presents instructions to the user on how to use color setup window 340. In the illustrated embodiment, instruction prompt 346 says "Click on 'Edit' to change color. Right click to add/delete/save."

Done button 348 is also provided in the illustrated embodiment to enable the user to close color setup window 340 when finished.

Figure 31:
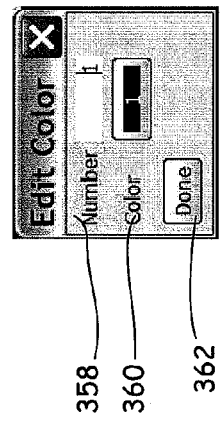
FIG. 31 is a screen shot of an example edit color window of the land plan development tool shown in FIG. 1.

FIG. 31 is a screen shot of an example edit color window 356. Edit color window 356 includes number selection 358, color selection 360, and done button 362. Edit color window 356 may be displayed, for example, after a user has selected edit button 354, such as shown in FIG. 21, to edit a selected color. In the illustrated embodiment, color selection window 356 enables the user to change the color number with number selection 358, such as by typing in the desired number. In addition, edit color window 356 enables the user to select a new color by choosing color selection 360, after which color selection window 363 is displayed (shown in FIG. 32). After editing is complete, the user selects done button 362 to finish editing the color.

Figure 32:
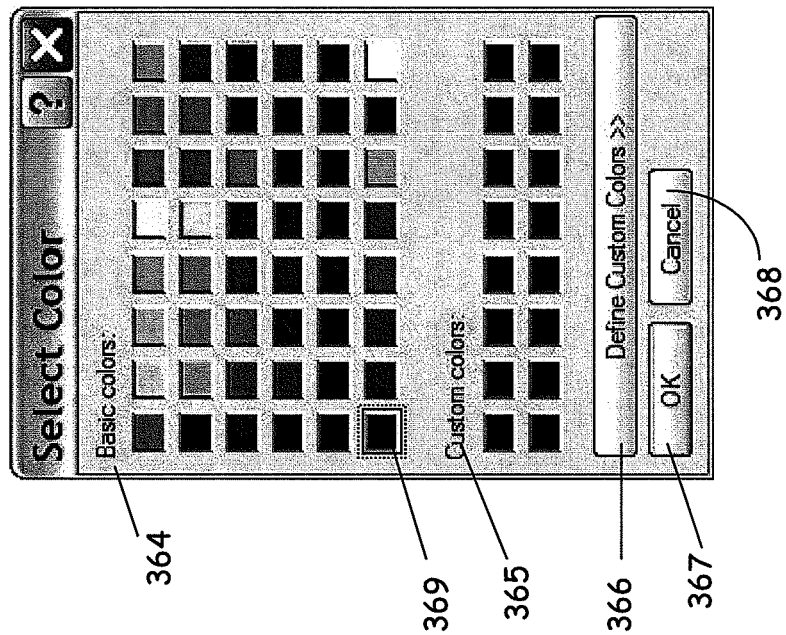
FIG. 32 is a screen shot of an example color selection window of the land plan development tool shown in FIG. 1.

FIG. 32 is a screen shot of an example color selection window 363. Color selection window 363 includes basic color selection 364, custom color selection 365, define custom colors button 366, OK button 367, and cancel button 368. Basic color selection 364 enables the user to select from a predefined pallet of basic colors, if desired. A variety of color selection buttons 369 are displayed, each button including a sample of the color. Alternatively, color selection window 363 also includes custom color selection 365, in which a variety of custom-defined colors are available for selection. If desired, custom color selection 365 can be modified by selecting define custom colors button 366. In this case a full color palette is made available for defining custom colors. The desired color is selected by clicking on the desired color selection button 369, and then clicking OK button 367. Alternatively, cancel button 368 may be selected to close color selection window 363 without making a change.

Figure 33:
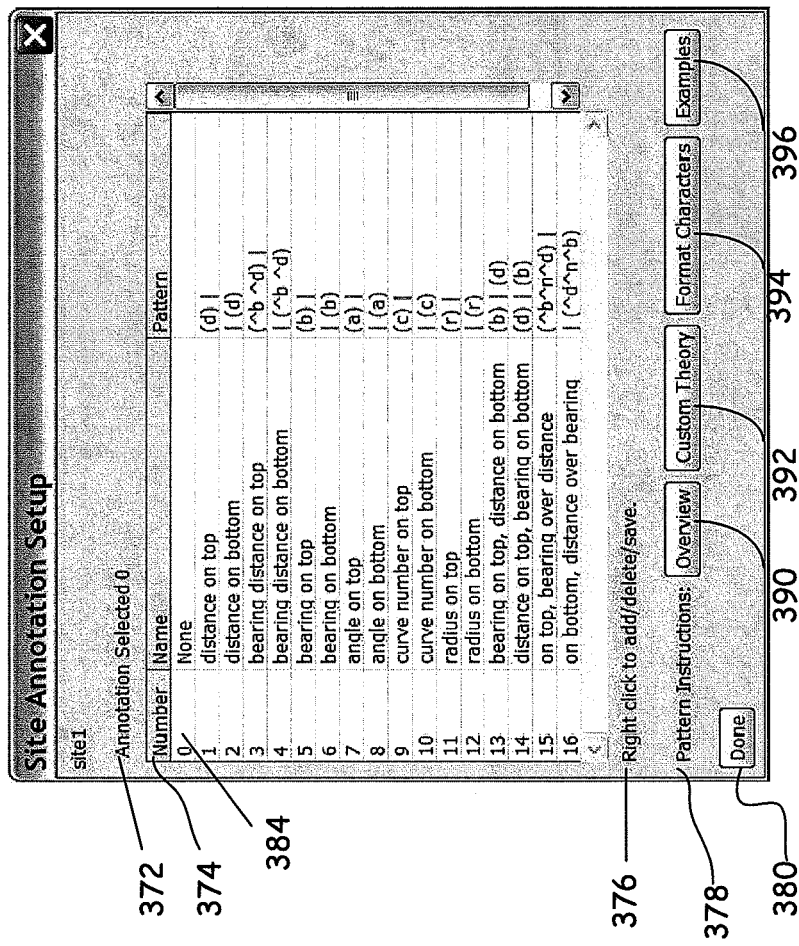
FIG. 33 is a screen shot of an example annotation setup window of the land plan development tool shown in FIG. 1.

FIG. 33 is a screen shot of example annotation setup window 370. Annotation setup window 370 includes annotation descriptor 372, annotation type list 374, instruction prompt 376, instruction buttons 378, and close button 380. In one embodiment, annotation setup window 370 is displayed by land plan development tool 100 whenever a user desires to select or modify an annotation style. For example, by selecting the "Annotation Style" button of the Layer Details window described herein. Annotations are, for example, text that appears above or adjacent to an element or feature of a land plan. For example, annotations may be provided to display dimensional information about an element. If an element changes location, orientation, or size, the annotation will dynamically update to display the correct information. This can save hours of work and eliminate potential mistakes as lot boundaries are adjusted.

Annotation setup window 370 is displayed, for example, when a user selects "Annotation Style" from the layer details or element details windows described herein.

In the illustrated embodiment, annotation setup descriptor 372 displays the current annotation selected. Annotation type list 374 displays a list of available annotation types, displayed in rows. Instruction prompt 376 displays instructions to the user, such as "right click to add/delete/save." Instruction buttons 378 are also provided to enable the user to learn more about annotation types and how to define custom annotation types. Close button 380 enables the user to close annotation setup window 370 when completed.

In the illustrated embodiment, each row of annotation type list 374 includes identification number 384, annotation name 386, and annotation pattern 388. Identification number 384 enables the annotation type to be identified by a number. Annotation name 386 is a text-based name used to identify an annotation type. In one embodiment, annotation name 386 may be any combination of letters, numbers, or symbols. Annotation pattern 388 is a code that identifies the desired annotation to be displayed. In one embodiment, annotation pattern 388 defines what information is to be displayed within the annotation as well as the relative location of the information within the annotation. Annotation pattern 388 is described in more detail below.

Instruction buttons 378 include overview button 390, custom theory button 392, format characters button 394, and examples button 396. Each of instruction buttons 378 is provided to assist the user in learning or reviewing how to define annotation styles. Overview button 390, once selected, displays a general overview of how to define an annotation style. Custom theory button 392, when selected, displays instructions on how to define a custom annotation style. Format characters button 384, when selected, displays a list of available characters used for formatting and annotation style. Examples button 396, when selected, displays a number of example annotation styles that can be defined.

Each annotation style includes an annotation pattern 388. The annotation pattern 388 is defined by a code. In the illustrated embodiment, the code is formed from a series of letters and symbols. The code defines both the type of information to be displayed within the annotation and the relative location of information. For example, a vertical bar ("|") symbol is used within the code to define whether the information should be displayed above or below the associated line in the land plan. A code that is placed before the vertical bar symbol will be displayed above the associated line. A code that is placed after the vertical bar symbol will be displayed below the associated line. Multiple pieces of information may be displayed either above or below the line by including multiple codes in parentheses. Multiple codes placed within parentheses will be displayed in the order in which they are listed.

Annotation pattern 388 may include format characters. Format characters, for example, are used to justify text along certain locations of a line or arc. For example, the less-than symbol ("<") is used to left justify text along a line, or to left justify text at the counter-clockwise end of an arc. The caret symbol ("^") is used to center text along a line or arc. The greater-than symbol (">") is used right justify text along the line, or to right justify text at the clockwise end of an arc. If the user desires to display the actual symbol, such as the less than symbol, the caret symbol, or the greater than symbol, the symbol is repeated. For example, to display an arrow formed of a dash and a greater than symbol ("->"), the greater than symbol is repeated ("->>"). If a format character is not included within an annotation pattern 388, the text is centered by default.

A set of predefined descriptor characters may be used to define an annotation pattern 388. For example, "b" is used to display a line bearing, such as "N 45°23'12\"E". "d" is used to display a distance along a line or an arc, such as 1245.13'. "c" is used to display a curve number or a bearing number, such as "C45" or "B12." "a" is used to display an angle (delta) of an arc, such as "A=145°34'12\"". "r" is used to display the radius of an arc, such as "R=784.14'." "n" is used to display a new line. For example, the code "^r^n^a" will display on a land plan as:

R=784.14'

A=145°34'12"

Figure 34:
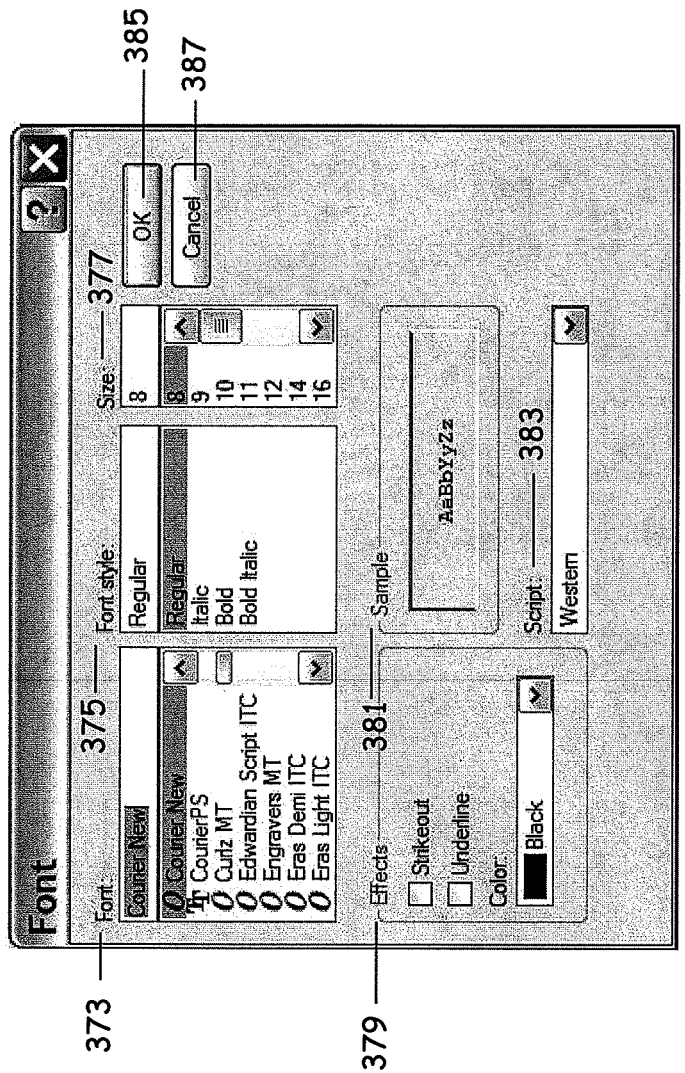
FIG. 34 is a screen shot of an example font selection window of the land plan development tool shown in FIG. 1.

FIG. 34 is a screen shot of an example font selection window including font selection 373, font style selection 375, font size selection 377, effects selection 379, sample 381, script selection 383, OK button 385, and Cancel button 387. Font selection 373 is a field in which the user can select the desired font. Any font installed on the system may be used, such as Courier New, Arial, Comic Sans, Times New Roman, and the like. Font style selection 375 enables the user to select the desired font style, such as regular, italic, bold, or bold italic. Font size selection 377 enables the user to select the desired font size. Effects selection 379 enables the user to select a desired effect, such as strikeout or underline, or to adjust the font color. In some embodiments the effects selection is ignored. Sample 381 displays a sample of the selected font, font style, font size, and effect. Script selection 383 enables the user to select a script type, such as Western. After the desired font has been configured, OK button 385 completes the font selection process. Alternatively, cancel button 387 can be selected to close font selection window 371 without making a change.

Figure 35:
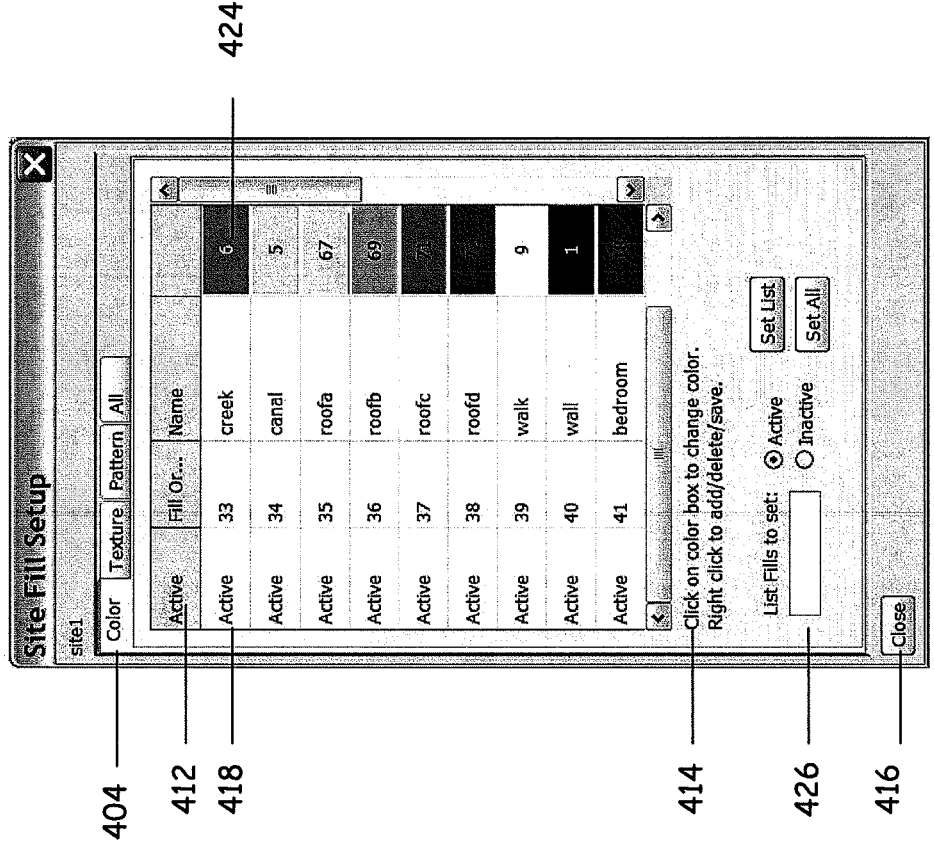
FIG. 35 is a screen shot of an example fill setup window of the land plan development tool shown in FIG. 1.

FIG. 35 is a screen shot of an example fill setup window 400. Fill setup window 400 includes fill setup prompt 402, color tab 404, texture tab 406, pattern tab 408, all tab 410, fill setup list 412, instruction prompt 414, and close button 416. In the illustrated embodiment, the color tab 404 has been selected. Fill setup window 400 enables a user to select a fill color, texture, or pattern. A fill can be applied to any closed region, such as defined by a series of connected lines and/or arcs wherein the beginning point of the first line is the same as the ending point of the last line.

In one embodiment, all closed regions are named. The name of each closed region is checked against all of the fill names for a partial match. Every time a partial match is found, the closed region is filled. A closed region named "Lot 25," for example, will match a fill name of "lot". In this example, matches are not case sensitive. As another example, a closed region named "Northeast Trail Loop" will match a fill named "trail" or a fill named "loop." The highest numbered fill which at least partially matches the closed region name is the fill that is used.

Instruction prompt 414 provides additional information on how to use fill setup window 400. In the illustrated example, instruction prompt 414 states, "click on color box to change color. Right click to add/delete/save." Close button 416 is provided to close fill setup window 400 when completed.

To set or adjust the color of a fill, the color tab 404 is selected as shown. Within color tab 404 is fill setup list 412, which includes a list of available fills, displayed in rows. Each row includes status display 418, fill order 420, fill name 422, and fill color 424. Status display 418 displays the current status of the respective fill, and enables the user to select whether a particular fill is active (e.g., drawn) or inactive (not drawn). The user can click on the status to edit the status, or use set fills section 426 described below. Fill order 420 enables the user to define a hierarchy of fills, such that fills having a lower fill order may be the covered or obscured by fills having a higher fill order. Fill name 422 is a text based identifier of the fill, such as composed of letters, numbers, and symbols. Fill color 424 includes a sample of the fill color as well as a numerical identifier of the color. If desired, fill color 424 can be selected to bring up color setup window 340, such as shown in FIG. 30, to select a new color. If a user desires to adjust the status of a fill (such as to toggle between active or inactive), set fills section 426 is provided to enable the user to make such status adjustments. To do so, the fill numbers are entered into the fill section, the desired status is selected, and then the Set List or Set All button is selected to assign the status to a set of fills or to all fills, as desired.

Figure 36:
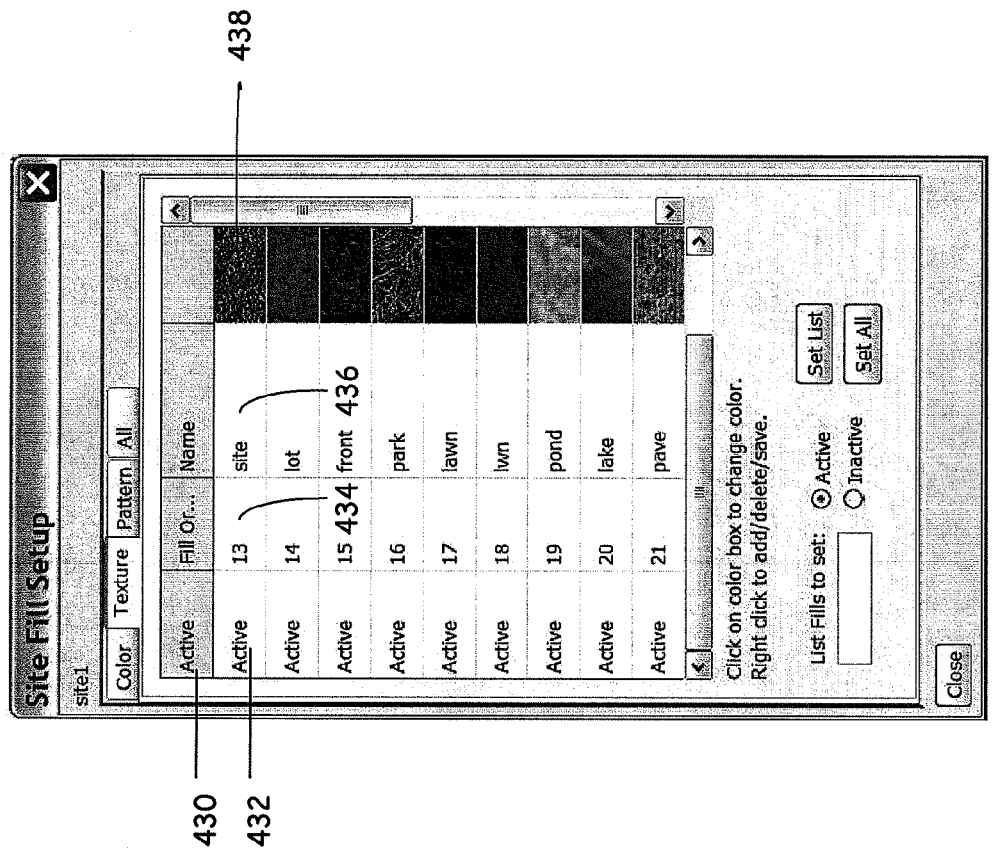
FIG. 36 is a screen shot of the fill setup window shown in FIG. 26 after the selection of a texture tab.

To set or adjust the texture of a fill, the texture tab 406 is selected as shown in FIG. 36. Texture tab 406 includes fill setup list 430. Fill setup list 430 includes a list of available texture fills, displayed in rows. Each texture fill includes status display 432, fill order 434, name 436, and sample texture 438. Status display 432 displays the current status of the respective texture fill, and enables the user to select whether a particular texture fill is active or inactive. Fill order 434 identifies the relative fill order. Name 436 is a text-based name of the texture fill, such as any combination of letters, numbers, or symbols. Sample texture 438 provides a small sample of the texture.

Figure 37:
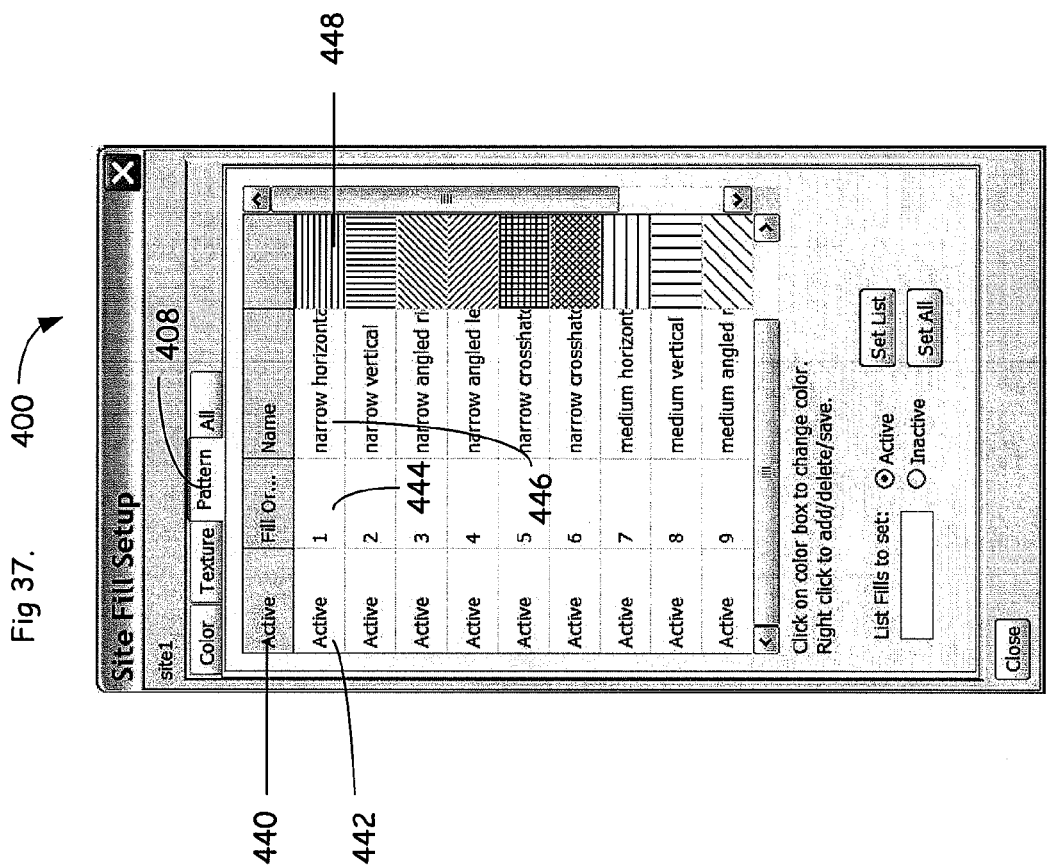
FIG. 37 is a screen shot of the fill setup window shown in FIG. 26 after the selection of a pattern tab.

To set or adjust the pattern of a fill, the pattern tab 408 is selected as shown in FIG. 37. Pattern tab 408 includes fill setup list 440. Fill setup list 440 includes a list of available fill patterns, displayed in rows. Each fill pattern includes status display 442, fill order 444, name 446, and sample pattern 448. Status display 442 displays the current status of the respective fill pattern, and enables the user to select whether a particular fill pattern is active or inactive. Fill order 444 identifies the relative fill order. Name 446 is a text-based name of the fill pattern, such as any combination of letters, numbers, or symbols. Sample pattern 448 displays a small sample of the pattern.

Figure 38:
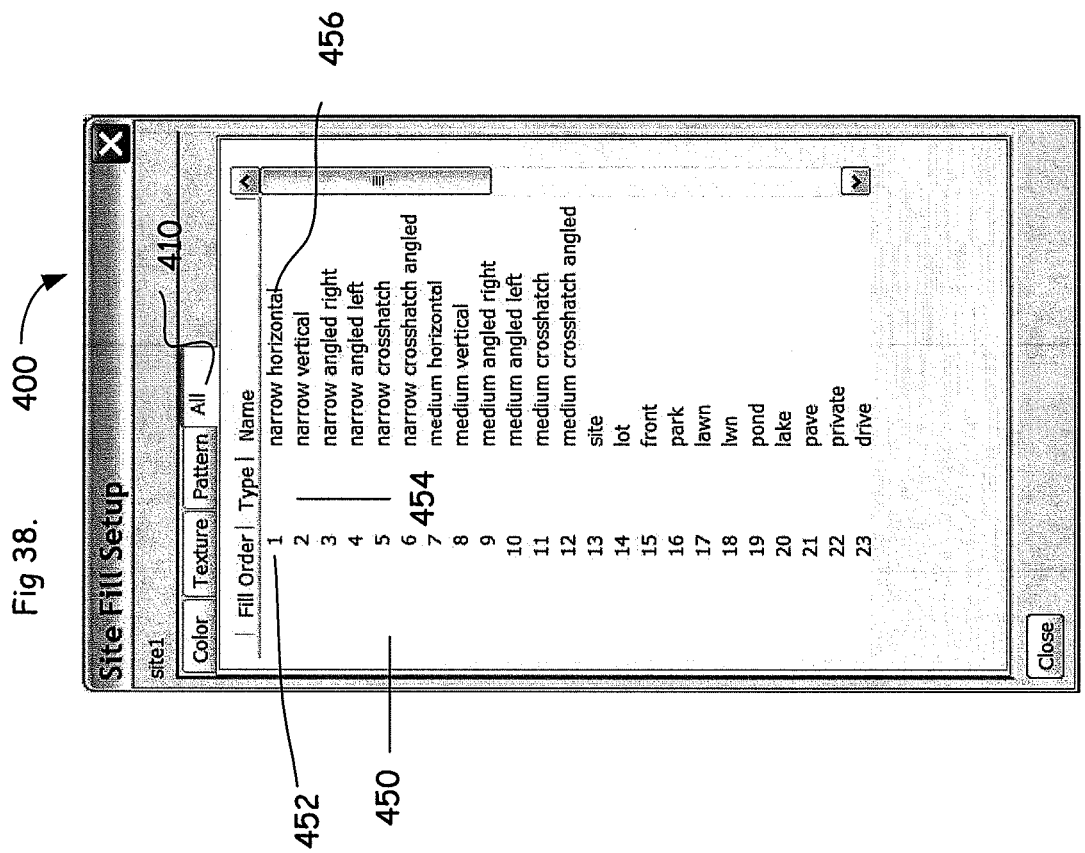
FIG. 38 is a screen shot of the fill setup window shown in FIG. 26 after the selection of an all tab.

To set or adjust the fill order, the all tab 410 is selected as shown in FIG. 38. All tab 410 includes complete fill list 450, which is a list of all color, texture, and pattern fills, displayed in rows. Each row includes fill order 452, fill type 454, and fill name 456. All tab 410 provides a convenient location for the user to view the relative order of all fills. As described herein, fill order 452 define the hierarchy of fills, such that those having a lower fill order may be obscured by those having a higher fill order. To adjust the fill order, any role can be selected and dragged, such as with the mouse, to a different location within complete fill list 450.

Figure 39:
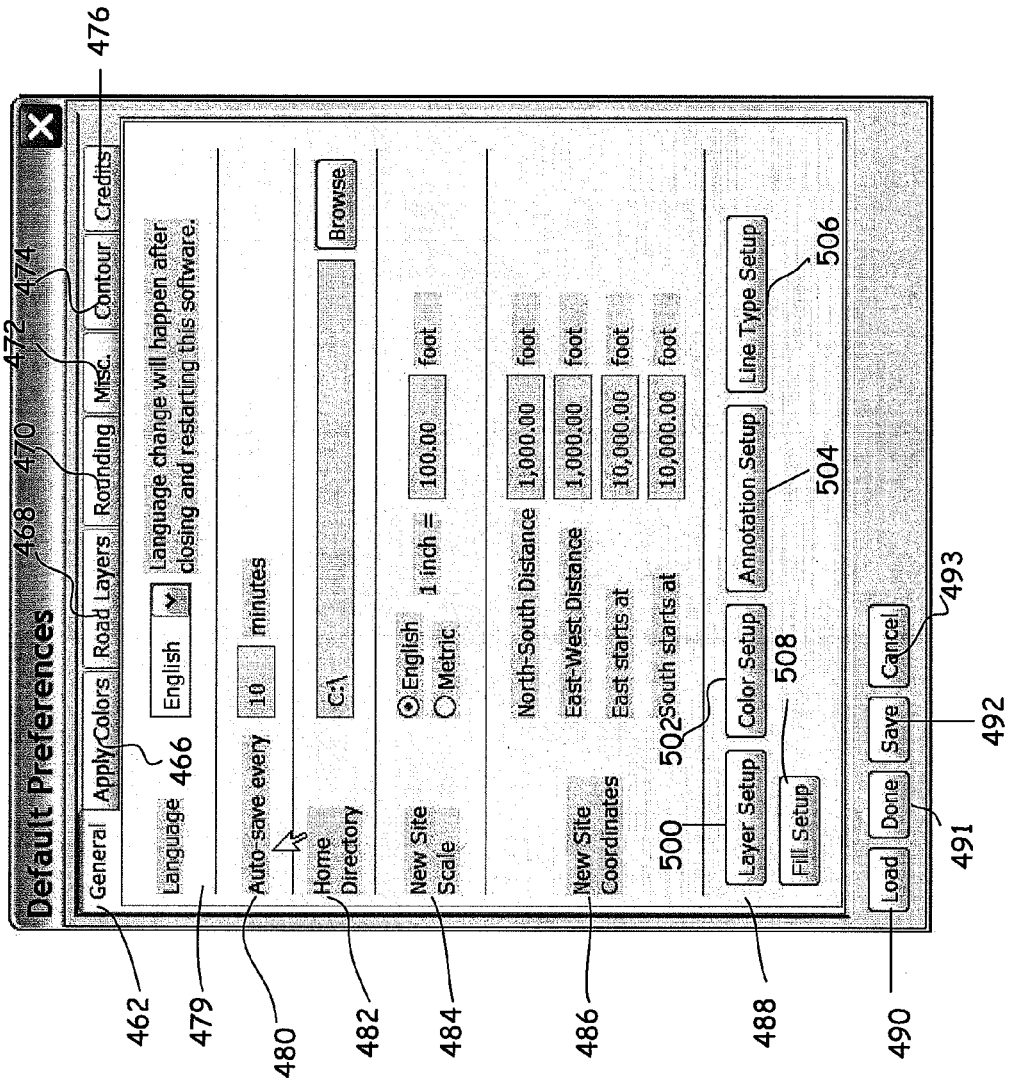
FIG. 39 is a screen shot of an example preferences window of the land plan development tool shown in FIG. 1.

FIG. 39 is a screen shot of an example preferences window 460. Preferences window 460 enables a user to define custom preferences for the operation of land plan development tool 100. A variety of preferences may be included. One example set of general preferences is illustrated. Preferences window 460 may be accessed, for example, by selecting "Edit" from menu bar 142, and selecting "Default Preferences."

Default preferences are the generic preferences that apply to all sites when they are first created. Site preferences are those preferences which apply to the current site, only. Each site has its own unique site preferences, which may simply be a copy of the default preferences. To distinguish between the two, some embodiments include the word "Default" in the title bar for Default Preferences, while the word "Site" is used in the title bar for Site Preferences.

Preferences window 460 includes multiple tabs, each tab including a set of preferences relating to the tab topic. In the illustrated embodiment, preferences window 460 includes general tab 462, apply colors tab 466, road layers tab 468, rounding tab 470, miscellaneous tab 472, contour tab 474, and credits tab 476. Load button 490, Done button 491, Save button 492, and Cancel button 493 are also provided within preferences window 460. To illustrate one example, the contents of general tab 462 are displayed. In addition to the discussion below, miscellaneous tab 472 allows the selection of miscellaneous settings and credits tab 476 displays biographical information, license terms, a disclaimer, copyright information, or any other desired information.

General tab 462 enables the selection of general preferences to define a custom configuration of land plan development tool 100. General tab 462 includes language selection 479, auto-save selection 480, home directory selection 482, new site scale 484, new site coordinates selection 486, and setup buttons 488. Language selection 479 allows the user to select the language the display of text within land plan development tool 100. Auto-save selection 480 enables the user to define a time delay between automatic backups of a land plan. Home directory selection 482 enables the user to define a default, or "home", directory. This directory is the default that will be presented, for example, when a user desires to open or save a land plan. New site scale 484 enables the user to define the default scale for a new site. In the illustrated example, the user may define whether the units should be in English or Metric, and the number of feet or meters to be associated with one inch or centimeter in the land plan. When Metric units are selected, the general tab 462, rounding tab 470, and contour tab 474 are automatically updated to reflect metric units. New site coordinates selection 486 enables the default coordinates of a land plan to be defined. For example, the coordinates can be defined by entering a value for: north-south distance, east-west distance, starting east coordinate, and starting south coordinate. In addition to the above preferences, various setup buttons 488 are provided to configure defaults. Setup buttons 488 include layer setup button 500, color setup button 502, annotation setup button 504, line type setup button 506, and fill setup button 508. After any of setup buttons 488 are selected the associated window is displayed as described and illustrated herein.

Figure 40:
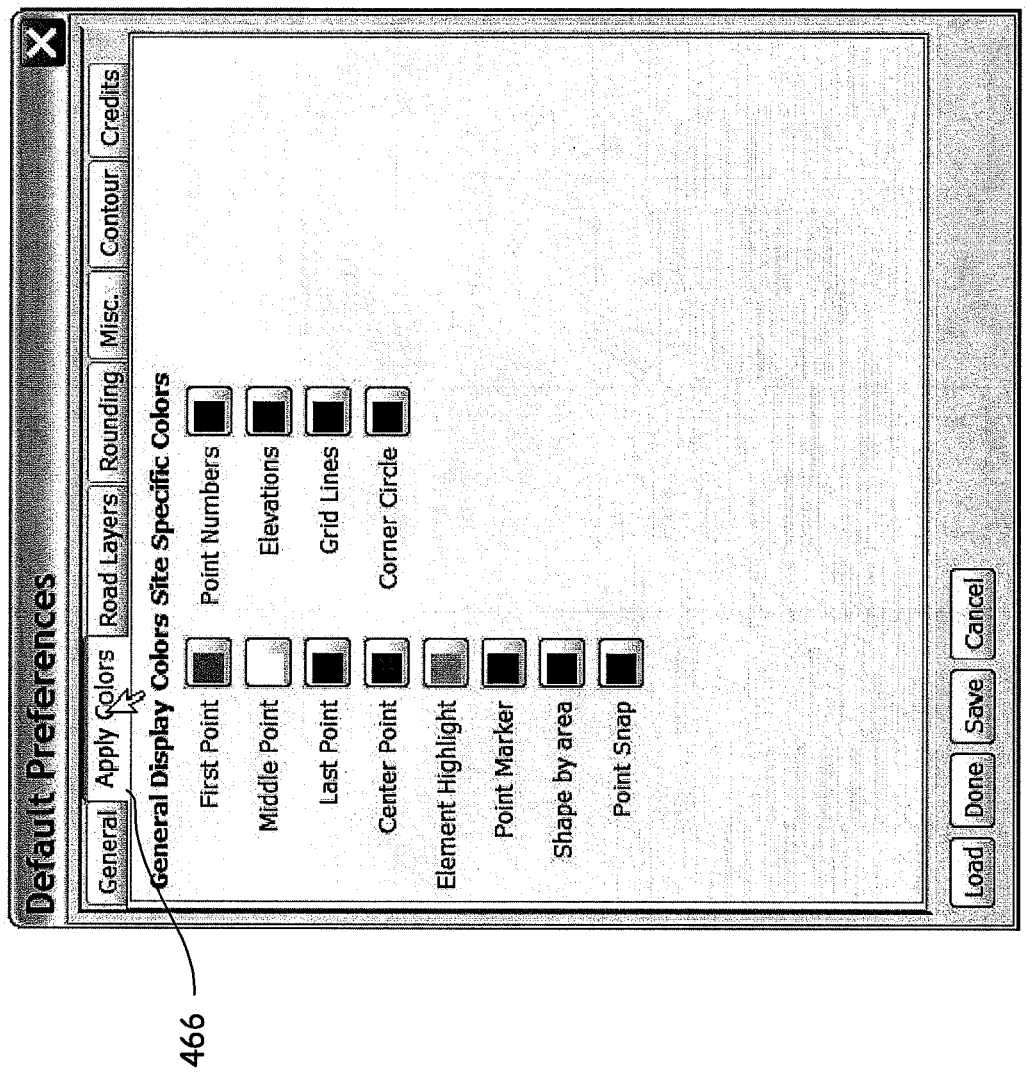
FIG. 40 is a screen shot of an example preferences window having the Apply Colors tab selected.

FIG. 40 is a screen shot of the example preferences window 460 having the Apply Colors tab 466 selected. The apply colors tab 466 includes buttons that allow the user to select what colors will be used to draw features of a land plan. In the default settings, the left column includes general display colors. General display colors are displayed but do not affect anything on the site that is printed. These colors adjust the colors for point number arrows, and associated text identifiers, for example. The right column includes default site specific colors.

Figure 41:
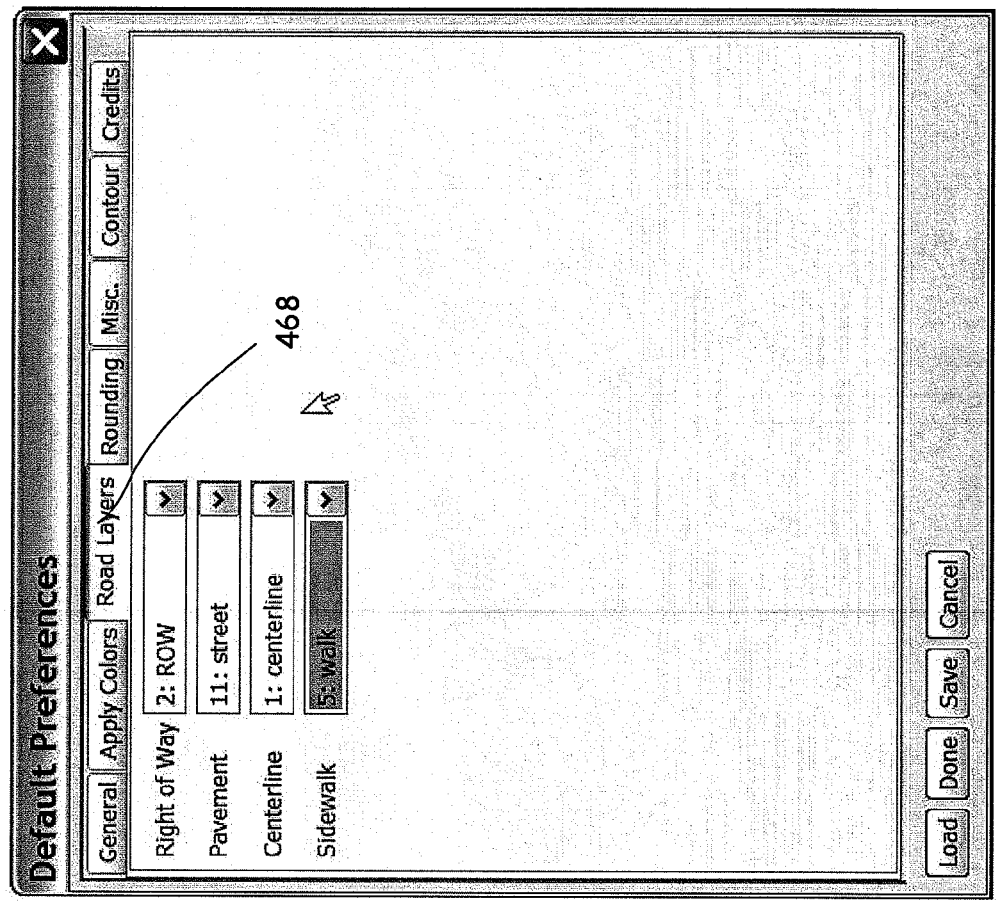
FIG. 41 is a screen shot of the example preferences window shown in FIG. 40 having the road layers tab selected.

FIG. 41 is a screen shot of the example preferences window 460 having the Road Layers tab 468 selected. The Road Layers tab 468 includes options for setting which layers are associated with the common features of roads, such as the right of way, pavement, centerline, and sidewalk. These layers are used when making streets in a land plan.

Figure 42:
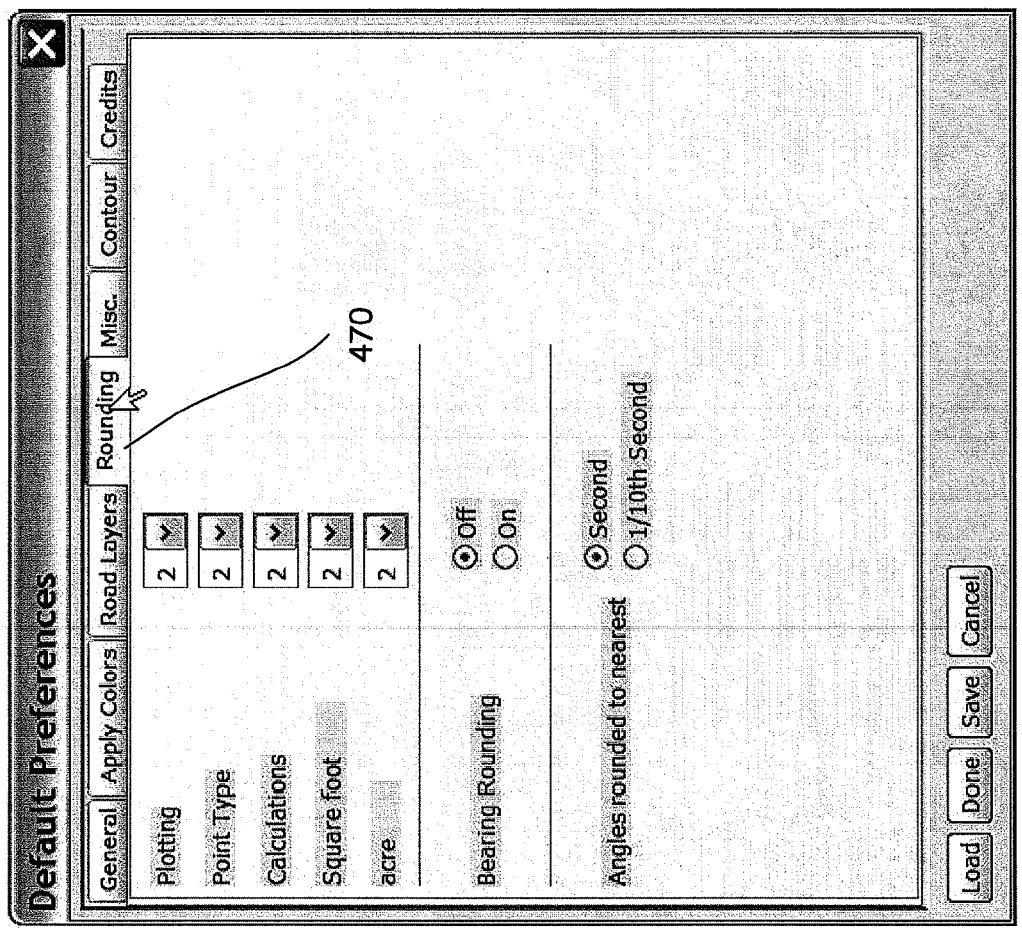
FIG. 42 is a screen shot of the example preference window shown in FIG. 40 having the Rounding tab selected.

FIG. 42 is a screen shot of the example preferences window 460 having the Rounding tab 470 selected. Rounding tab 470 includes options for setting the number of decimal points that are displayed, such as in the info area and in reports. In this example, the available options are integers between zero and six, although other embodiments include other ranges.

Figure 43:
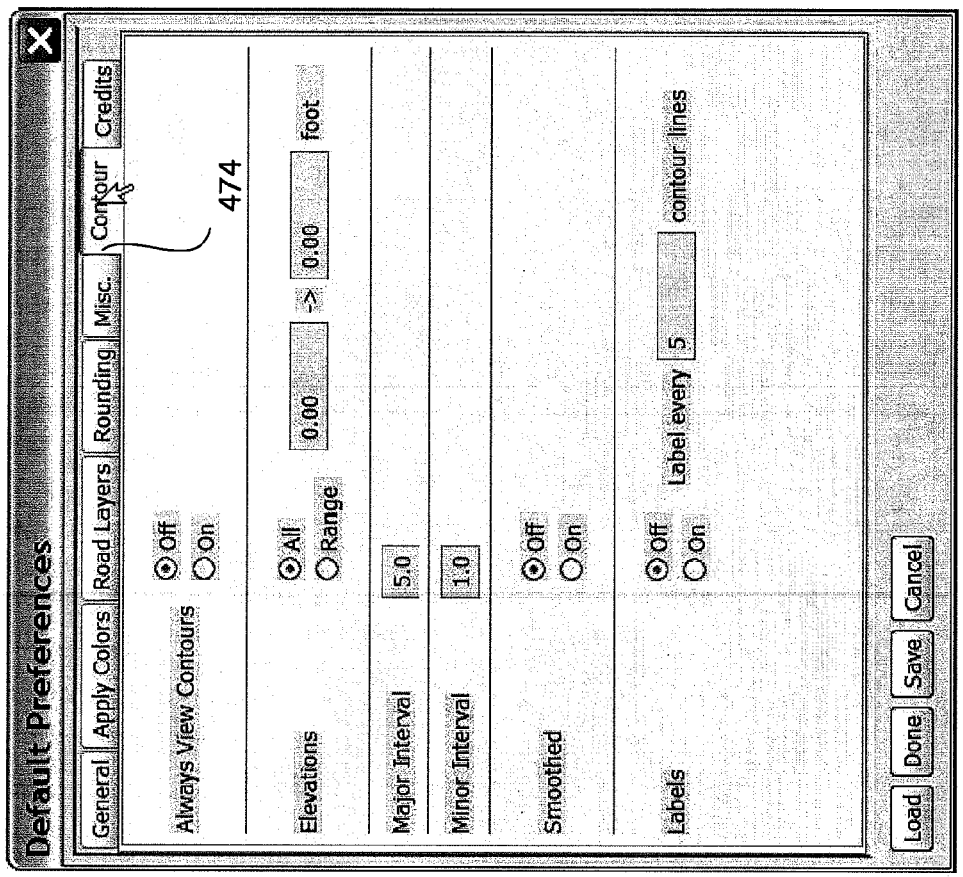
FIG. 43 is a screen shot of the example preferences window shown in FIG. 40 having the Contour tab selected.

FIG. 43 is a screen shot of the example preferences window 460 having the Contour tab 474 selected. Contour tab 474 includes options for setting how contours are displayed, as shown.

In addition to the above-described default preferences, similar options are customizable for Site-specific preferences. In some embodiments, site-specific preferences include fewer options than the default preferences described above.

Figure 44:
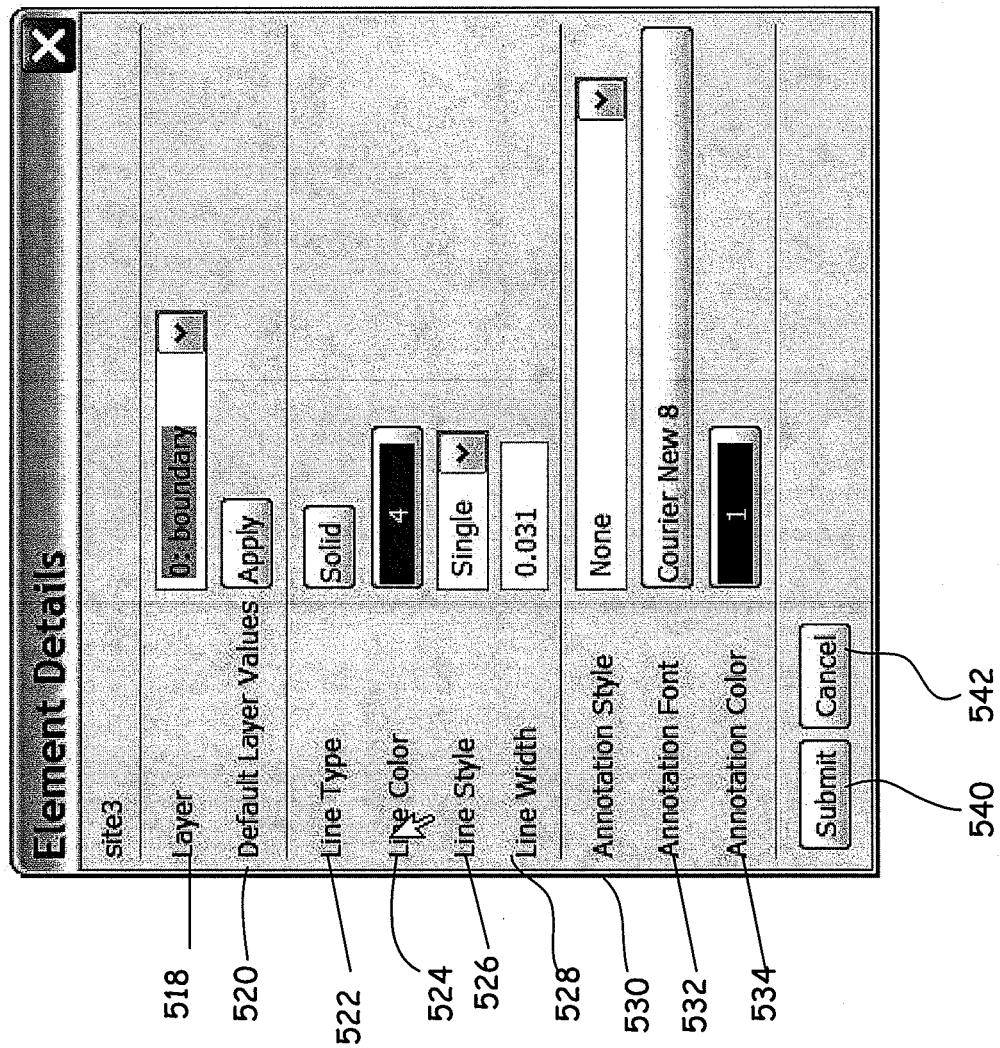
FIG. 44 is a screen shot of an example element details window.

FIG. 44 is a screen shot of an example element details window 516. Element details window 516 enables a user to edit various details of an element (such as a line, arc, or polyline). In one embodiment, element details window 516 is displayed when a user right clicks on the desired element. Element details window 516 includes layer options, line options, and annotation options. Layer options include layer selection 518, and default layer values button 520. Changing the layer automatically applies all of the defaults associated with that layer. Default layer values button 520 also allows the user to reset the element to the default values. Line options include line type 522, line color 524, line style 526, and line width 528. Annotation options include annotation style 530, annotation font 532, and annotation color 534. After the desired options have been selected and configured, submit button 540 is selected to make the desired changes. Alternatively cancel button 542 is selected to exit element details window 516 without making the desired changes.

Figure 45:
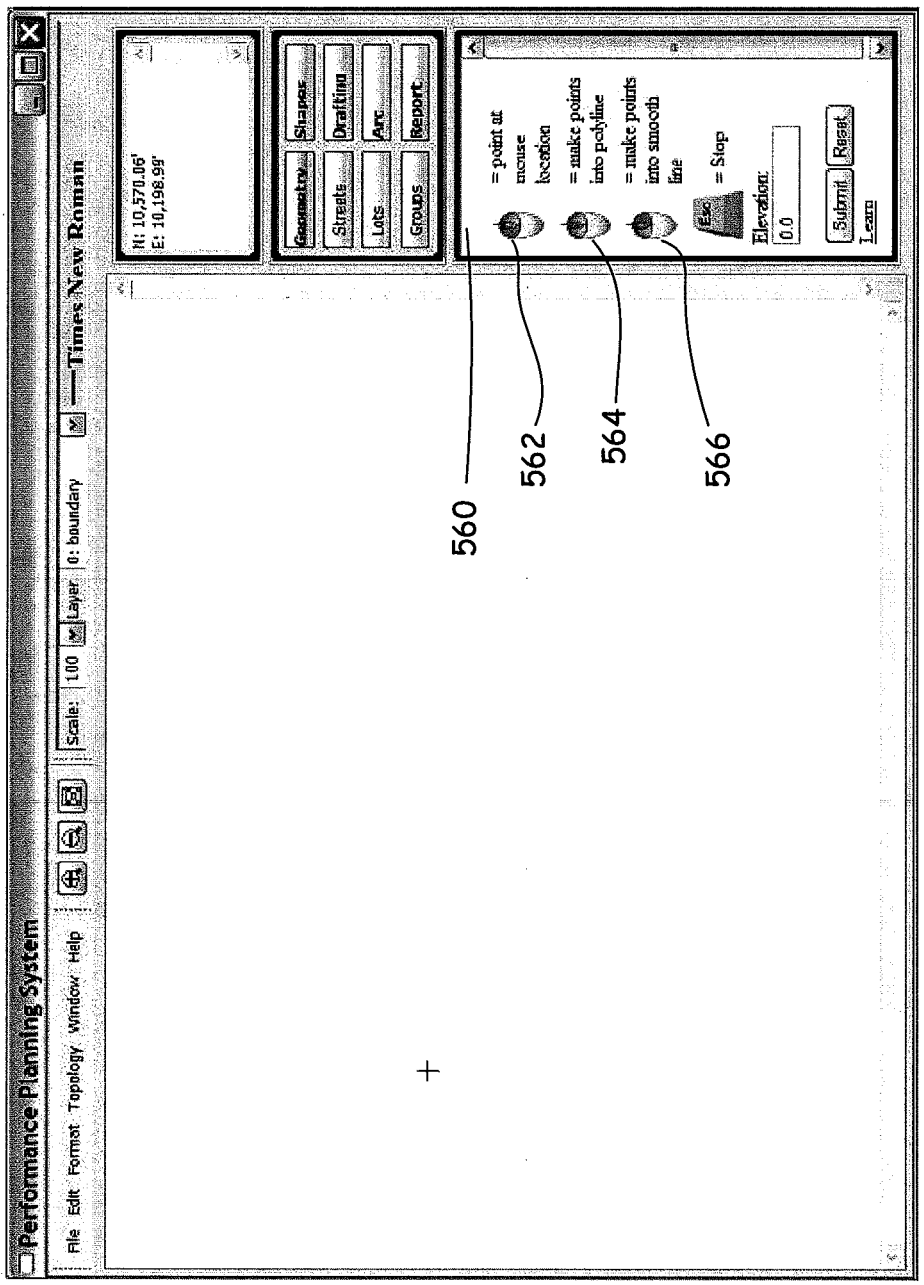
FIG. 45 is a screen shot of the example user interface shown in FIG. 3 after the selection of a digitize tool.

FIG. 45 is a screen shot of example user interface 140 after the selection of a digitize tool (e.g., digitize tool 200 shown in FIG. 5). As described herein, the digitize tool enables a user to define a point in a land plan. Guide window 156 displays instructions 560 to the user. In this example, instructions 560 include visual instructions 562, 564, and 566 that display to the user all of the available options for digitizing an element. Visual instruction 562 includes a graphical display of a three-button mouse with the left mouse button filled in. Visual instruction 562 also includes text explaining that pressing the left mouse button will define a point at the mouse location. Visual instruction 564 includes a graphical display of a three-button mouse with a center mouse button filled in. Visual instruction 564 also includes text explaining that pressing the center mouse button will define a line to the mouse location. Visual instruction 566 includes a graphical display of a three-button mouse with a right mouse button filled in. Visual instruction 566 also includes text explaining that pressing the right mouse button will define a smooth line to the mouse location. Text is also provided to instruct the user to press the escape key to stop digitizing. A desired elevation and description can also be entered.

Figure 46:
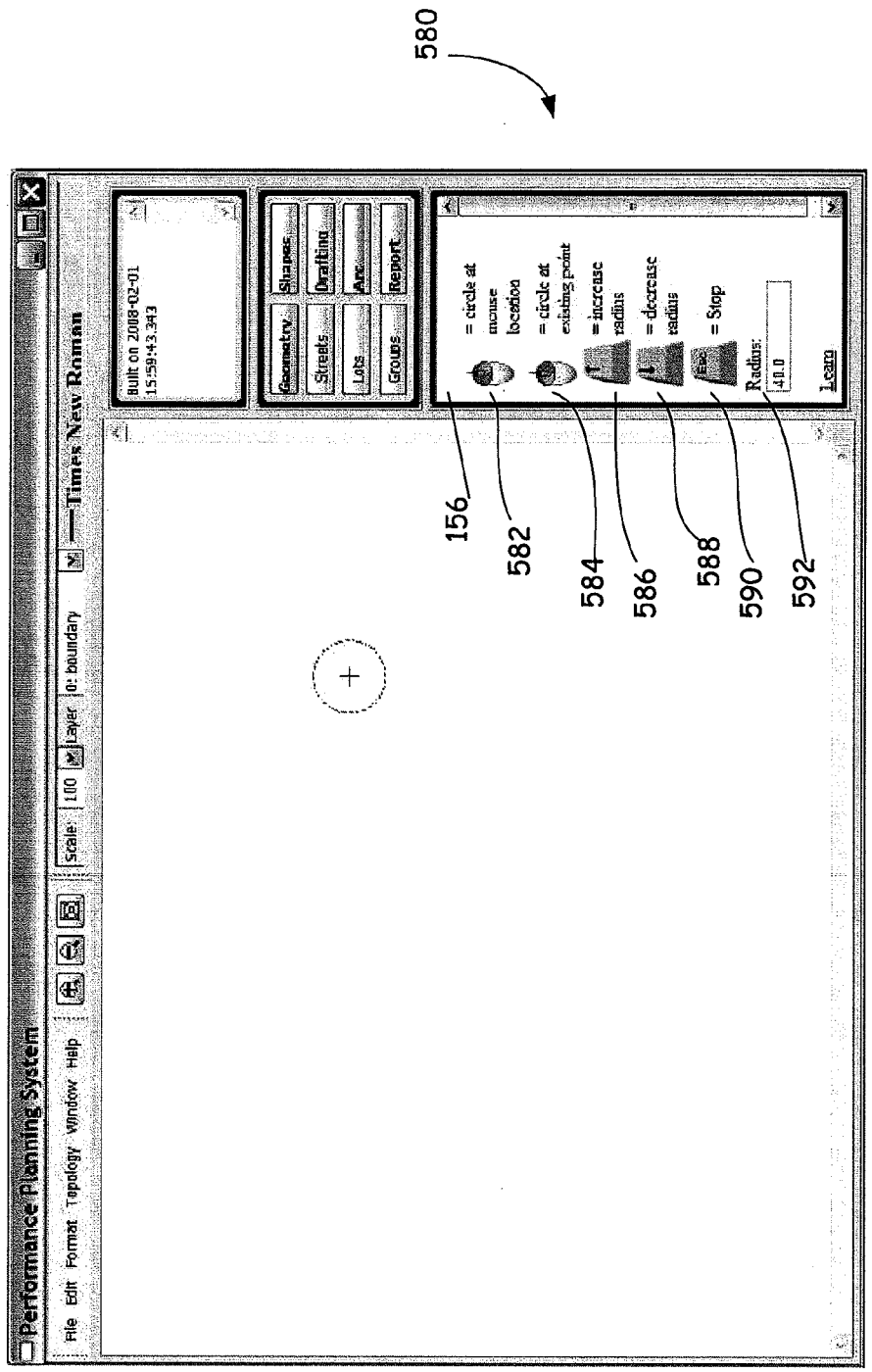
FIG. 46 is a screen shot of the example user interface shown in FIG. 3 after the selection of a circle tool.

FIG. 46 is a screen shot of example user interface 140 after the selection of a circle tool (e.g., circle tool 217, shown in FIG. 10). In one example, the guide window 156 first prompts the user for a desired radius of the circle after the circle tool has been selected. Once the radius is entered (e.g., 40), the user interface shown in FIG. 46 is displayed. User interface 140 includes guide window 156 in which instructions 580 are displayed. In this example, instructions 580 include visual instructions 582, 584, 586, 588, 590, and 592. More specifically, visual instructions 582 and 584 graphically display instructions for providing input with a mouse, and visual instructions 586, 588, and 590 graphically display instructions for proving input with a keyboard. For example, visual instruction 582 instructs the user to define a circle at the mouse location by selecting the left mouse button. Visual instruction 584 instructs the user to define a circle at an existing point by selecting the right mouse button. Visual instruction 586 instructs the user to increase the radius of the circle by selecting the up arrow on the keyboard. Visual instruction 588 instructs the user to decrease the radius of the circle by selecting the down arrow on the keyboard. Visual instruction 590 instructs the user to press the escape key when completed. The radius of the circle can be modified by changing the value entered into text field 592.

Figure 47:
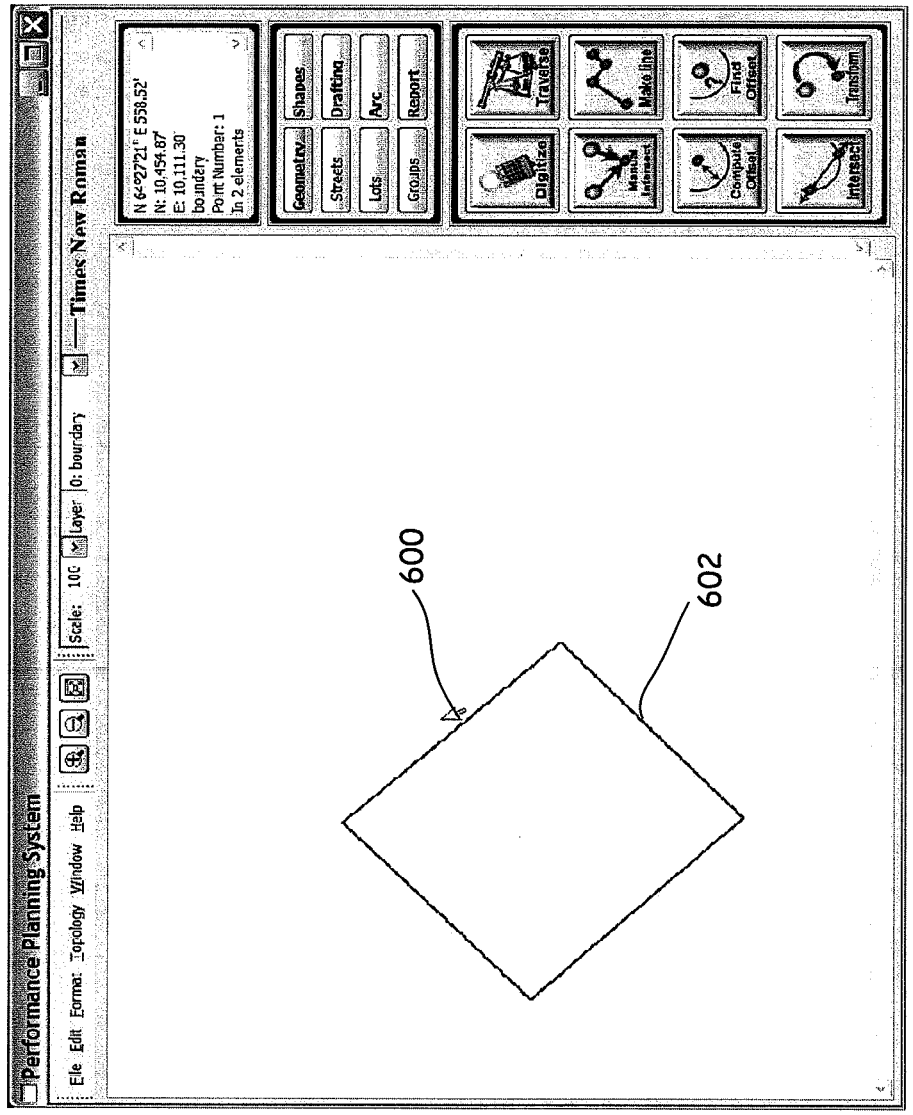
FIG. 47 is screen shot of the example user interface shown in FIG. 3 including an arrow cursor.

FIGS. 47-51 illustrate various cursors that are used in some embodiments of land plan development tool 100. FIG. 47 is a screen shot of example user interface 140 including an arrow cursor 600. Arrow cursor 600 is used to select an element, such as a line, polyline, or arc. In this example, arrow cursor 600 is used to select a line or polyline 602.

Figure 48:
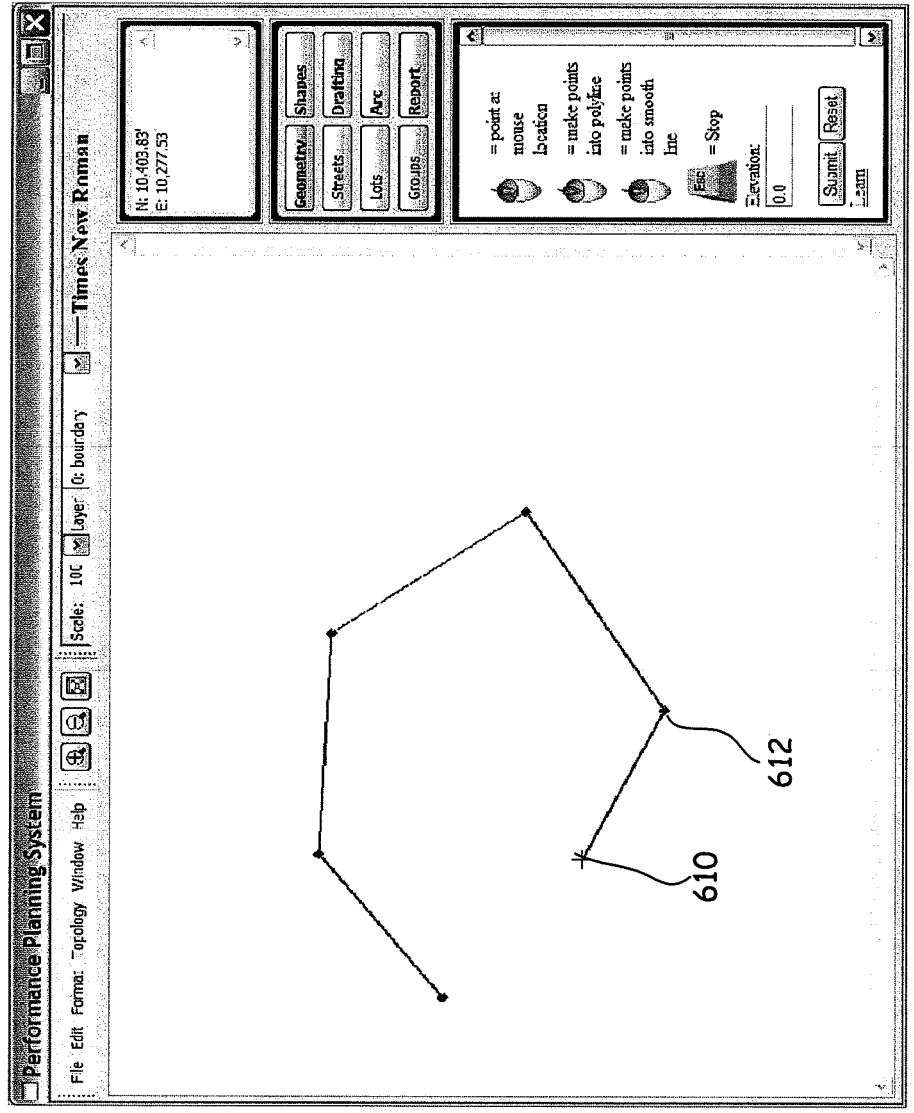
FIG. 48 is a screen shot of the example user interface shown in FIG. 3 including a cross hair cursor.

FIG. 48 is a screen shot of example user interface 140 including a cross hair cursor 610. Cross hair cursor 610 is used for selecting points, such as for defining an element extending between certain points, as shown.

Figure 49:
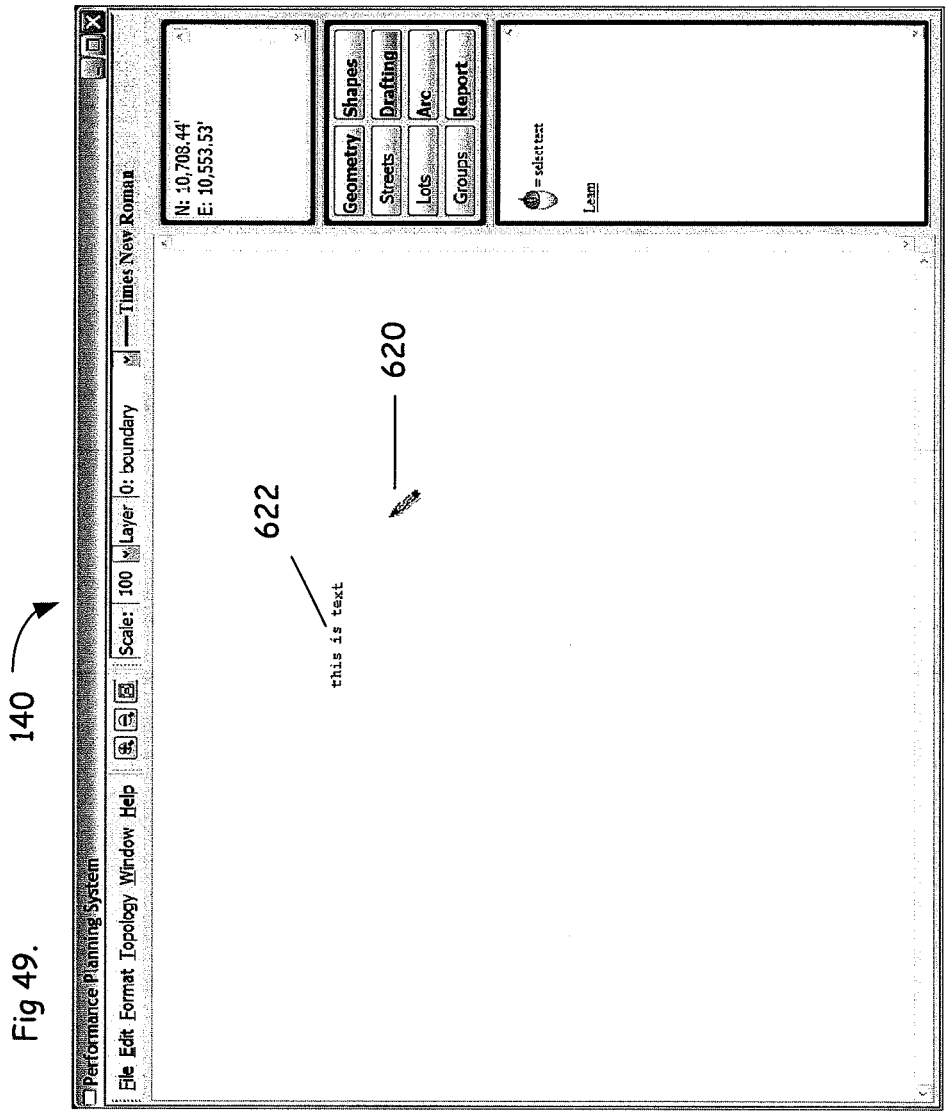
FIG. 49 is a screen shot of the example user interface shown in FIG. 3 including a pencil cursor.

FIG. 49 is a screen shot of example user interface 140 including a pencil cursor 620. Pencil cursor 620 is used to select and move text, such as text 622.

Figure 50:
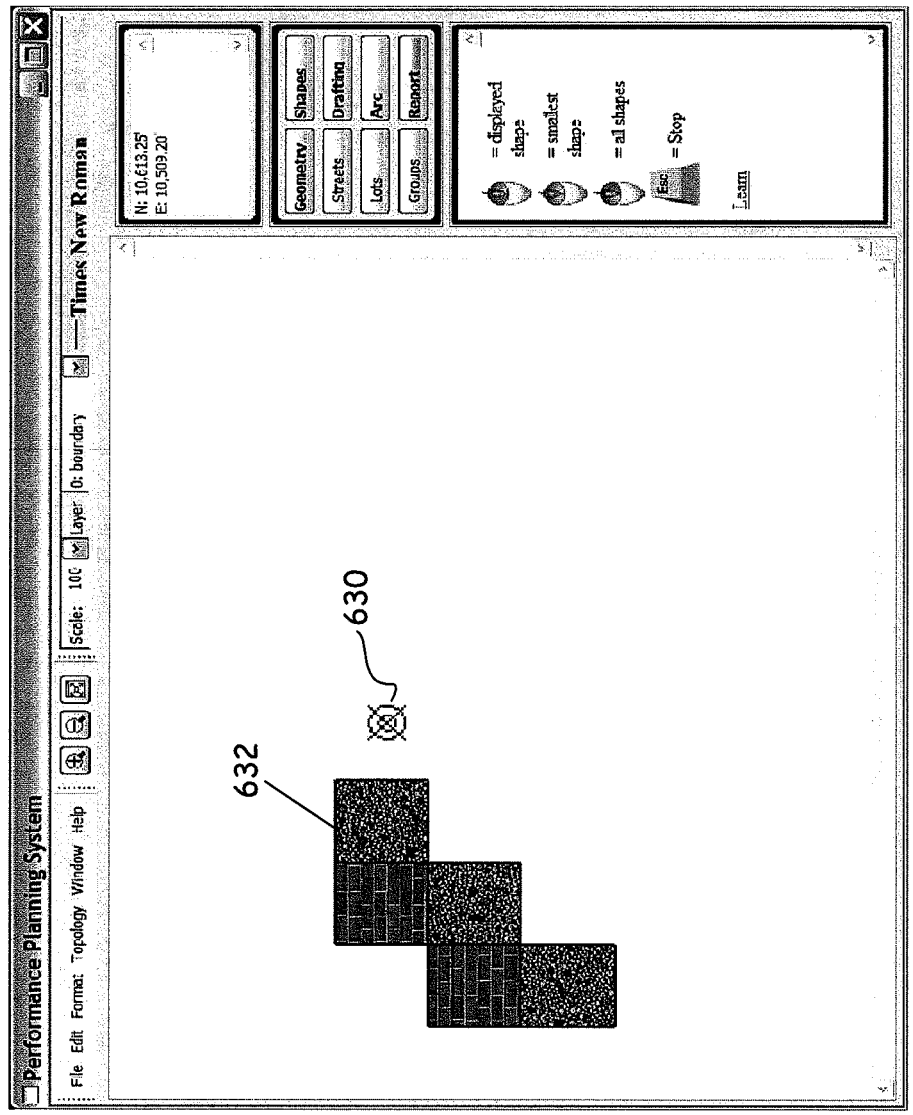
FIG. 50 is a screen shot of the example user interface shown in FIG. 3 including a target circle cursor.

FIG. 50 is a screen shot of example user interface 140 including a target circle cursor 630. Target circle cursor 630 is used for selecting shapes, such as shape 632.

Figure 51:
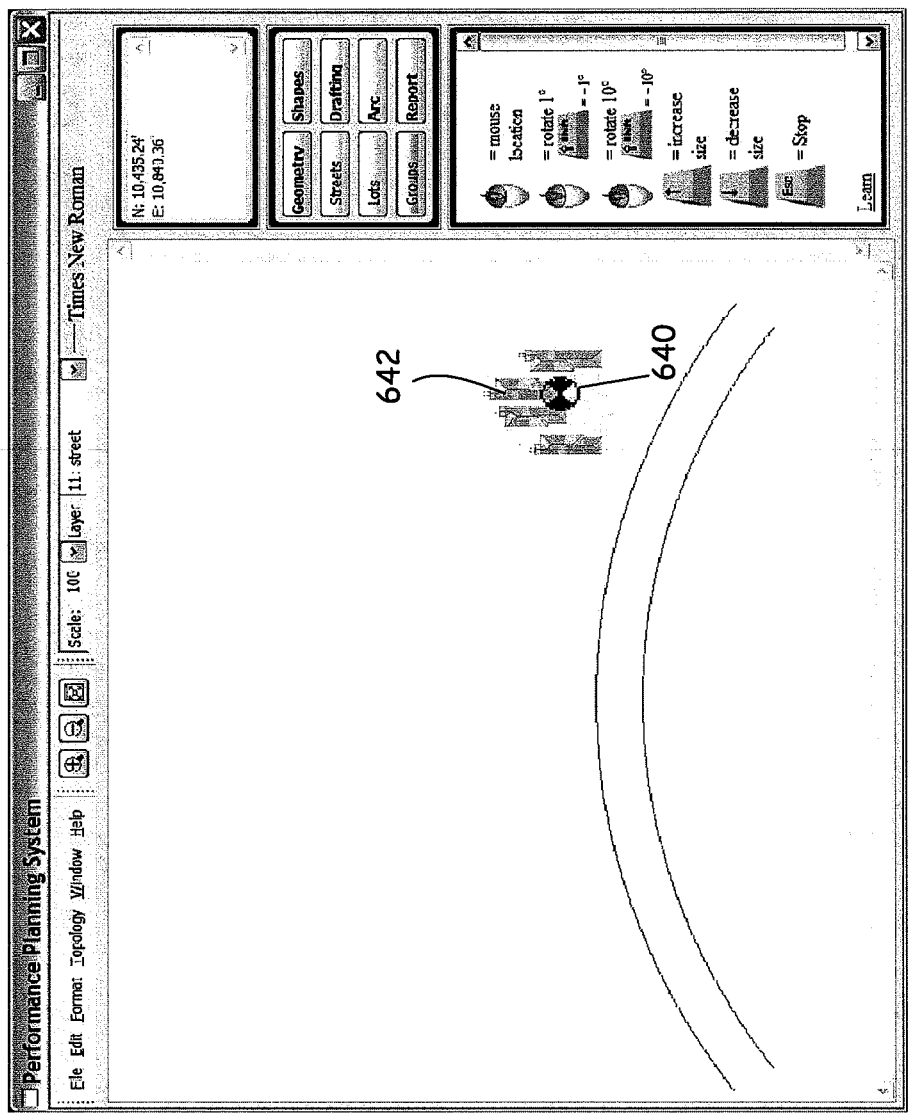
FIG. 51 is a screen shot of the example user interface shown in FIG. 3 including a quartered circle cursor.

FIG. 51 is a screen shot of example user interface 140 including a quartered circle cursor 640. Quartered circle cursor 640 is used for moving and selecting groups, such as group 642.

Figure 52:
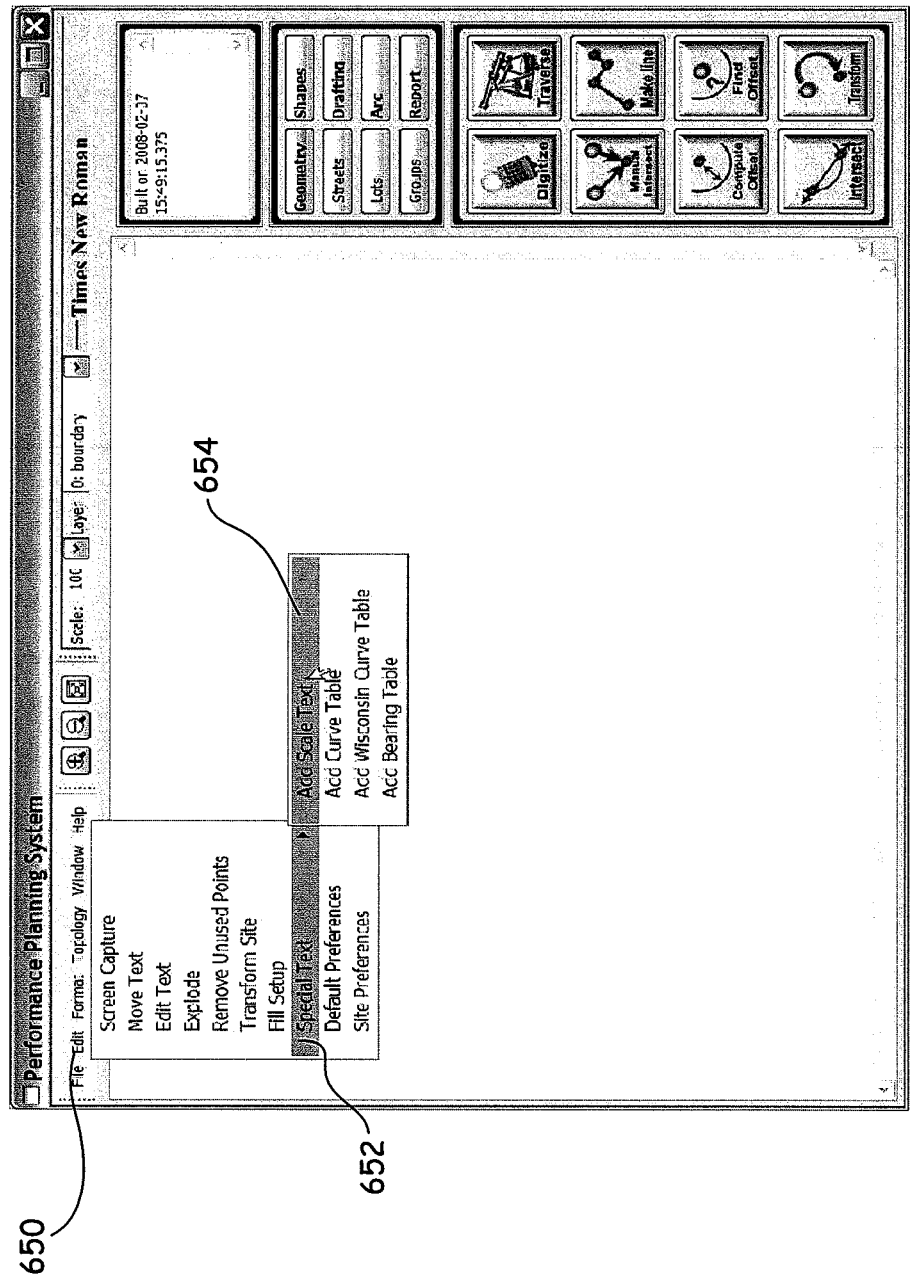
FIG. 52 is a screen shot of the example user interface shown in FIG. 3 illustrating an add scale text option.
Figure 53:
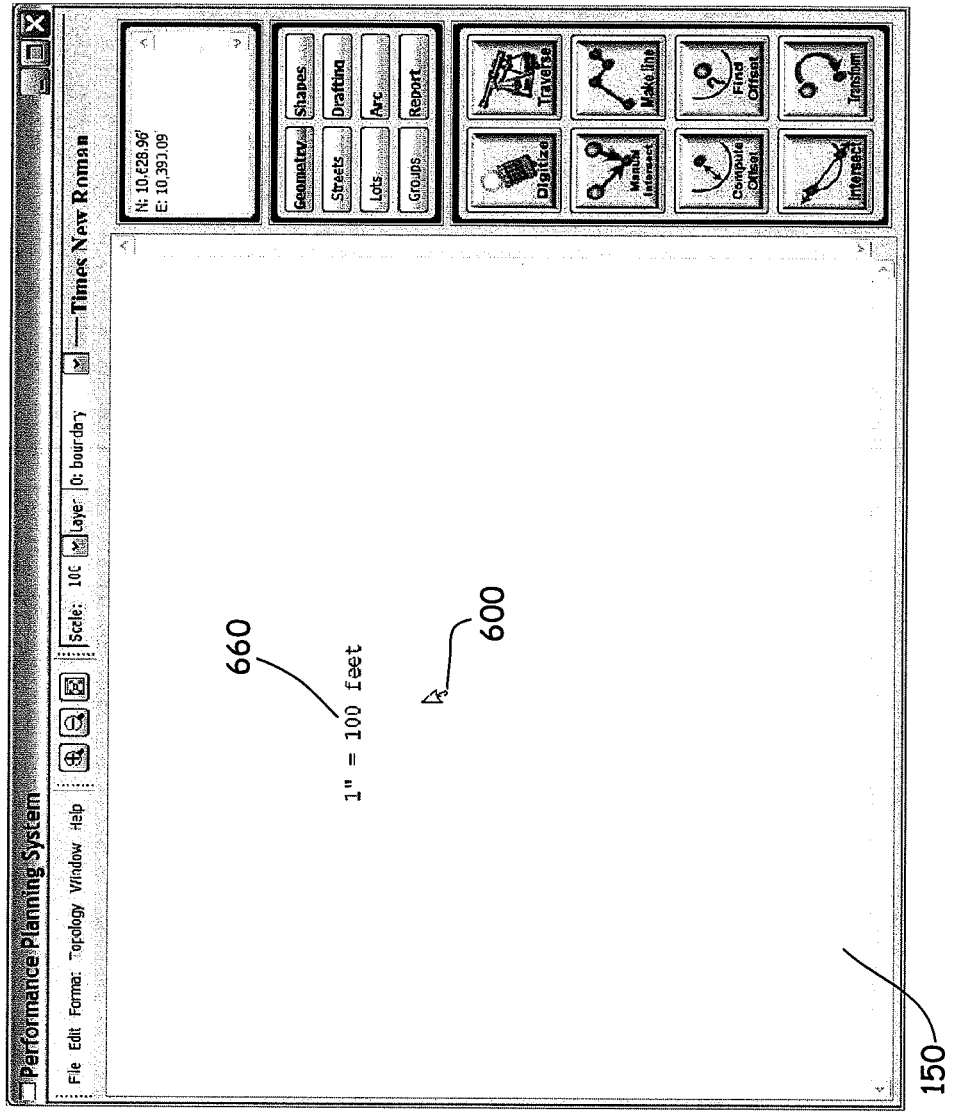
FIG. 53 is a screen shot of the example user interface shown in FIG. 3 after the selection of the scale text option.
Figure 54:
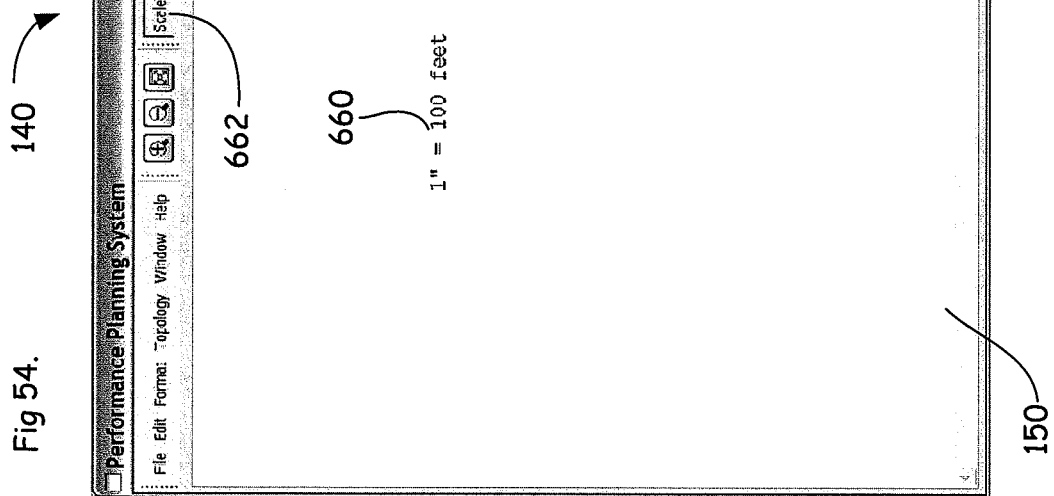
FIG. 54 is a screen shot of the example user interface shown in FIG. 3 after the insertion of scale text label.

FIGS. 52-54 illustrate an example of a scale text feature according to some embodiments of the present disclosure. FIG. 52 is a screen shot of example user interface 140 illustrating the selection of an add scale text option 654. User interface 140 includes an edit menu 640 including a special text option 652, and an add scale text option 654. To select the add scale text option, the user first selects edit menu 640, then selects text option 652, and then selects add scale text option 654, as shown.

FIG. 53 is a screen shot of example user interface 140 after the selection of scale text option 654. Upon selection of scale text option 654, the scale text label 660 is inserted into planning window 150.

FIG. 54 is a screen shot of example user interface 140 after the insertion of scale text label 660 into planning window 150. Scale text label 660 automatically adjusts whenever the scale of a land plan is modified. For example, if the scale is originally set at 1"=100 feet (as shown in FIG. 53, that scale is displayed by scale text label 660. If the user subsequently changes the scale, such as by selecting scale menu 662, and changing the scale to 1"=40 feet (as shown in FIG. 54), the scale text label 660 automatically updates the scale in the land plan, as shown in FIG. 55.

Figure 55:
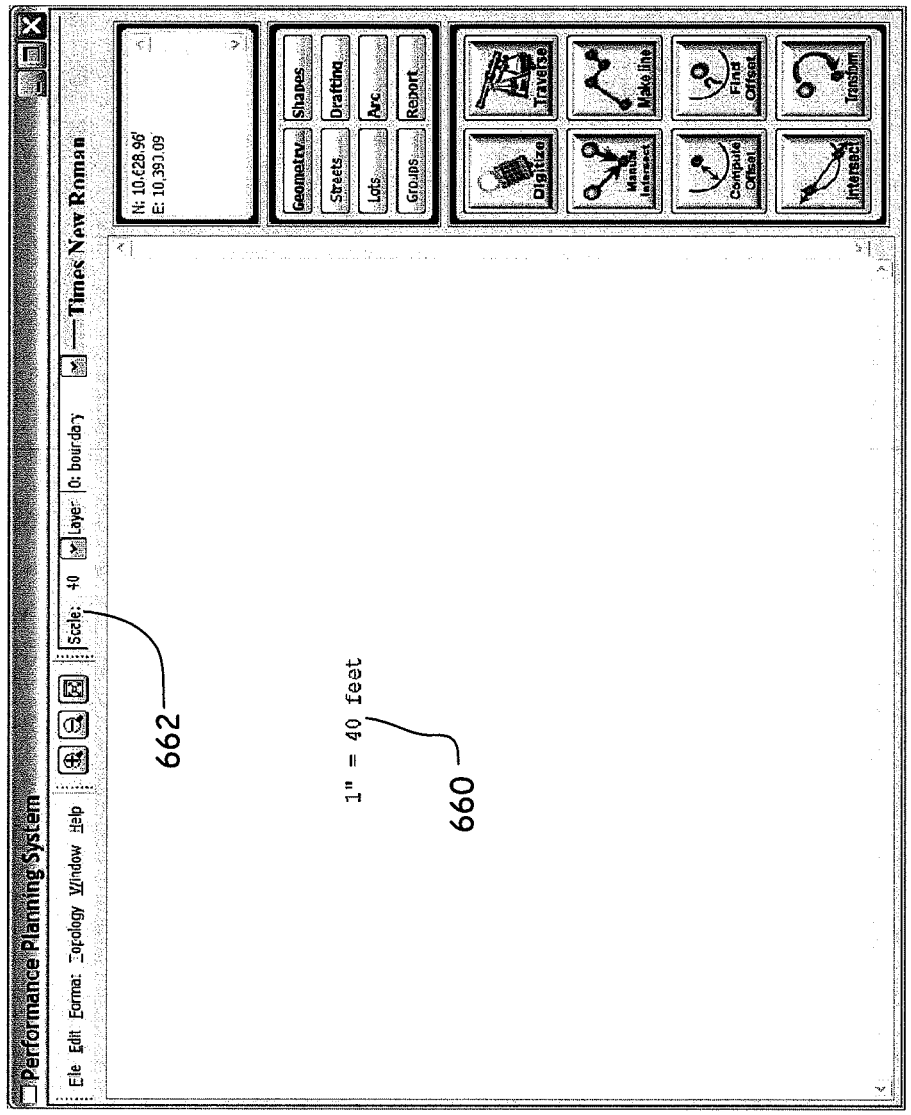
FIG. 55 is a screen shot of the example user interface shown in FIG. 3 after adjustment of a scale of a land plan.

FIG. 55 is a screen shot of example user interface 140 after adjustment of the scale of a land plan. FIG. 55 shows that the scale text label 660 is automatically updated by land plan development system 100 after the scale is adjusted. For example, the scale text label 660 now displays 1"=40 feet, which is the same as the scale selected in scale menu 662. One of the benefits of scale text label 660, is that the scale displayed on a land plan (such as when the land plan is printed) is always accurate if the scale text label 660 is used. After the scale is modified, the user is not required to manually update a text label to reflect the new scale. In this way the land plan includes accurately identified scales on the land plan, without requiring a site planner to manually update the scale label.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A system for development of a land plan, the system comprising:
    a processor;
    a computer storage medium storing program instructions, which when executed by the processor cause the processor to generate a user interface, the user interface comprising:
        a side bar including:
            a guide window configured to display tool buttons, the tool buttons each including a button having a textual description of a function of the button and a graphical illustration of the function, and the tool buttons each being selectable to initiate different functions associated with a land plan, wherein a first tool button of the tool buttons is selectable to initiate a function to define an element of the land plan, and wherein the guide window is also configured to remove the tool buttons from the guide window upon selection of the first tool button and replace the tool buttons in the guide window with instructions to the user that describe one or more inputs needed from the user to complete a function associated with the selected tool button in the land plan, the instructions containing at least one graphical element illustrating an aspect of the function or clarifying an instruction;

a tool box window configured to display a selectable set of tool box buttons, each tool box button operable to cause the guide window to display different sets of the tool buttons for performing different types of functions associated with the land plan when the tool box button is selected; and an information window configured to display information relating to the element of the land plan when the element is selected; and a planning window configured to generate a graphical representation of the land plan, the graphical representation of the land plan including the element, wherein the planning window is arranged adjacent the side bar such that the guide window, the tool box window, and the information window do not obscure the land plan in the planning window.

2. The system of claim 1, wherein the information window is an info box.

3. The system of claim 2, wherein the element is selected from the group consisting of: a line, an arc, and a polyline.

4. The system of claim 3, wherein the element is defined by at least two points, each of the points defined by coordinates.

5. The system of claim 4, wherein each of the coordinates is defined by a northing, and an easting.

6. The system of claim 5, wherein each of the coordinates is further defined by an elevation.

7. The system of claim 1, wherein the first tool button is selected from an arc tool and a line tool.

8. The system of claim 1, wherein the land plan is defined by elements, including the element, wherein the elements consist of lines, arcs, and polylines.

9. The system of claim 8, wherein the elements are defined by at least two points, each of the points defined by coordinates.

10. A system for development of a land plan, the system comprising:
a processor;
a computer storage medium storing land plan data and program instructions, wherein the land plan data defines elements selected from a line, an arc, and a polyline, wherein the elements are each defined by at least two points, and wherein the points are defined by unique coordinates such that no two points share the same coordinates, and wherein when the program instructions are executed by the processor, the instructions cause the processor to generate a user interface, the user interface comprising:
a planning window configured to generate a graphical representation of the land plan from the land plan data; and
a side bar arranged adjacent the planning window, the side bar including:
a tool box window configured to display a set of selectable tool box buttons, each of the tool box buttons associated with a type of operation to be performed relating to the land plan;
a guide window configured to display tool buttons, the tool buttons each including a button having a textual description of a function of the button and a graphical illustration of the function, and the tool buttons being operable to initiate an operation associated with the land plan, wherein a first tool button of the tool buttons is selectable to initiate an operation to define an additional element of the land plan, and wherein after selection of the first tool button the guide window is also configured to remove the tool buttons from the guide window and replace the tool buttons in the guide window with instructions to the user that describe one or more inputs needed from the user to complete the operation to define the additional element of the land plan in the planning window; and
an element information window configured to display information relating to the additional element when the additional element is selected, the information including at least coordinates defining the additional element;
wherein the guide window is located at a bottom of the side bar, the element window is located at a top of the side bar, and the tool box window is located between the guide window and the element window in the side bar.

11. The system of claim 10, wherein the unique coordinates comprise at least a northing, and an easting.

12. The system of claim 10, wherein the guide window further displays instructions for use of a specific tool after selection of one of the tool buttons in the guide window.

13. The system of claim 10, wherein the instructions in the guide window further comprise a depiction of a mouse input device graphically illustrating an input that can be provided by the user with the mouse input device.

14. The system of claim 10, wherein the instructions in the guide window further comprise one or more graphical representations of one or more inputs for the user with text describing actions taken when a given input is selected, the inputs including: one or more keys to press; one or more mice with different buttons emphasized; one or more mice with different buttons emphasized in combination with one or more keys to be pressed at a same time; or combinations thereof.

* * * * *